(12) United States Patent
Ahuja et al.

(10) Patent No.: US 12,615,736 B2
(45) Date of Patent: Apr. 28, 2026

(54) METHODS AND APPARATUS FOR IMMERSION COOLING SYSTEMS

(71) Applicant: Intel Corporation, Santa Clara, CA (US)

(72) Inventors: Sandeep Ahuja, Portland, OR (US); Nishi Ahuja, Portland, OR (US); Jun Zhang, Shanghai (CN); Qing Qiao, Saratoga, CA (US); Checa Hung, Taipei (TW); Yung Shun Liang, New Taipei (CN); Min Wu, Shanghai (CN); Ying-Shan Lo, Taipei (TW); Carrie Chen, Taipei (TW); Jia-Hong Wu, Taipei (TW)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 18/358,329

(22) Filed: Jul. 25, 2023

(65) Prior Publication Data

US 2023/0380102 A1     Nov. 23, 2023

Related U.S. Application Data

(63) Continuation-in-part of application No. PCT/CN2022/118822, filed on Sep. 14, 2022, and a
(Continued)

(30) Foreign Application Priority Data

Jul. 29, 2022     (WO) ................ PCT/CN2022/109235
Jul. 29, 2022     (WO) ................ PCT/CN2022/109237
(Continued)

(51) Int. Cl.
*H05K 7/20*     (2006.01)

(52) U.S. Cl.
CPC ..... *H05K 7/20236* (2013.01); *H05K 7/20272* (2013.01); *H05K 7/20763* (2013.01)

(58) Field of Classification Search
CPC ........... H05K 7/20236; H05K 7/20272; H05K 7/20763; H05K 7/20772; H05K 7/20781
See application file for complete search history.

(56) References Cited

U.S. PATENT DOCUMENTS 9,241,423 B2 *   1/2016   Chiu ..................... H01L 23/473
10,893,629 B2 *   1/2021   Ishinabe ............ H05K 7/20236
(Continued)

FOREIGN PATENT DOCUMENTS

GB     2576032     4/2021
GB     2576030     12/2021
(Continued)

OTHER PUBLICATIONS

Etern, "Magnetic Ball, Product—E2S2/Water Pump," available Jun. 30, 2022, retrieved from <http://www.etern.com.tw/en/En_E2S2_Waterpump.htm> on Jul. 18, 2023, 2 pages.

*Primary Examiner* — Lionel Nouketcha
(74) *Attorney, Agent, or Firm* — Hanley, Flight & Zimmerman, LLC

(57) ABSTRACT

Example method and apparatus, systems, and articles of manufacture for immersion cooling systems are disclosed herein. An example apparatus disclosed herein includes a tank to hold a coolant, an overflow chamber to direct the coolant toward an outlet, and a plate within the overflow chamber, the plate including a plurality of openings, the coolant to pass through at least one of the plurality of openings before reaching the outlet.

15 Claims, 46 Drawing Sheets

Related U.S. Application Data continuation-in-part of application No. PCT/CN2022/109933, filed on Aug. 3, 2022, and a continuation-in-part of application No. PCT/CN2022/109237, filed on Jul. 29, 2022, and a continuation-in-part of application No. PCT/CN2022/109235, filed on Jul. 29, 2022.

(30)     Foreign Application Priority Data

| Aug. 3, 2022 | (WO) | ................ | PCT/CN2022/109933 |
| Sep. 14, 2022 | (WO) | ................ | PCT/CN2022/118822 |

(56)     References Cited

U.S. PATENT DOCUMENTS

| 12,225,688 | B2 | 2/2025 | Archibald | |
| 2018/0210527 | A1* | 7/2018 | Panella | ................... G06F 1/266 |
| 2021/0219454 | A1* | 7/2021 | Cheng | ............... H05K 7/20318 |
| 2021/0320050 | A1 | 10/2021 | Robinson et al. | |
| 2023/0080447 | A1* | 3/2023 | Shah | ................ H05K 7/20836 |
| | | | | 361/679.53 |

FOREIGN PATENT DOCUMENTS

| GB | 2597525 | 2/2022 |
| GB | 2601357 | 6/2022 |

* cited by examiner

CENTRAL DATA CENTER(S) 102

EDGE DATA CENTER(S) 106

BUSINESS/INDUSTRIAL BUILDING(S) INCLUDING IT EQUIPMENT SPACE 110

CONTENT DELIVERY NETWORK (CDN) DATA CENTERS 116

LOW POWER SPEC COMPONENTS

MEDIUM POWER SPEC COMPONENTS

HIGH POWER SPEC COMPONENTS

MODULAR SERVER DESIGN GUIDE

COOLANT FLOW DIRECTION

IMMERSION COOLING TANK

4608

4602

4610

4606

4604

4614

4612

4600

COOLING DEVICE

4900

START

COUPLE NODES WITH STACKED FORM FACTORS INTO CHASSIS — 4902

COUPLE OTHER COMPONENTS TO CHASSIS — 4904

ELECTRICALLY COUPLE THE OTHER COMPONENTS TO THE STACKED BOARD ASSEMBL(IES) — 4906

MOUNT CHASSIS IN IMMERSION COOLING TANK SUCH THAT STACKED BOARD ASSEMBLIES ARE ADJACENT TANK INLET — 4908

END

METHODS AND APPARATUS FOR IMMERSION COOLING SYSTEMS

RELATED APPLICATION

This patent arises from a continuation-in-part of and claims foreign priority to PCT Patent Application No. PCT/CN2022/118822, which was filed on Sep. 14, 2022. This patent also arises from a continuation-in-part of and claims foreign priority to PCT Patent Application No. PCT/CN2022/109933, which was filed on Aug. 3, 2022. This patent also arises from a continuation-in-part of and claims foreign priority to PCT Patent Application No. PCT/CN2022/109237, which was filed on Jul. 29, 2022. This patent also arises from a continuation-in-part of and claims foreign priority to PCT Patent Application No. PCT/CN2022/109235, which was filed on Jul. 29, 2022. PCT Patent Application No. PCT/CN2022/118822, PCT Patent Application No. PCT/CN2022/109933, PCT Patent Application No. PCT/CN2022/109237, and PCT Patent Application No. PCT/CN2022/109235 are hereby incorporated herein by reference in their entireties. Priority to PCT Patent Application No. PCT/CN2022/118822, PCT Patent Application No. PCT/CN2022/109933, PCT Patent Application No. PCT/CN2022/109237, and PCT Patent Application No. PCT/CN2022/109235 is hereby claimed.

FIELD OF THE DISCLOSURE

This disclosure relates generally to cooling systems and, more particularly, to methods and apparatus for immersion cooling systems.

BACKGROUND

The use of liquids to cool electronic components is being explored for its benefits over more traditional air cooling systems, as there is an increasing need to address thermal management risks resulting from increased thermal design power in high performance systems (e.g., CPU and/or GPU servers in data centers, cloud computing, edge computing, and the like). More particularly, relative to air, liquid has inherent advantages of higher specific heat (when no boiling is involved) and higher latent heat of vaporization (when boiling is involved).

Figure 1:
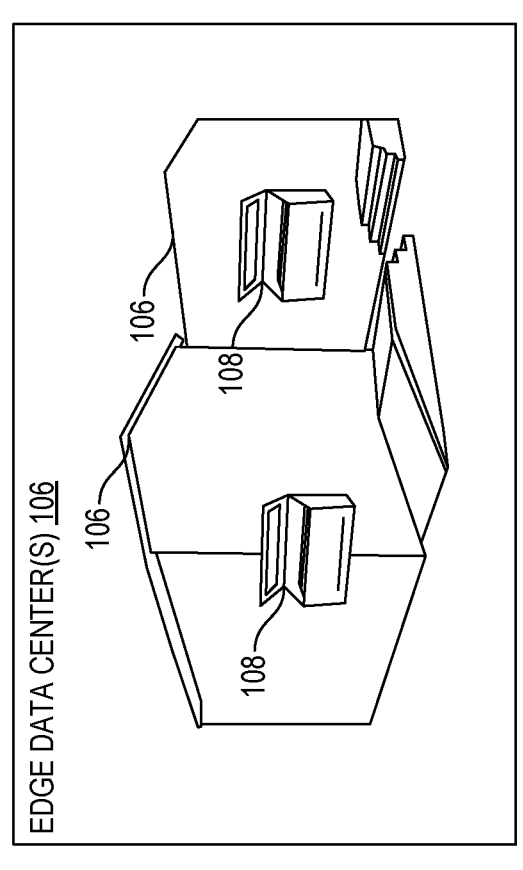
FIG. 1 illustrates one or more example environments in which teachings of this disclosure may be implemented.
Figure 1:
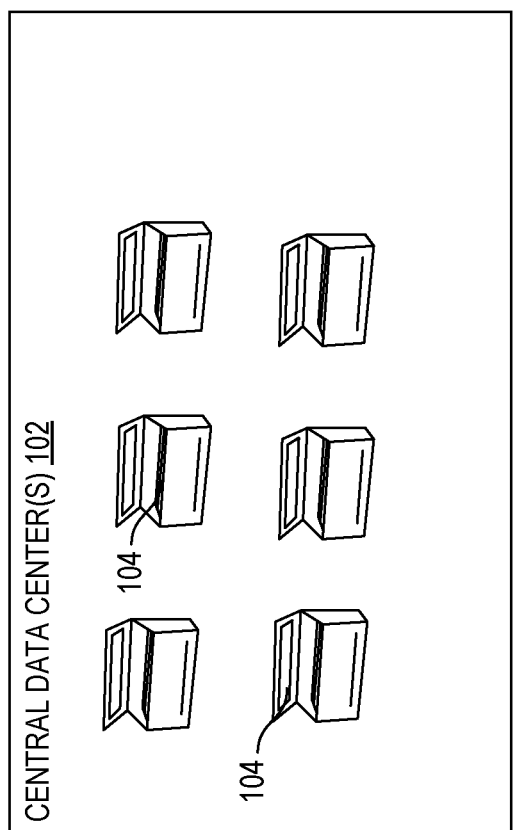
Figure 1:
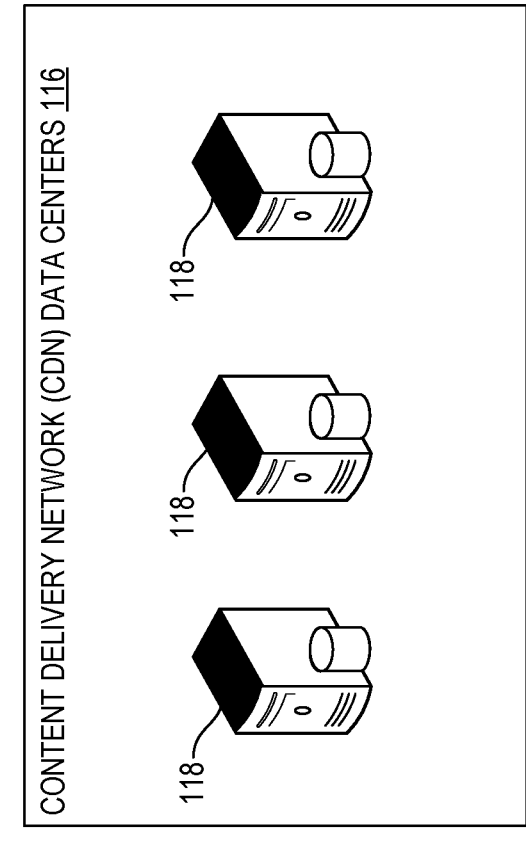
Figure 1:
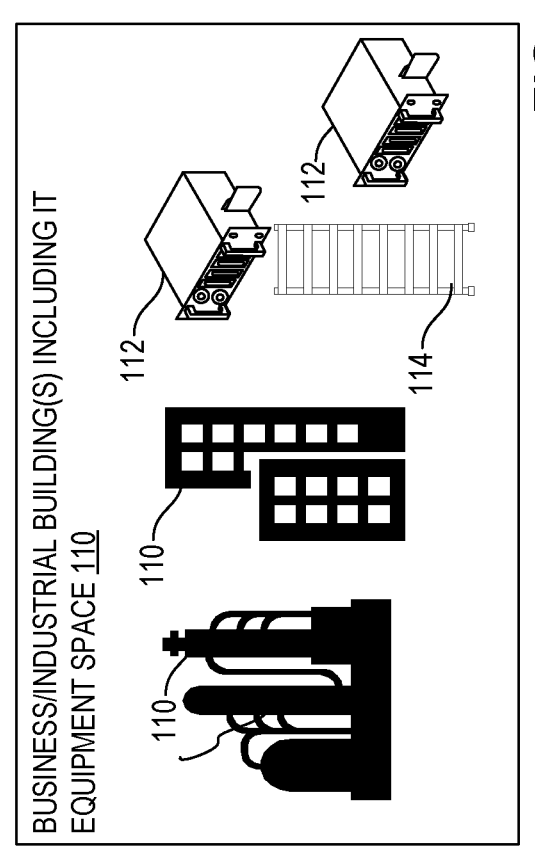

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/-10% unless otherwise specified in the below description.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

DETAILED DESCRIPTION

As noted above, the use of liquids to cool electronic components is being explored for its benefits over more traditional air cooling systems, as there are increasing needs to address thermal management risks resulting from increased thermal design power in high-performance systems (e.g., CPU and/or GPU servers in data centers, accelerators, artificial intelligence computing, machine learning computing, cloud computing, edge computing, and the like). More particularly, relative to air, liquid has inherent advantages of higher specific heat (when no boiling is involved) and higher latent heat of vaporization (when boiling is involved). In some instances, liquid can be used to indirectly cool electronic components by cooling a cold plate that is thermally coupled to the electronic component(s). An alternative approach is to directly immerse electronic components in the cooling liquid. In direct immersion cooling, the liquid can be in direct contact with the electronic components to directly draw away heat from the electronic components. To enable the cooling liquid to be in direct contact with electronic components, the cooling liquid is electrically insulative (e.g., a dielectric liquid). Examples of such dielectric liquids that can be used with examples disclosed herein include dielectric fluid, including hydrocarbons (e.g., mineral oil, hexane, castor oil, etc.), deionized water, silicone oil, artificial coolants (e.g., fluorinated ketones, per-fluorinated compounds, etc.), benzene, liquid noble gases, liquid oxygen, and/or liquid hydrogen.

A liquid cooling system can involve at least one of single-phase cooling or two-phase cooling. As used herein, single-phase cooling (e.g., single-phase immersion cooling) means the cooling fluid (sometimes also referred to herein as cooling liquid or coolant) used to cool electronic components draws heat away from heat sources (e.g., electronic components) without changing phase (e.g., without boiling and becoming vapor). Such cooling fluids are referred to herein as single-phase cooling fluids, liquids, or coolants. By contrast, as used herein, two-phase cooling (e.g., two-phase immersion cooling) means the cooling fluid (in this case, a cooling liquid) vaporizes or boils from the heat generated by the electronic components to be cooled, thereby changing from the liquid phase to the vapor phase. The gaseous vapor may subsequently be condensed back into a liquid (e.g., via a condenser) to again be used in the cooling process. Such cooling fluids are referred to herein as two-phase cooling fluids, liquids, or coolants. Notably, gases (e.g., air) can also be used to cool components and, therefore, may also be referred to as a cooling fluid and/or a coolant. However, indirect cooling and immersion cooling typically involves at least one cooling liquid (which may or may not change to the vapor phase when in use). Example systems, apparatus, and associated methods to improve cooling systems and/or associated cooling processes are disclosed herein.

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase cooling or two-phase cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure. In addition to or as an alternative to the immersion tanks 104, 108, any of the example environments of FIG. 1 can utilize one or more liquid cooling systems having a cold plate to control the temperature of the electronic devices/components in the example environments.

Figure 2:
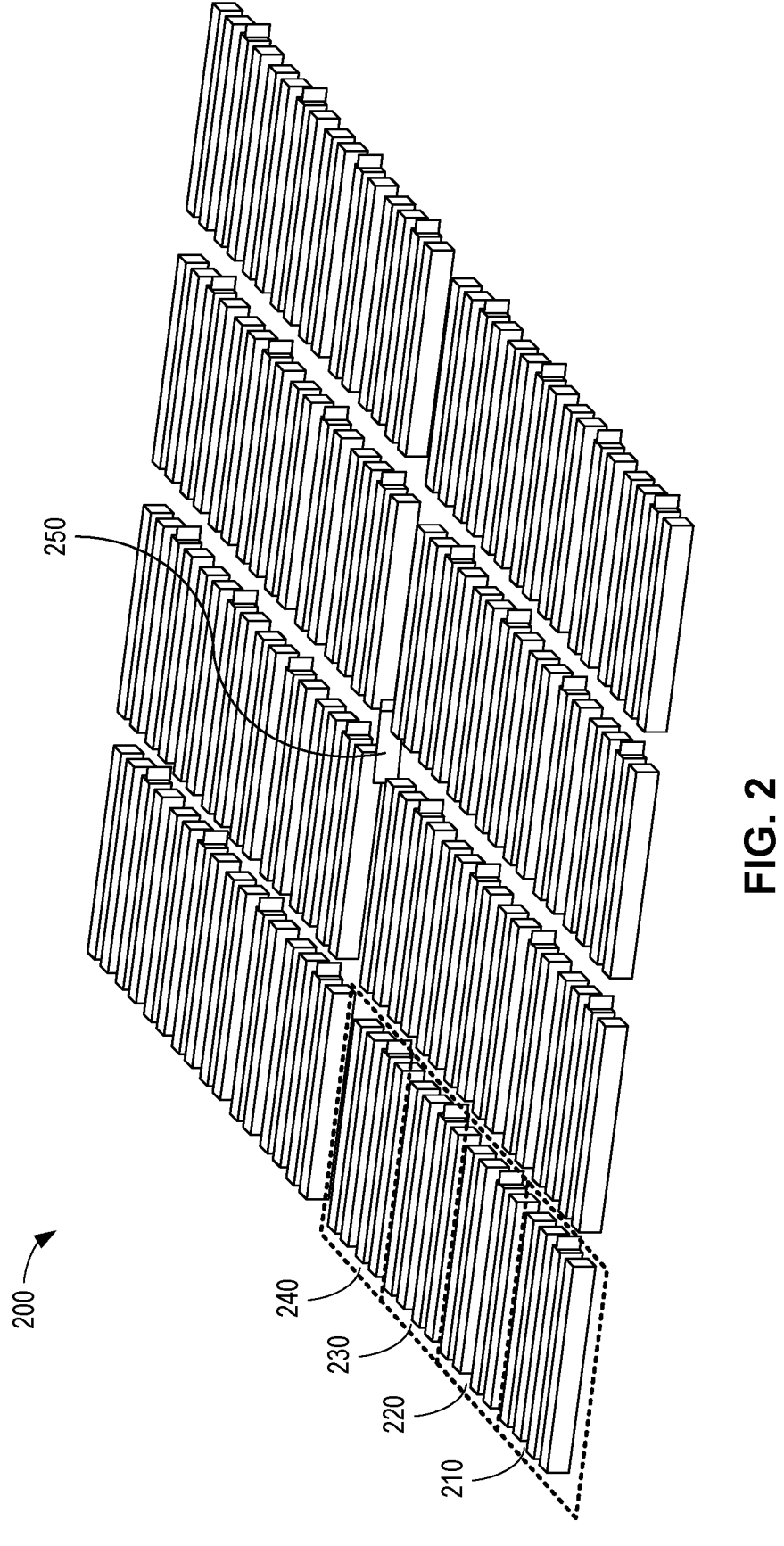
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose programmable circuitry), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first programmable circuitry assigned to one managed node and second programmable circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (programmable circuitry, storage, accelerators, etc.) typically have different refresh rates, greater resource utilization and reduced total cost of ownership may be achieved. For example, a data center operator can upgrade the programmable circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
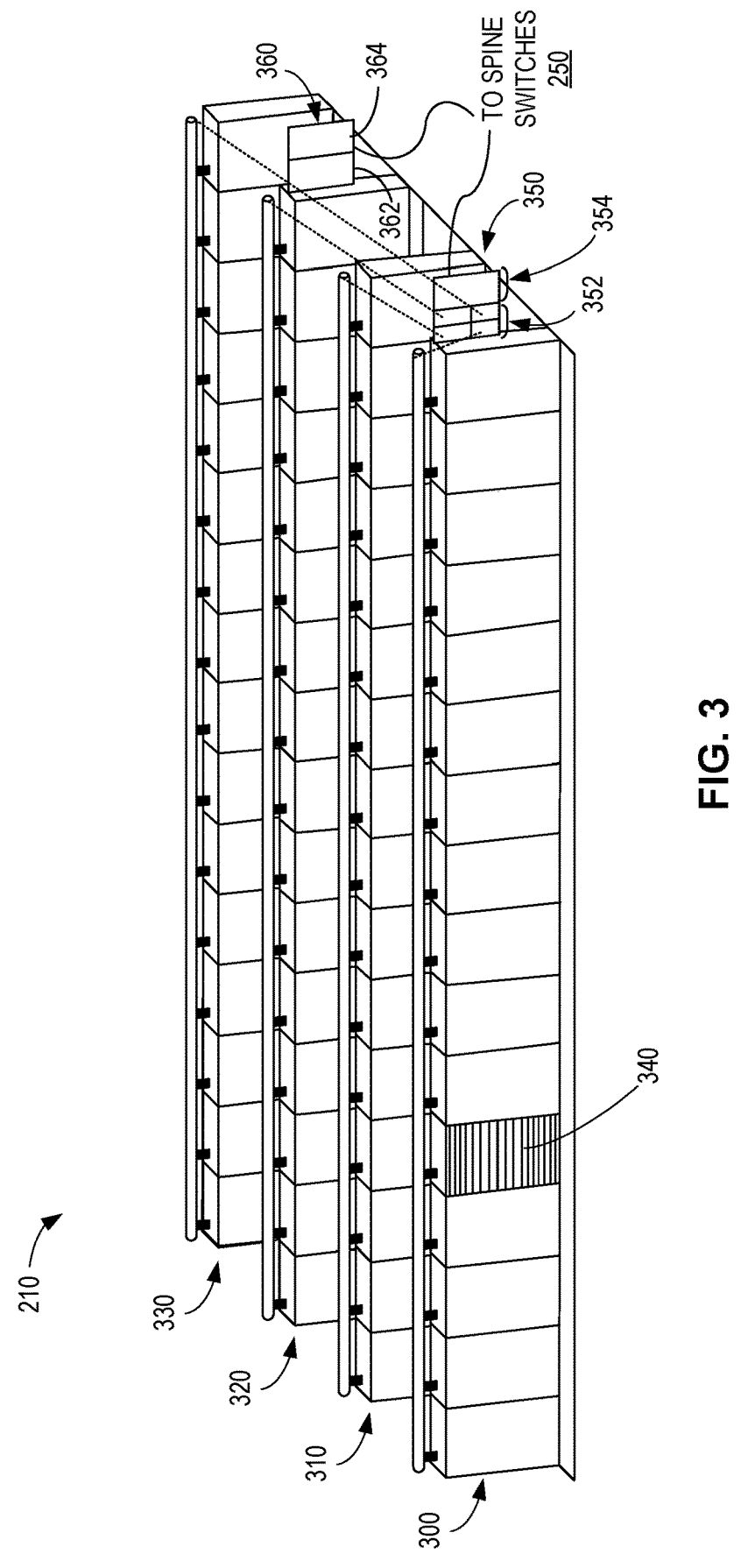
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
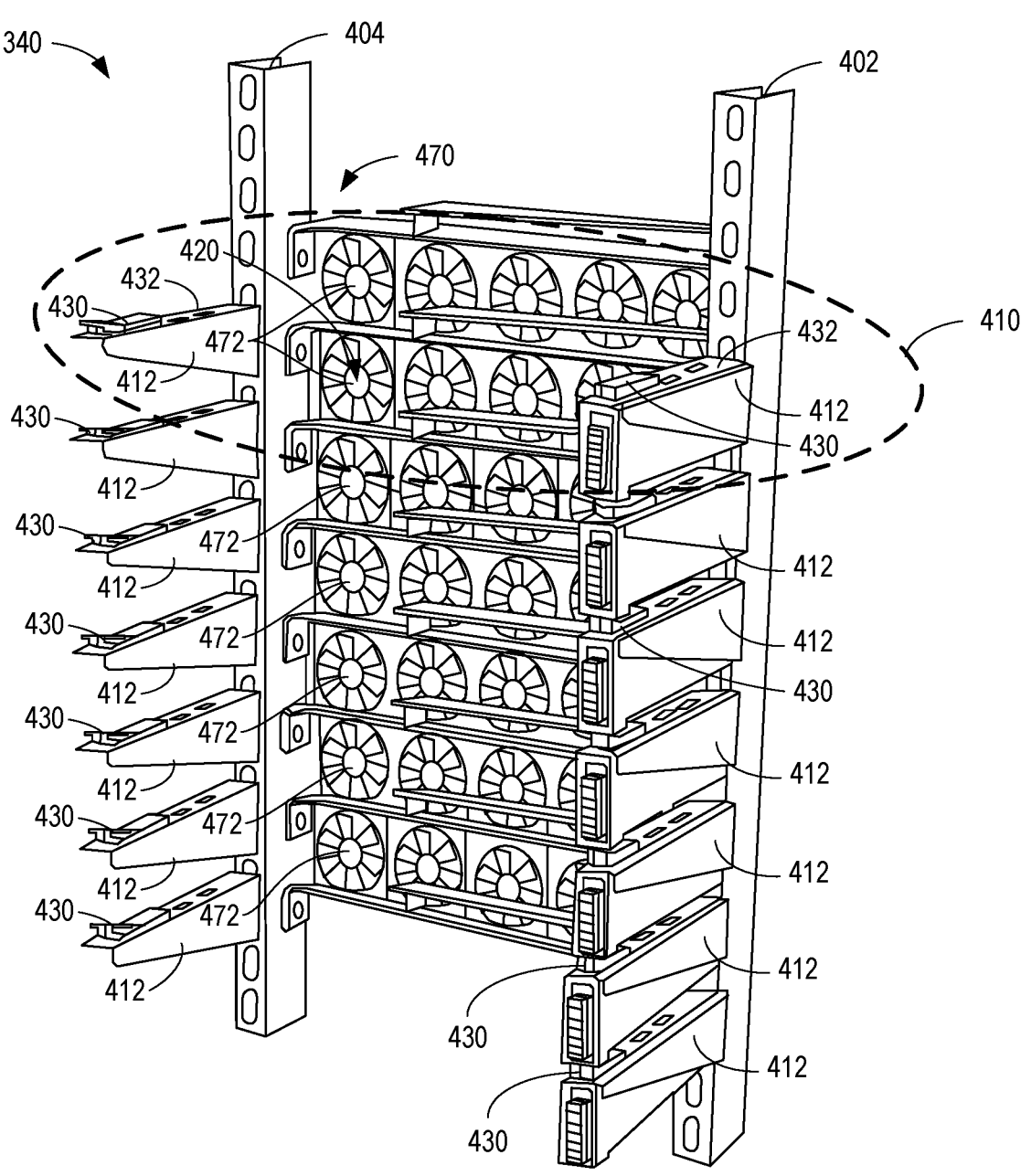
FIG. 4 is a perspective view of at least one example of a rack that may be included in the pod of FIG. 3.
Figure 5:
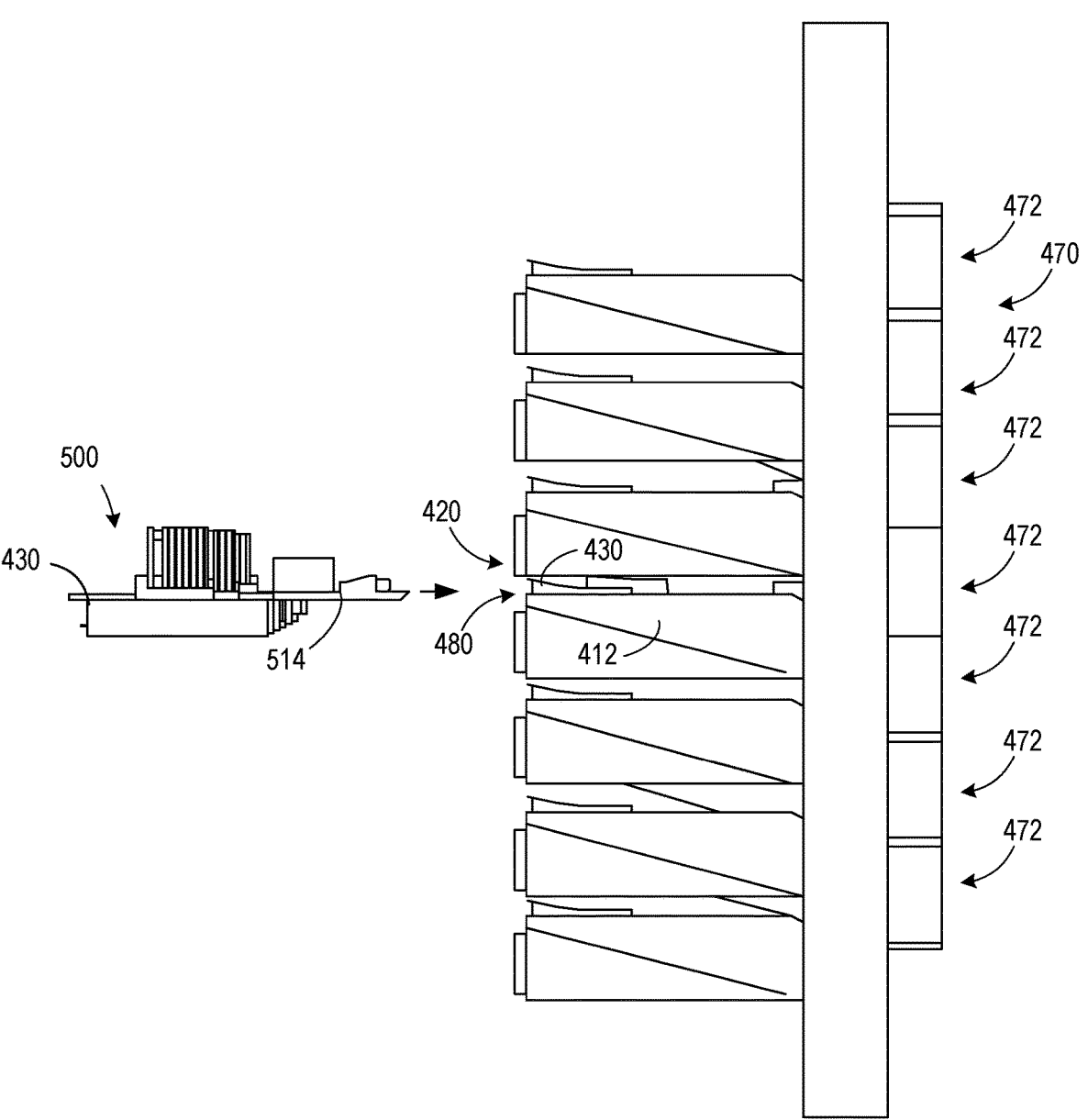
FIG. 5 is a side elevation view of the rack of FIG. 4.
Figure 6:
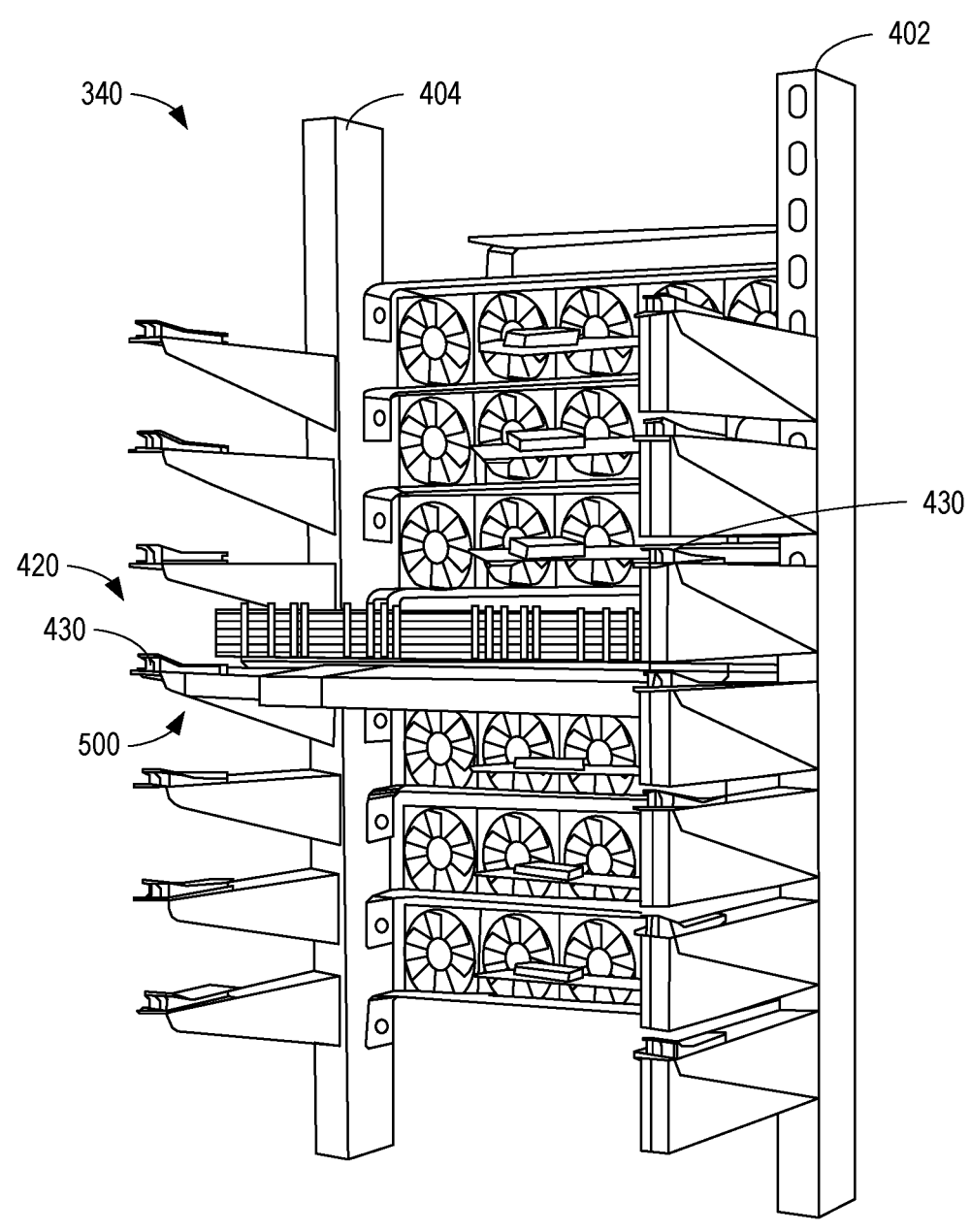
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., programmable circuitry, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one another and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1U"). That is, the vertical distance between pairs 410 of elongated support arms 412 may be less than a standard rack unit "1U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
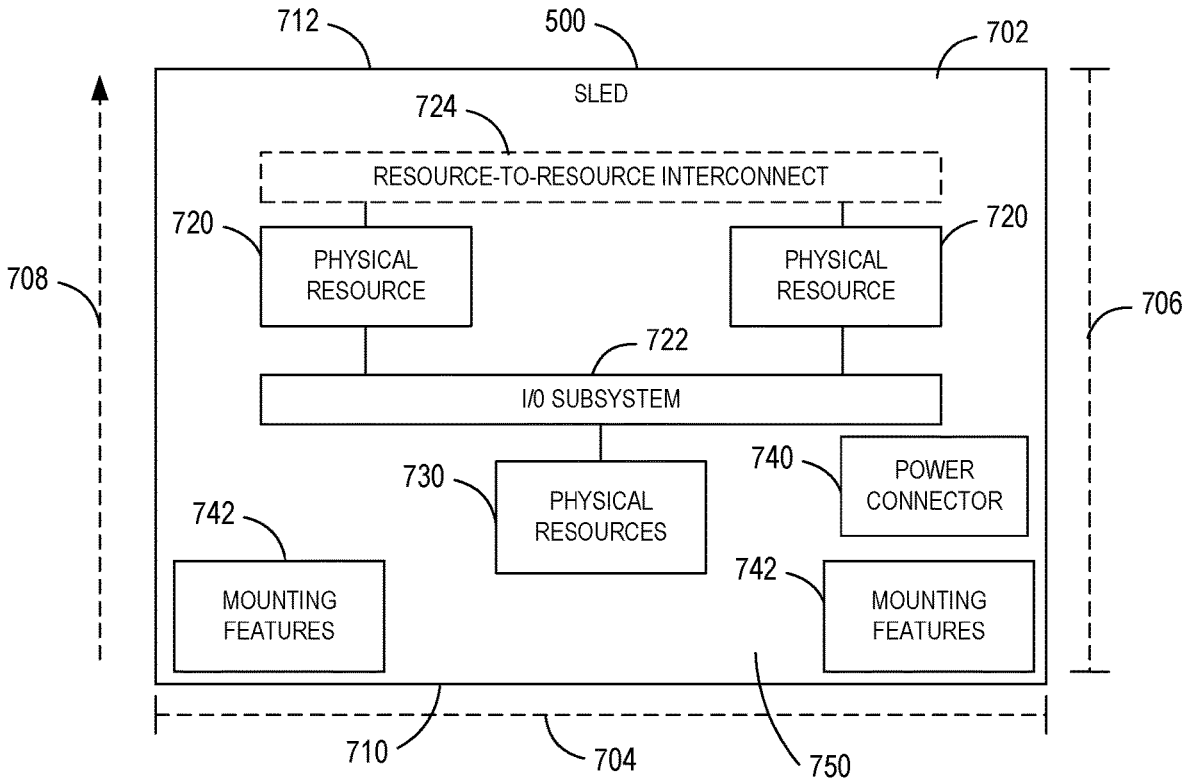
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a given sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of programmable circuitry, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processor circuitry in examples in which the sled 500 is implemented as a compute sled, as accelerator co-processor circuitry or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of programmable circuitry 920 (see FIG. 9), and power is routed from the voltage regulators to the programmable circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 500 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
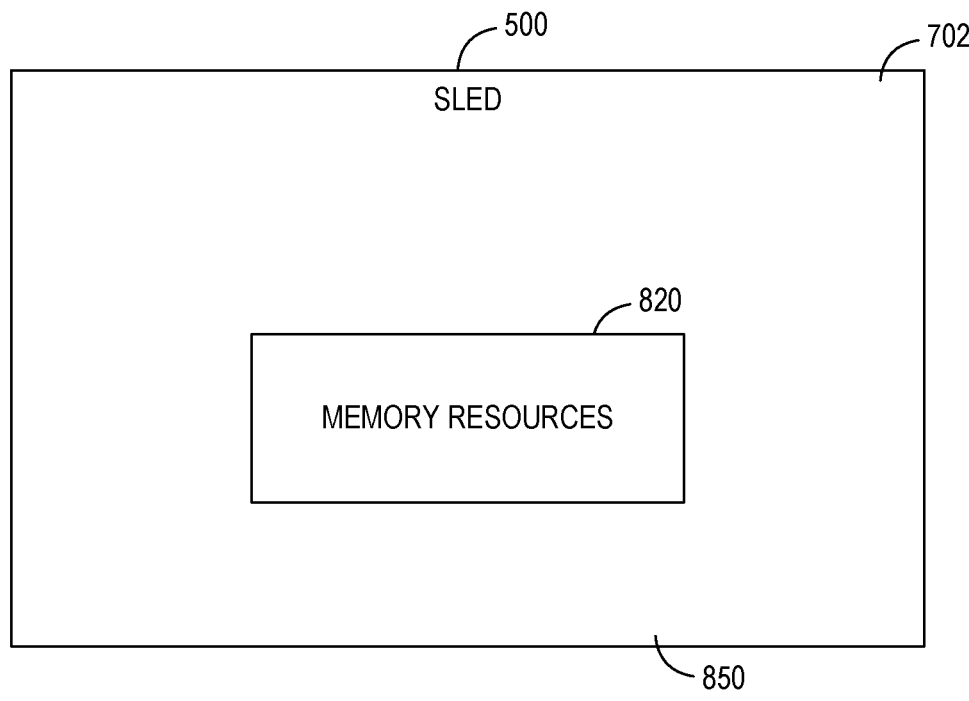
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferro-electric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
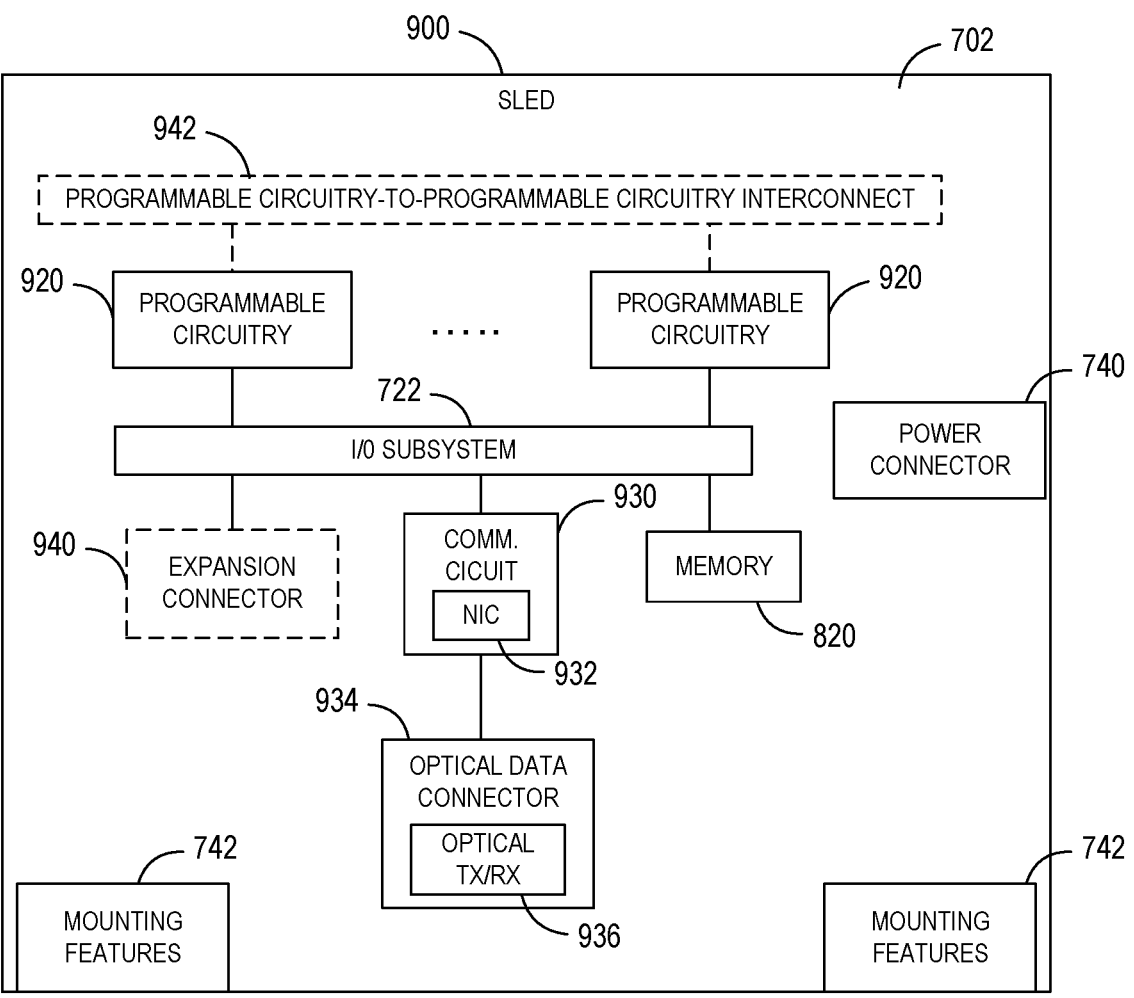
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include programmable circuitry 920. Although only two blocks of programmable circuitry 920 are shown in FIG. 9, it should be appreciated that the compute sled 900 may include additional programmable circuits 920 in other examples. Illustratively, the programmable circuitry 920 corresponds to high-performance processor circuitry 920 and may be configured to operate at a relatively high power rating. Although the high-performance programmable circuitry 920 generates additional heat operating at power ratings greater than typical processor circuitry (which operate at around 155-230 W), the enhanced thermal cooling characteristics of the chassis-less circuit board substrate 702 discussed above facilitate the higher power operation. For example, in the illustrative example, the programmable circuitry 920 is configured to operate at a power rating of at least 250 W. In some examples, the programmable circuitry 920 may be configured to operate at a power rating of at least 350 W.

In some examples, the compute sled 900 may also include a programmable circuitry-to-programmable circuitry interconnect 942. Similar to the resource-to-resource interconnect 724 of the sled 500 discussed above, the programmable circuitry-to-programmable circuitry interconnect 942 may be implemented as any type of communication interconnect capable of facilitating programmable circuitry-to-programmable circuitry interconnect 942 communications. In the illustrative example, the programmable circuitry-to-programmable circuitry interconnect 942 is implemented as a high-speed point-to-point interconnect (e.g., faster than the I/O subsystem 722). For example, the programmable circuitry-to-programmable circuitry interconnect 942 may be implemented as a QuickPath Interconnect (QPI), an Ultra-Path Interconnect (UPI), or other high-speed point-to-point interconnect dedicated to programmable circuitry-to-programmable circuitry communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processor circuits, or included on a multichip package that also contains one or more processor circuits. In some examples, the NIC 932 may include a local processor circuit (not shown) and/or a local memory (not shown) that are both local to the NIC 932. In such examples, the local processor circuit of the NIC 932 may be capable of performing one or more of the functions of the programmable circuitry 920. Additionally or alternatively, in such examples, the local memory of the MC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the programmable circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processor circuitry, memory devices, storage devices, and/or accelerator circuits including, for example, field programmable gate arrays (FPGA), application-specific integrated circuits (ASICs), security co-processor circuits, graphics processing units (GPUs), machine learning circuits, or other specialized processor circuits, controllers, devices, and/or circuits.

Figure 10:
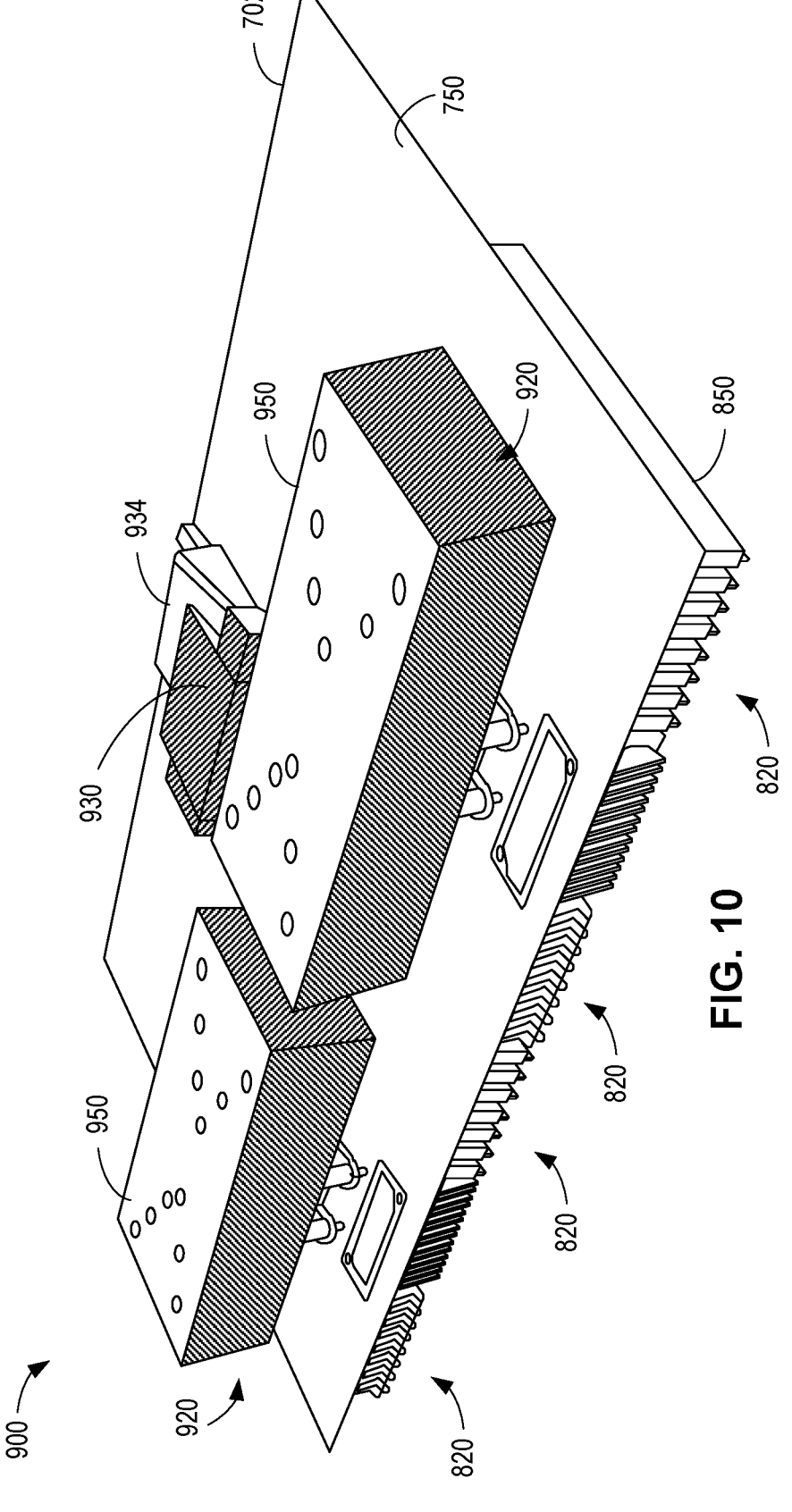
FIG. 10 is a top perspective view of at least one example of the compute sled of FIG. 9.

Referring now to FIG. 10, an illustrative example of the compute sled 900 is shown. As shown, the programmable circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor circuit socket), holders, or brackets. In some cases, some of the electrical components may be directly mounted to the chassis-less circuit board substrate 702 via soldering or similar techniques.

As discussed above, the separate programmable circuitry 920 and the communication circuit 930 are mounted to the top side 750 of the chassis-less circuit board substrate 702 such that no two heat-producing, electrical components shadow each other. In the illustrative example, the programmable circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the programmable circuitry 920 located on the top side 750 via the I/O subsystem 722. Because the chassis-less circuit board substrate 702 is implemented as a double-sided circuit board, the memory devices 820 and the programmable circuitry 920 may be communicatively coupled by one or more vias, connectors, or other mechanisms extending through the chassis-less circuit board substrate 702. Different programmable circuitry 920 (e.g., different processor circuitry) may be communicatively coupled to a different set of one or more memory devices 820 in some examples. Alternatively, in other examples, different programmable circuitry 920 (e.g., different processor circuitry) may be communicatively coupled to the same ones of the memory devices 820. In some examples, the memory devices 820 may be mounted to one or more memory mezzanines on the bottom side of the chassis-less circuit board substrate 702 and may interconnect with a corresponding programmable circuitry 920 through a ball-grid array.

Different programmable circuitry 920 (e.g., different processor circuitry) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the programmable circuitry heatsinks 950 include cooling fans attached thereto. That is, the heatsinks 950 may be fan-less heatsinks. In some examples, the heatsinks 950 mounted atop the programmable circuitry 920 may overlap with the heatsink attached to the communication circuit 930 in the direction of the airflow path 708 due to their increased size, as illustratively suggested by FIG. 10.

Figure 11:
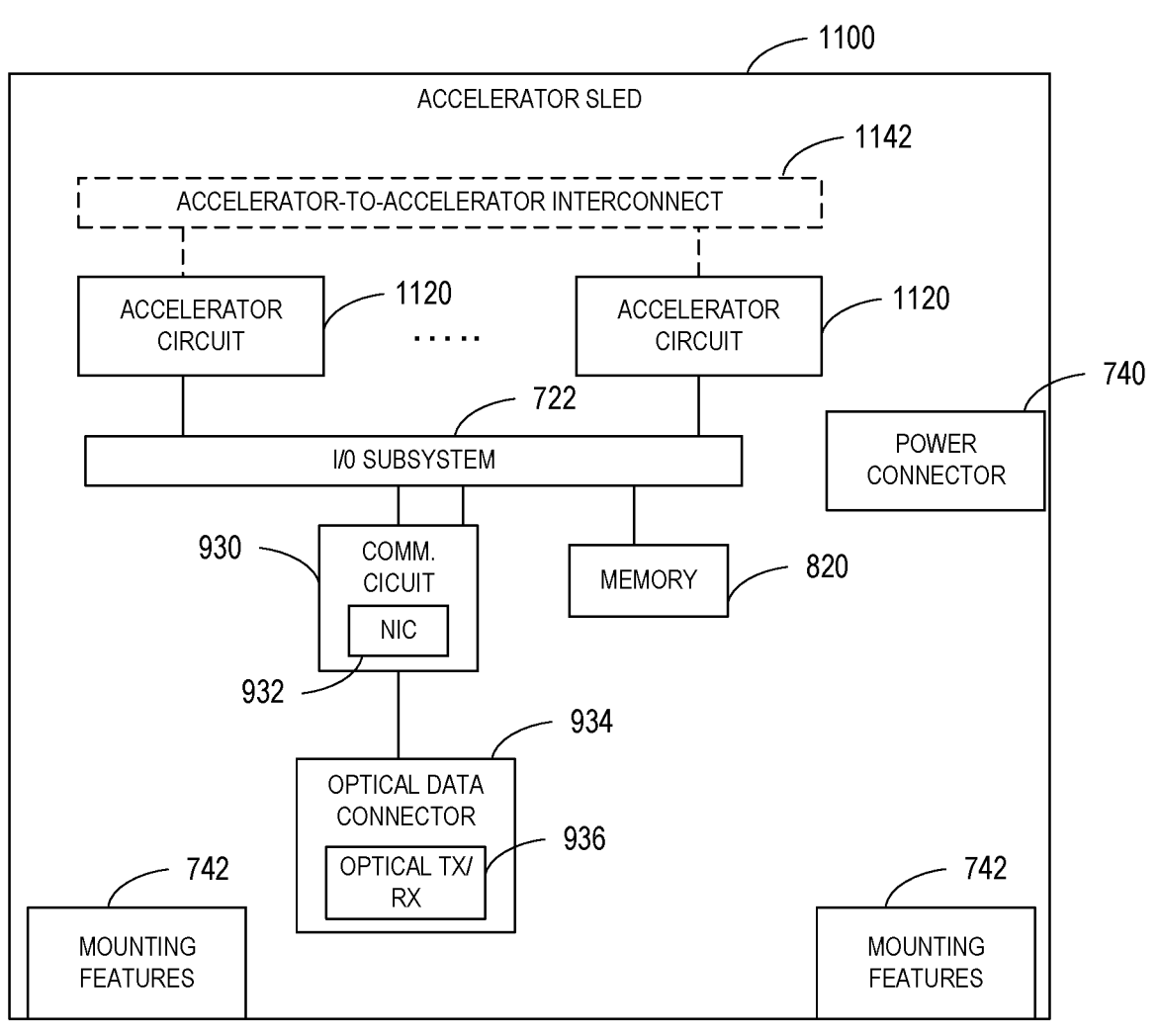
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
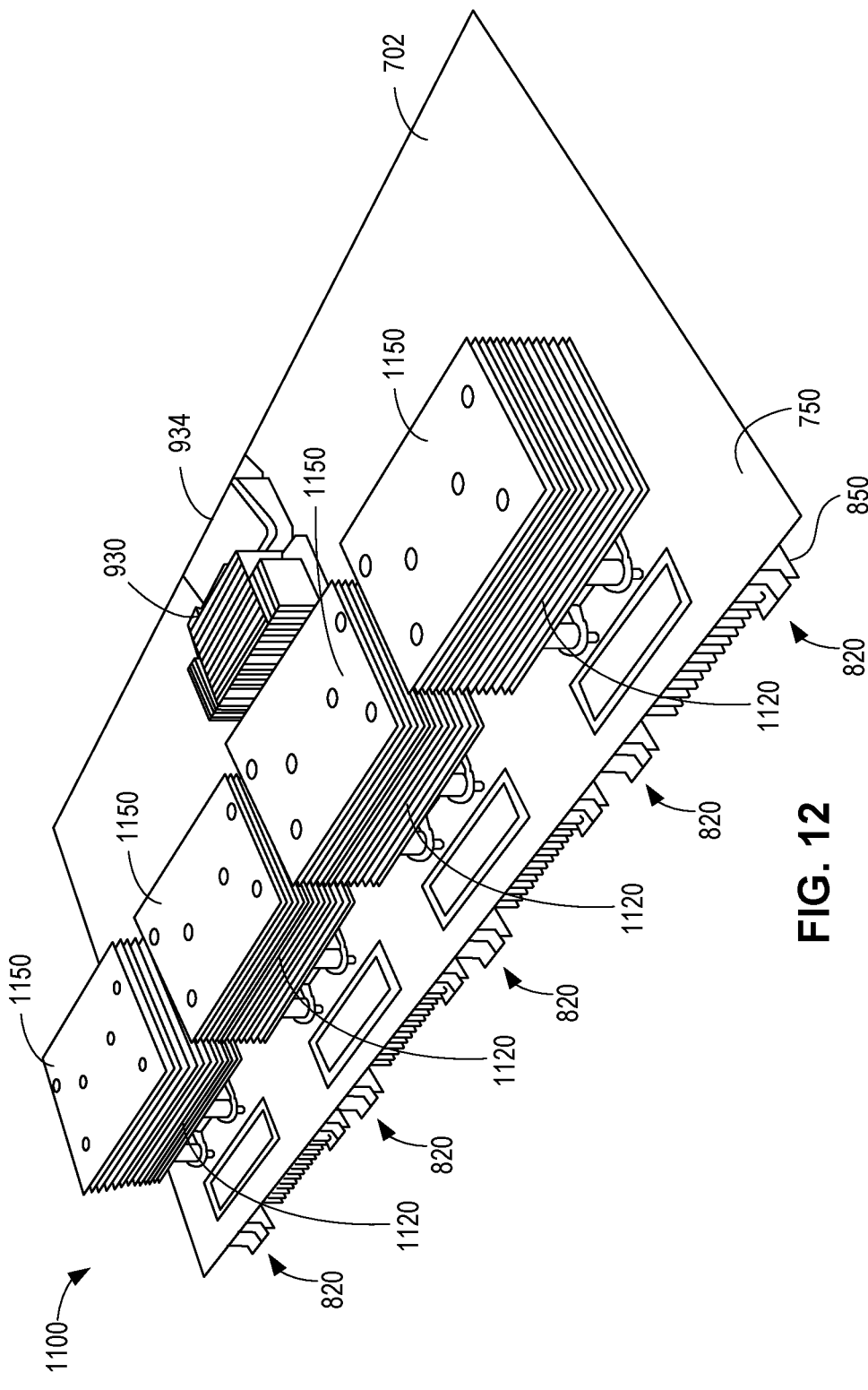
FIG. 12 is a top perspective view of at least one example of the accelerator sled of FIG. 11.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor circuitry, co-processor circuitry, compute circuit, or other device capable of performing compute or processing operations. For example, the accelerator circuits 1120 may be implemented as, for example, field programmable gate arrays (FPGA), application-specific integrated circuits (ASICs), security co-processor circuitry, graphics processing units (GPUs), neuromorphic processor units, quantum computers, machine learning circuits, or other specialized processor circuitry, controllers, devices, and/or circuits.

In some examples, the accelerator sled 1100 may also include an accelerator-to-accelerator interconnect 1142. Similar to the resource-to-resource interconnect 724 of the sled 500 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to programmable circuitry-to-programmable circuitry communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 500. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
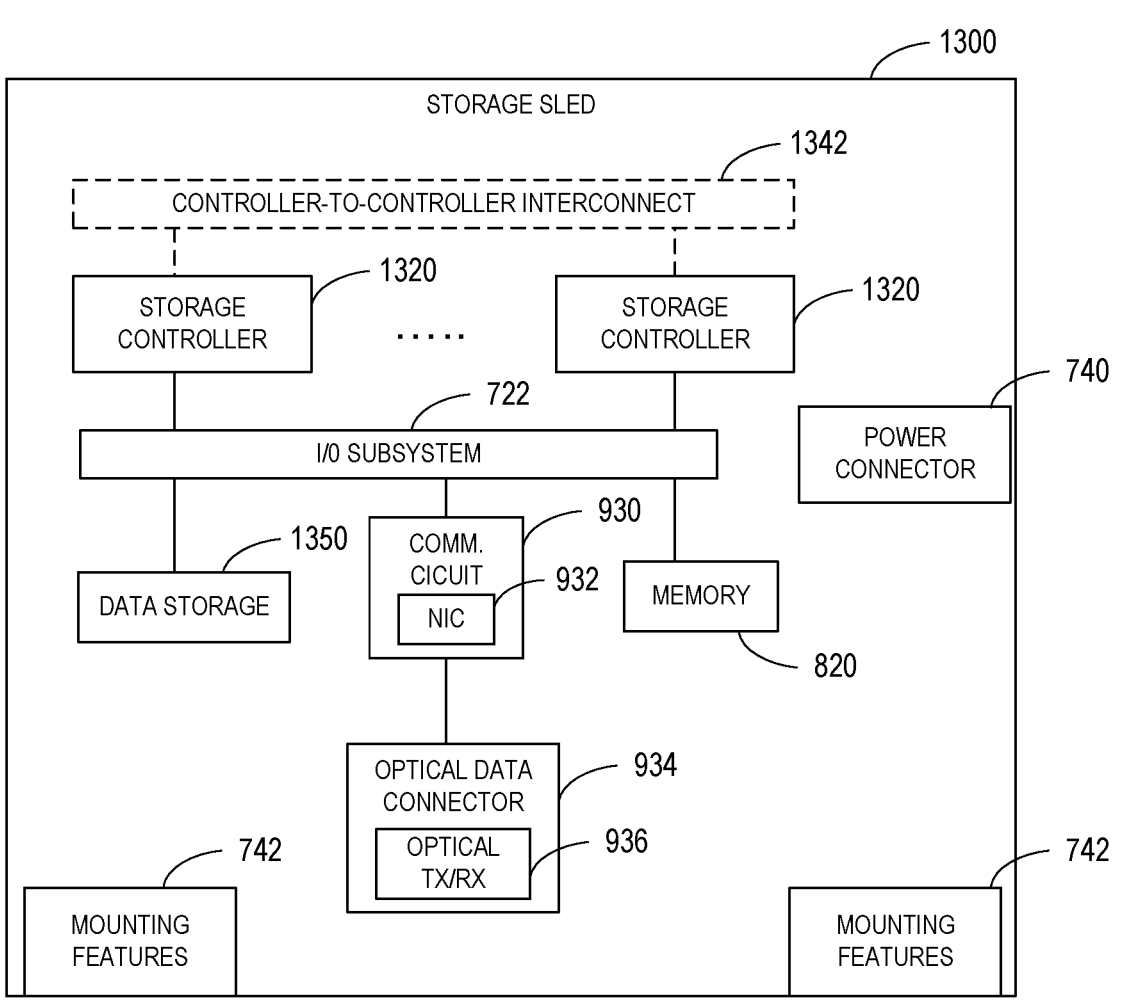
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of programmable circuitry, controller, or control circuit capable of controlling the storage and retrieval of data into the data storage 1350 based on requests received via the communication circuit 930. In the illustrative example, the storage controllers 1320 are implemented as relatively low-power programmable circuitry or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to programmable circuitry-to-programmable circuitry communications.

Figure 14:
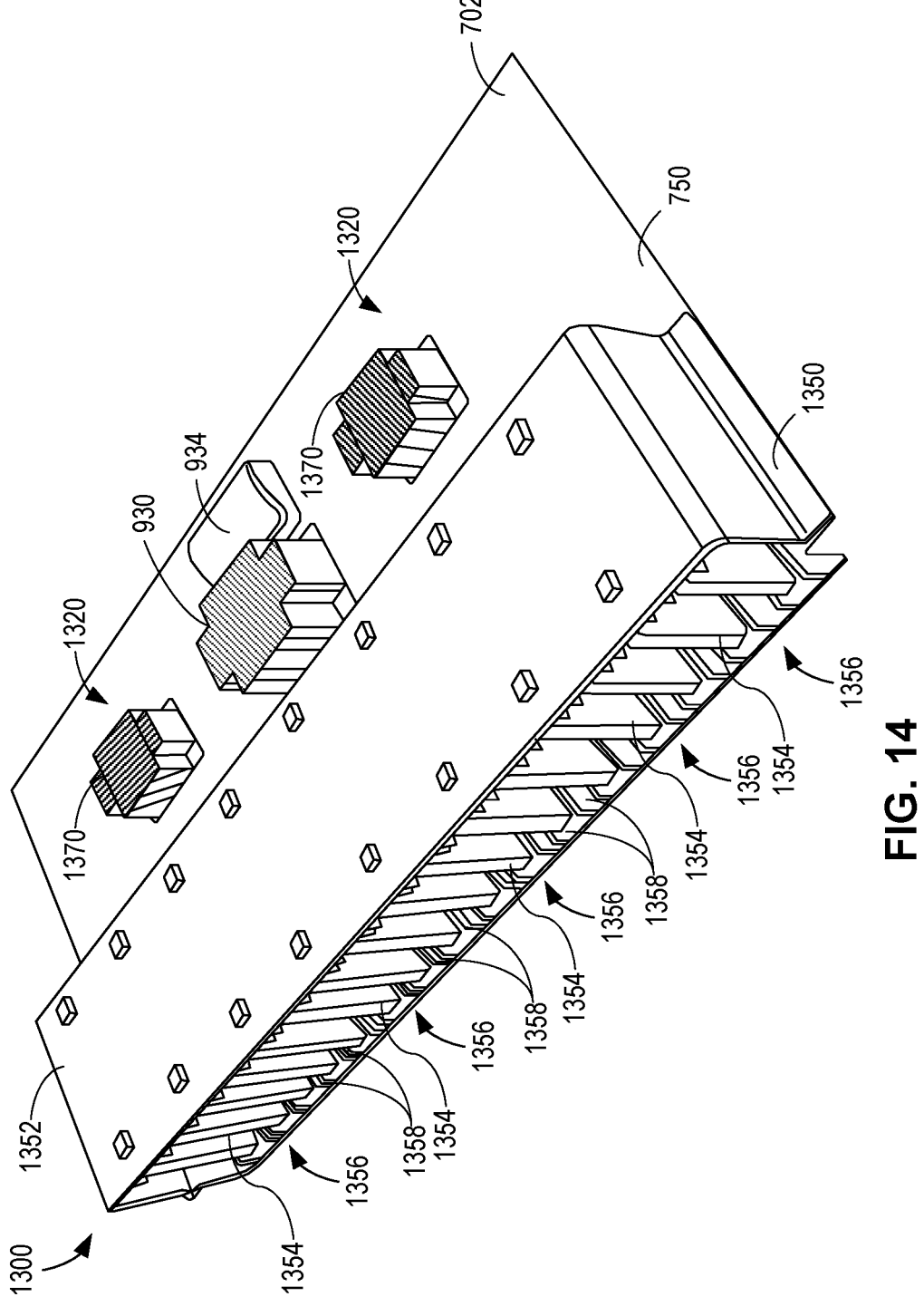
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 340. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor circuit socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
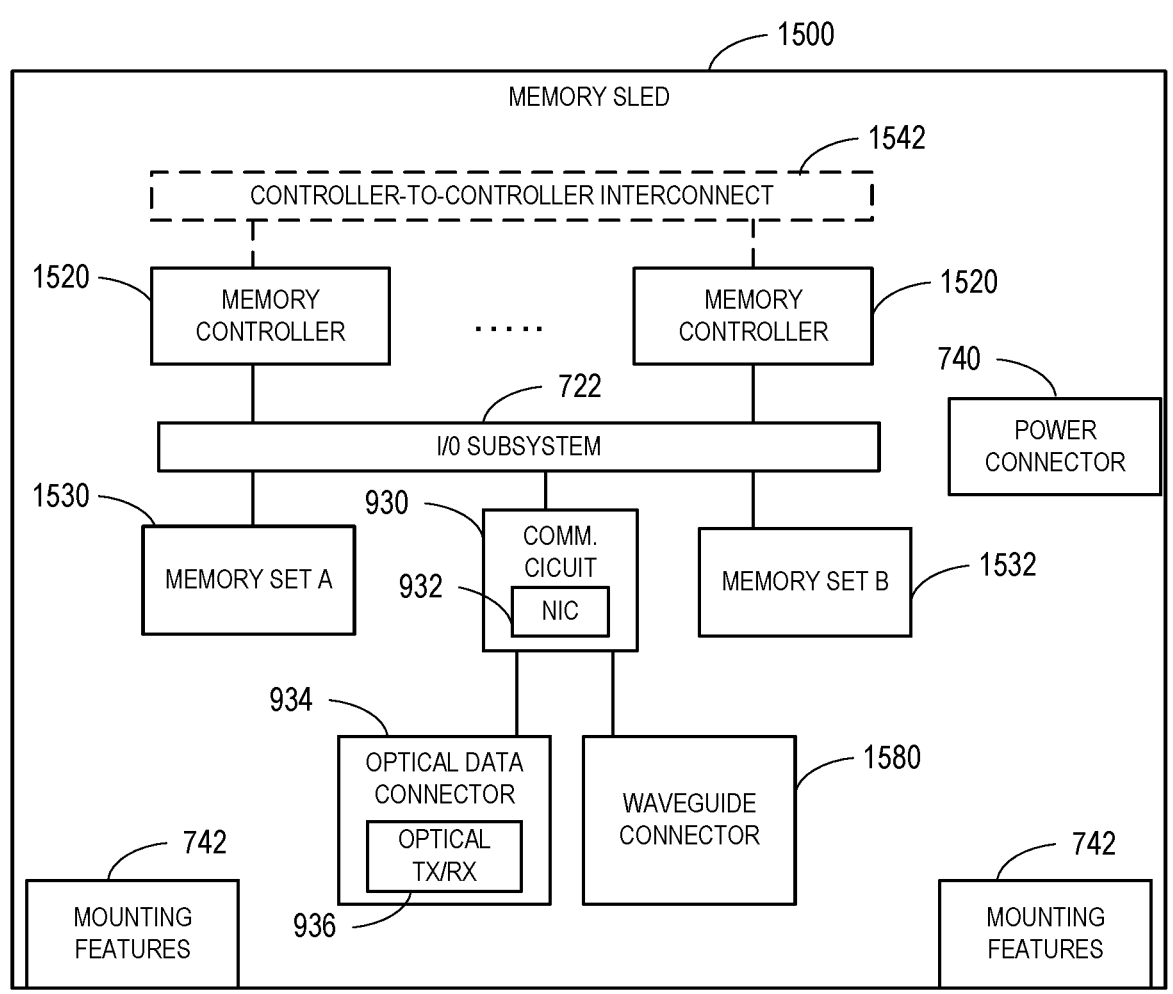
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of programmable circuitry, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to programmable circuitry-to-programmable circuitry communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
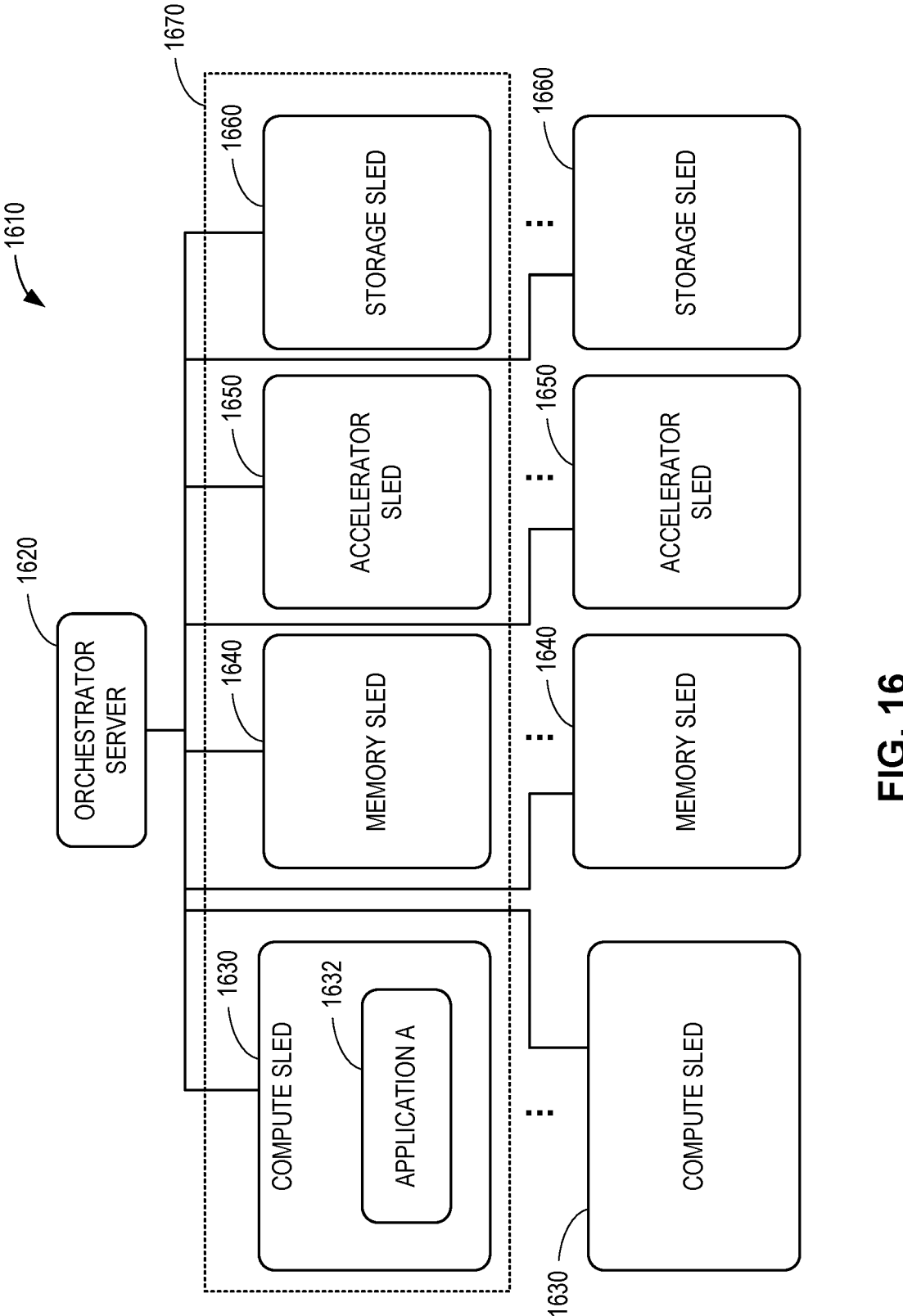
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., programmable circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1500), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as programmable circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations character-istics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among com-pute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to man-aged nodes as a function of the map of heat generation and predicted heat generation associated with different work-loads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically per-formed by the managed nodes, managed nodes that typically share or exchange workloads among each other, etc.). Based on differences in the physical locations and resources in the managed nodes, a given workload may exhibit different resource utilizations (e.g., cause a different internal tempera-ture, use a different percentage of programmable circuitry or memory capacity) across the resources of different managed nodes. The orchestrator server 1620 may determine the differences based on the telemetry data stored in the hier-archical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a pre-defined threshold, etc.). The given sled 500 may then report back a simplified result (e.g., yes or no, etc.) to the orches-trator server 1620, which the orchestrator server 1620 may utilize in determining the allocation of resources to managed nodes.

Figure 17:
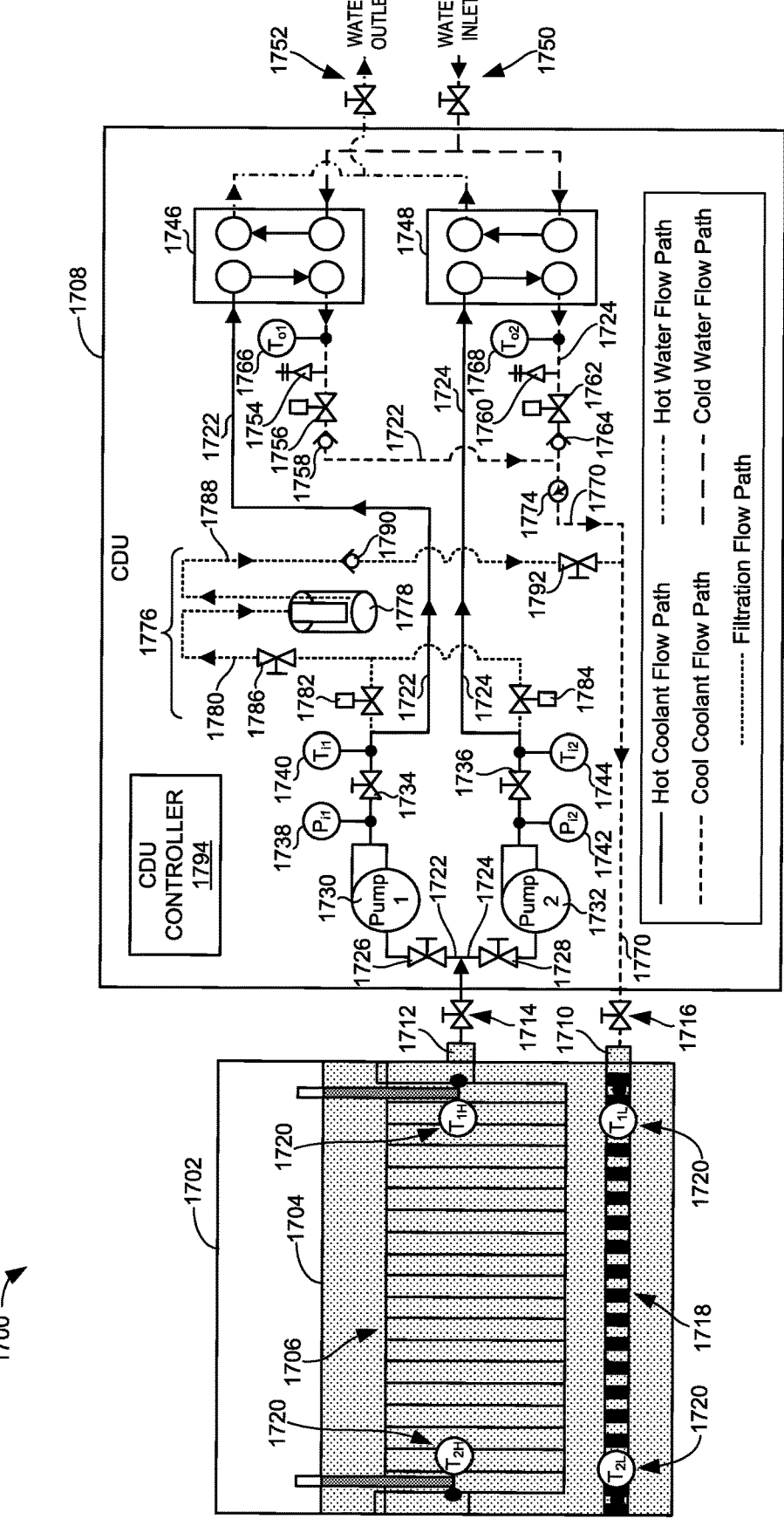
FIG. 17 illustrates an example immersion cooling system that may be implemented in any of the example data centers and/or building(s) of FIGS. 1 and/or 2.
Figure 18:
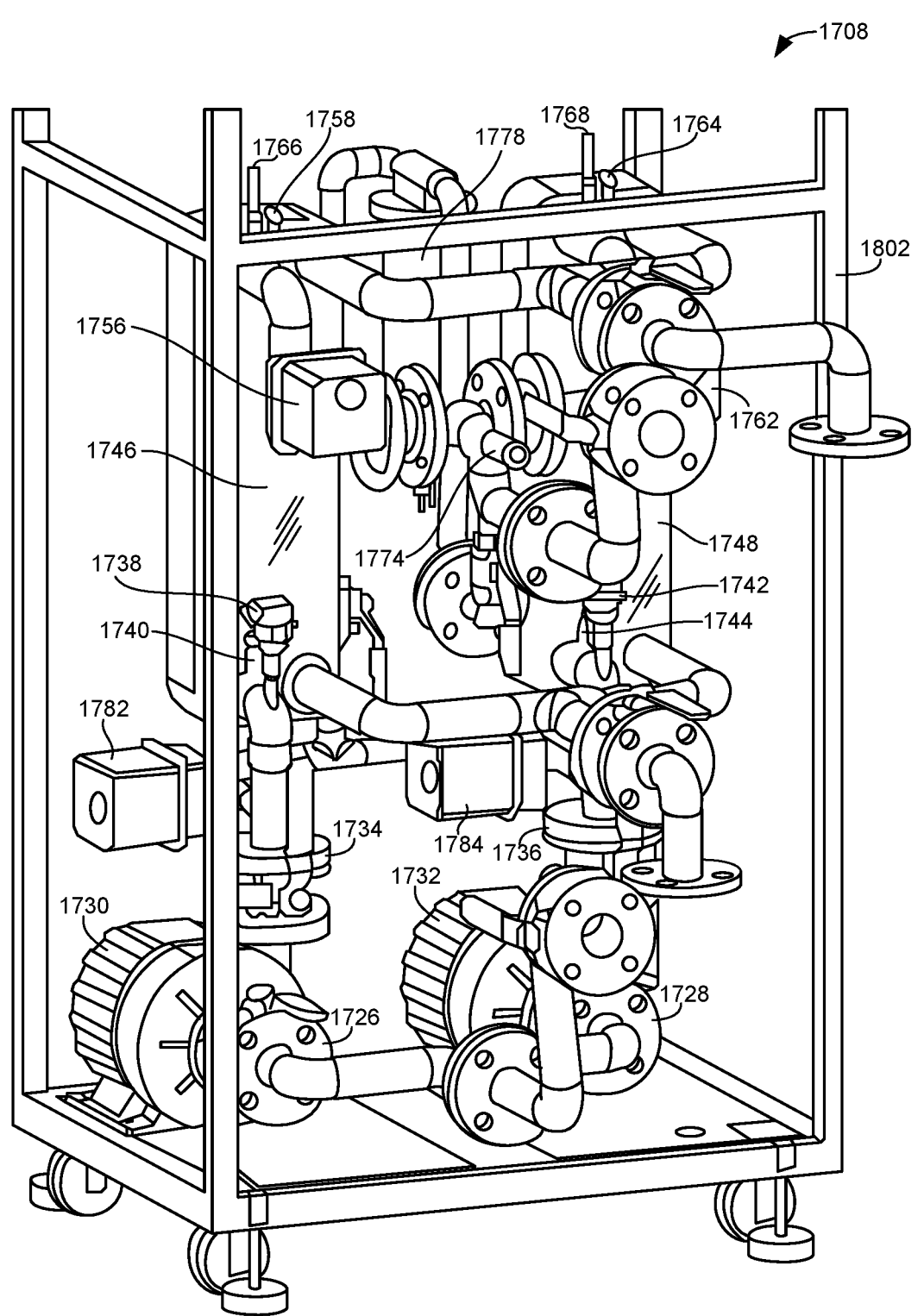
FIG. 18 illustrates an example construction of the example coolant distribution unit (CDU) of FIG. 17.

FIG. 17 illustrates an example immersion cooling system 1700 that may be implemented in any of the example data centers 102, 106, 116, 200 and/or building(s) 110 of FIGS. 1 and/or 2. The example immersion cooling system 1700 includes a tank 1702 to hold a coolant 1704 in which one or more electronic components are immersed. In some examples disclosed herein, the electronic components include servers and will be referred to as servers 1706 with the understanding that other electronic components could additionally or alternatively be immersed in the tank 1702. In this example, the coolant 1704 is FC40. However, any other suitable coolant may be used. As the coolant 1704 draws heat produced by the servers 1706, the coolant will heat up. Accordingly, in this example, the heated coolant 1704 is removed from the tank 1702 and looped through a coolant distribution unit (CDU) 1708 to cool down the coolant before reintroducing the cooled coolant 1704 back into the tank 1702. Although this example is described with reference to a tank 1702, in other examples, the CDU 1708 may be coupled to a server rack (e.g., the rack 340 of FIG. 3, etc.) and/or any other type of fluid cooling system. A particular construction of the CDU 1708 showing an example position of the different components within the CDU 1708 (disclosed in further detail below) is illustrated in FIG. 18. However, other arrangements of the components in the CDU 1708 are possible.

As shown in the illustrated example, the tank 1702 includes a coolant supply pipe 1710 and a coolant return pipe 1712 that are fluidly coupled to the CDU 1708 via corresponding valves 1714, 1716. More particularly, the coolant return pipe 1712 is associated with an outlet of the tank 1702 from which the CDU 1708 obtains the coolant from the tank 1702, whereas the coolant supply pipe 1710 is associated with an inlet of the tank 1702 through which the coolant 1704 is returned back (e.g., supplied, etc.) to the tank 1702. In this example, both the supply pipe 1710 and the return pipe 1712 are on the same side (or end) of the tank 1702. However, in other examples, the supply pipe 1710 and the return pipe 1712 may be placed on opposite sides (or ends) of the tank 1702 and/or at any other suitable location relative to the tank 1702 and/or the CDU 1708. As the coolant 1704 is introduced into the tank 1702 via the coolant supply pipe 1710, the coolant 1704 passes through a flow regulating assembly 1718. The flow regulating assembly 1718 serves to increase the uniformity of the flow of the coolant 1704 across the servers 1706 within the main cavity of the tank 1702. In some examples, the tank 1702 includes one or more temperature sensors 1720 to measure the temperature of the coolant 1704. In this example, the temperature sensors 1720 are positioned proximate to respective sides or ends of the tank 1702 and near the bottom (cold region) and top (hot region) of the tank 1702. In some examples, the temperature sensors 1720 are resistance temperature detectors (RTDs). Example coolant tanks implemented in accordance with teachings of this disclosure are described below in conjunction with FIGS. 29-34.

Many cooling system loops use CDUs with a primary loop that connects the CDU and external heat transfer loops or cooling units, and a secondary loop that connects the CDU secondary loop and the immersion tank or data center rack. However, unlike the example CDU 1708 of FIG. 17, many existing CDU-based solutions are not easily scalable and/or are cost prohibitive because they require very particular cooling infrastructure and additional data center footprint. Additionally, many known CDU-based cooling systems implement two separate CDUs to provide redundancy, thereby further adding to the cost and data center footprint for such solutions. Further, using multiple CDUs for a single system creates complexity in the maintenance of such systems. Further still, while such systems can provide redundancy, such systems are often unable to maintain a consistent and uniform liquid flow field during maintenance of one of the CDUs and/or during failure of one of the CDUs. As a result, CDU failure and/or maintenance in such systems can lead to cooling performance degradation and reliability issues for the IT equipment (e.g., servers, etc.) being cooled.

Unlike known CDU-based cooling systems, the example CDU 1708 of FIG. 17 provides 1+1 redundancy of components by itself without the need for a separate CDU. However, the example CDU 1708 does not include duplicates of components that are not needed for redundancy thereby achieving a smaller footprint than is possible using existing techniques that involve two standalone CDUs. Further, the design of the components in the example CDU 1708 enables control sequences based on an integrated monitoring system that enable the maintenance of components during operation (e.g., while the system is online, etc.) without degradation to the flow rate and/or cooling efficiency of the system.

Turning in detail to the illustrated example of FIG. 17 (as well as the example construction illustrated in FIG. 18), the CDU 1708 is connected to the coolant return pipe 1712 at an inlet to the CDU 1708 that branches into two parallel flow paths 1722, 1724. Flow along the first flow path 1722 is controlled by a first CDU inlet valve 1726 and flow along the second flow path 1724 is controlled by a second CDU inlet valve 1728. In some examples, the inlet valves 1726, 1728 are manually operated gate valves. However, other types of valves may be used. Further, in some examples, the valves 1726, 1728 may be controlled by an actuator independent of manual operation. When the first CDU inlet valve 1726 is open, the coolant 1704 is drawn from the tank 1702 and along the first flow path 1722 by a first pump 1730. Similarly, when the second CDU inlet valve 1728 is open, the coolant 1704 is drawn from the tank 1702 and along the second flow path 1724 by a second pump 1732. In this example, the pumps 1730, 1732 are positioned in parallel to one another (e.g., along the separate flow paths 1722, 1724, etc.) to provide 1+1 redundancy. In some examples, the pumps 1730, 1732 are metering pumps. In some examples, the pumps 1730, 1732 include one or more valves disposed thereon to be implemented as a pump/valve combination that enables variable flow rates and/or isolated of the components are needed.

In some examples, only one of the pumps 1730, 1732 is used at any given time to draw out the heated coolant 1704 from the tank 1702 to be cooled. In other examples, both pumps 1730, 1732 can be operating at the same time as a variable frequency dual pump system. In some such examples, the pumps 1730, 1732 operate at reduced power but either can be ramped up to maintain adequate flow of the coolant 1704 in the system by itself in the event the other pump fails or is placed into a maintenance mode. More particularly, in some examples, during normal operation, both pumps are operating. Such an implementation can increase the power efficiency of the system because each pump 1730, 1732 only needs to provide 50% of the flow rate. That is, in some examples, when only one of the pumps 1730, 1732 is operating, the pump operates at a first speed to maintain a flow rate of the coolant 1704 through the CDU 1708 (e.g., through the corresponding first or second flow path 1722, 1724, etc.) that corresponds to a combined flow rate of the coolant 1704 being pumped by both pumps 1730, 1732 concurrently when both pumps are in operation (at lower speeds for lower flow rates in the individual flow paths 1722, 1724 that are combined downstream as detailed further below). The lower flow rate in each of the separate flow paths 1722, 1724 can be achieved at a reduced operating speed of the pumps (relative to the speed of a single pump), which results in a power saving of up to 75% relative to the operation of a single pump according to pump affinity laws. In particular, the affinity laws establish that the capacity or flow rate (Q) is proportional to rotation speed (N) (e.g., $Q1/Q2=N1/N2$, etc.) and that the power consumption (P) is proportional to the cube of the rotation speed (N) (e.g., $P1/P2=(N1/N2)^3$, etc.). Based on these laws, when speed (N) is reduced by 50%, power consumption (P) will be reduced to 12.5% (the cube of 50%). Thus, two pumps operating at 12.5% of total power results in a total power consumption of 25% for a power savings of approximately 75%. However, in this example, the pumps 1730, 1732 are rated to be able to operate at full power to maintain the desired flow rate that satisfies the cooling capacity required for the system. In this manner, one of the pumps can be taken offline for maintenance while the other pump can remain online to operate by itself without risking degradation to the flow rate, thereby avoiding problems associated with the electrical equipment (e.g., the servers 1706, etc.) in the tank 1702 overheating.

In some examples, a first downstream valve 1734 is positioned on the first flow path 1724 downstream of the first pump 1730 and a second downstream valve 1736 is positioned on the second flow path 1724 downstream of the second pump 1732. Further, as shown in the illustrated example, a first pressure sensor 1738 and a first temperature sensor 1740 are also positioned downstream of the first pump 1730. Similarly, a second pressure sensor 1742 and a second temperature sensor 1744 are positioned downstream of the second pump 1732. In some examples, the temperature sensors 1740, 1744 are resistance temperature detectors (RTDs). In this example, the downstream valves 1734, 1736 are positioned between the corresponding pressure sensors 1738, 1742 and temperature sensors 1740, 1744. However, the downstream valves 1734, 1736, pressure sensors 1738, 1742, and inlet temperatures sensors 1740, 1744 can be arranged in any suitable order along the two corresponding flow paths 1722, 1724. In some examples, the downstream valves 1734, 1736 are manually operated gate valves. However, other types of valves may be used. Further, in some examples, the valves 1734, 1736 may be controlled by an actuator independent of manual operation.

In the illustrated example, the two flow paths 1722, 1724 remain separate downstream from the correspond pumps 1730, 1732 as they direct the coolant 1704 towards corresponding first and second heat exchangers 1746, 1748. That is, the first flow path 1722 directs the heated coolant 1704 from the first pump 1730 into the first heat exchanger 1746 to transfer heat from the coolant 1704 to water passing through the first heat exchanger 1746. The second flow path 1724 directs the heated coolant 1704 from the second pump 1732 into the second heat exchanger 1748 to similarly transfer heat from the coolant 1704 to water passing through the second heat exchanger 1746. In some examples, the water passing through both heat exchangers 1746, 1748 is from an inlet associated with a water inlet valve 1750 and expelled from an outlet associated with a water outlet valve 1752. In some examples, the heat exchangers 1746, 1748 are plate heat exchangers. As with the pumps 1730, 1732, the heat exchangers 1746, 1748 operate in parallel to one another on the separate flow paths 1722, 1724 to provide redundancy (e.g., 1+1 redundancy, etc.). As a result, either of the heat exchangers 1746, 1748 can be used to cool the coolant 1704 while the other heat exchanger is being maintained (e.g., cleaned, etc.).

As shown in the illustrated example of FIG. 17, as the coolant 1704 exits the first heat exchanger 1746 on the first flow path 1722, the coolant 1704 passes a first exhaust valve 1754, a first heat exchanger outlet valve 1756, and a first check valve 1758. Similarly, as the coolant 1704 exits the second heat exchanger 1748 on the second flow path 1724, the coolant 1704 passes a second exhaust valve 1760, a second heat exchanger outlet valve 1762, and a second check valve 1764. In this example, the heat exchanger outlet valves 1756, 1762 are electric valves (e.g., solenoid valves, etc.) that are normally open. As a result, the coolant 1704 will pass through both heat exchangers during normal operation unless one of the heat exchanger outlet valves 1756, 1762 are triggered to close. In other examples, the heat exchanger outlet valves 1756, 1762 may be implemented by any other suitable type of valve that is either manually or electronically controlled.

In this example, each of the flow paths 1722, 1724 include corresponding temperature sensors 1766, 1768 at the outlet of the heat exchangers 1746, 1748. In some examples, the temperature sensors 1766, 1768 are resistance temperature detectors (RTDs).

Downstream of the two check valves 1758, 1764, the two separate flow paths 1722, 1724 combine into a single flow path 1770 that leads to and is fluidly coupled to the coolant supply pipe 1710 of the tank 1702. In some examples, a conductivity meter 1774 is positioned along this single flow path 1770 to measure the conductivity of the coolant 1704 that has been cooled after passing through the heat exchangers 1746, 1748.

As discussed above, in some examples, both of the pumps 1730, 1732 pump the coolant 1704 concurrently through the respective flow paths 1722, 1724 before combining in the single flow path 1770. In such examples, the pumps 1730, 1732 are driven to produce a particular flow rate of the coolant in the final single flow path 1770 that satisfies heat transfer requirements to cool the servers 1706 within the tank 1702. In situations where one of the pumps 1730, 1732 fails or is otherwise turned off (e.g., for maintenance, etc.), the remaining pump 1730, 1732 can be driven at a higher speed so that the flow rate of the coolant 1704 through the corresponding first or second flow path 1722, 1724 corresponds to or is substantially equal to (e.g., is within 5% of, etc.) the flow rate through the single cold flow path 1770 when both the pumps 1730, 1732 are operating concurrently. In this manner, the heat transfer requirements to cool the servers 1706 can be achieved regardless of whether one pump is operating or both pumps are operating.

As shown in FIG. 17, the example CDU 1708 includes a filtration system 1776 through which the coolant 1704 may be run to filter out any impurities, contaminants, and/or particulates within the coolant. In this example, the filtration system 1776 includes a single filter 1778 because there is less need for redundancy for the filter as there is for the pumps 1730, 1732 and the heat exchangers 1746, 1748. By including only a single filter 1778 the overall size or footprint of the CDU can be reduced relatively to two completely standalone CDUs that may be used in existing cooling solutions. As shown in the illustrated example, the coolant 1704 is introduced into the filtration system 1776 via one of two lines that branch off of respective ones of the flow paths 1722, 1724 that subsequently combine into a single filtration input flow path 1780 that is fluidly coupled to the filter 1778. Whether the coolant 1704 is directed from the flow paths 1722, 1724 to the filtration input flow path 1780 is controlled by first and second filtration input valves 1782, 1784 positioned on the separate lines that branch off of the respective first and second flow paths 1722, 1724. In this example, the filtration input valves 1782, 1784 are electric valves (e.g., solenoid valves, etc.) that are normally closed. As a result, the coolant 1704 will normally bypass the filtration system 1776 unless the filtration input valves 1782, 1784 are triggered to open. In other examples, the filtration input valves 1782, 1784 may be implemented by any other suitable type of valve that is either manually or electronically controlled.

As shown in FIG. 17, a separate valve 1786 may be positioned on the filtration input flow path 1780 downstream of the filtration input valves 1782, 1784 and upstream of the filter 1778. In this example, an output flow path 1788 of the filtration system 1776 is fluidly coupled to the single flow path 1770 downstream of the heat exchangers 1746, 1748 that directs the coolant 1704 to the supply pipe 1710 of the tank 1702. In some examples, a third check valve 1790 and a separate valve 1792 are positioned along the placed downstream of the filter 1778 on a filtration output flow path 1788. In some examples, the valves 1786, 1792 upstream and downstream of the filter 1778 are manually operated gate valves. However, other types of valves may be used. Further, in some examples, the valves 1786, 1792 may be controlled by an actuator independent of manual operation.

As shown in the illustrated example of FIG. 18, all of the components of the CDU 1708 (e.g., both pumps 1730, 1732, both heat exchangers 1746, 1748, the single filter 1778, and the various sensors and valves) are carried by and fit within a single chassis or housing 1802. In this example, the CDU housing 1802 is open to provide access to the components. In other examples, the CDU housing 1802 may enclose some or all of the components.

In some examples, the CDU 1708 includes a controller 1794 that controls the operation of the CDU 1708. More particularly, in some examples, the CDU controller 1794 controls the operation of one or more of the pumps 1730, 1732 and/or one or more of the valves 1726, 1728, 1734, 1736, 1756, 1762, 1782, 1784, 1786, 1792 based on feedback received from one or more of the pressure sensors 1738, 1742, one or more of the temperature sensors 1740, 1744, 1766, 1768, and/or the conductivity meter 1774. In some examples, the CDU controller 1794 may also receive and control operations based on feedback from one or more of the temperature sensors 1720 in the tank 1702. Additionally or alternatively, in some examples, the CDU controller 1794 controls operations of the CDU 1708 based on inputs provided by a user via an associated user interface.

Further detail regarding the implementation of the example CDU controller 1794 is provided below in connection with FIG. 19. However, in general terms, during normal operation, the CDU controller 1794 will first input the CDU pump outlet pressure ($P_{i1}$ and $P_{i2}$), and then start the system. First, the pumps 1730, 1732 start at a reduced (e.g., minimum, etc.) speed and the CDU controller 1794 detects that the pressure is within the normal range based on feedback from the pressure sensors 1738, 1742. If the pressure is within the normal range, the operation of the pumps 1730, 1732 will continue to force the coolant 1704 through the system without the CDU controller 1794 providing any control signals any of the filtration input valves 1782, 1784 (so that they remain in their normally closed state) or the heat exchanger outlet valves 1756, 1762 (so that they remain in their normally open state). If the pressure is not within normal range, the CDU controller 1794 will generate an alert or notification to a user (e.g., via a data center console, etc.) to check the status of the pump. This process is referred to herein as the normal operating mode of the CDU 1708. Further detail regarding the normal operating mode is provided in connection with the flowchart shown in FIG. 21.

At certain points in time (e.g., either on a periodic or aperiodic schedule, as needed, and/or as otherwise initiated by a user, etc.), the CDU controller 1794 may switch the CDU 1708 from a normal operating mode (discussed above) to a filtering mode. In the filtering operation mode, the CDU controller 1794 will first set the filter cycle. In some examples, when the filter state is activated, the filter period is determined to be either an odd cycle or an even cycle. In some examples, odd cycles are designated to filter the coolant 1704 passing through one of the pumps 1730, 1732 while even cycles are designated to filter the coolant 1704 passing the other one of the pumps 1730, 1732. Thus, for example, if the current cycle being set is an odd cycle, the CDU controller 1794 designates the first pump 1730 as the filter pump and the second pump 1732 as the cooling pump. In this scenario, the controller triggers the first filtration input valve 1782 to open from its normally closed state and triggers the first heat exchanger outlet valve 1756 to close from its normally opened state. As a result of opening the first filtration input valve 1782 and closing the heat exchanger outlet valve 1756, the coolant is diverted from the first flow path 1722 and into the filtration input flow path 1780 to pass through the filter 1778. At the same time, the coolant 1704 passing through the second flow path 1724 will continue toward the heat exchangers 1746, 1748 to be cooled. In this scenario, the coolant 1704 that passes through the filter 1778 (from the first pump 1730) will recombine with the coolant 1704 cooled by the second heat exchanger 1748 in the single flow path 1770 that leads back to the coolant supply pipe 1710 of the tank 1702. In some examples, the flow rate of the coolant 1704 passing through the filtration system will be significantly less than the flow rate of the coolant 1704 that passes through the heat exchangers 1746, 1748. More particularly, in some examples, the flow rate of the coolant 1704 passing through the filtration system is between 50% and 30% or less of the flow rate of the coolant 1704 being pumped through the heat exchangers. As a result, when the filtered coolant 1704 (having passed through the filter 1778) recombines with the cooled coolant 1704 (having passed through one of the heat exchangers 1746, 1748), the filtered coolant 1704 will not have a significant impact on the temperature of the coolant 1704 even though it was not cooled through a heat exchanger.

Continuing the above example, if the filter cycle is an even cycle the roles of the pumps 1730, 1732 and the operation of the valves is reversed. That is, the first pump 1730 is designated as the cooling pump and the second pump 1732 is designated as the filter pump. In this example, the second filtration input valve 1784 is triggered to open (from its normally closed position) and the second heat exchanger outlet valve 1762 is triggered to close (from its normally open position). As a result, the coolant 1704 from the first pump 1730 is directed to pass through the first heat exchanger 1746 and the coolant 1704 from the second pump 1732 is directed to pass through the filtration system 1776 before being recombined and provided to the coolant supply pipe 1710 of the tank 1702. Further detail regarding this filtering mode of the CDU 1708 is provided in connection with the flowchart shown in FIG. 22.

At certain points in time (e.g., either on a periodic or aperiodic schedule, as needed, and/or as otherwise initiated by a user, etc.), the CDU controller 1794 may switch the CDU 1708 to a maintenance mode. In some examples, the maintenance mode may be initiated in response to a determination that one of the pumps 1730, 1732 is faulty or potentially damaged. Such a determination may be made when the pump outlet pressure falls outside of an acceptable range defined by an associated set point. Additionally or alternatively, in some examples, the set points for the pump outlet pressures are defined to set the CDU 1708 to a heat exchanger cleaning cycle (regardless of whether the pumps 1730, 1732 are operating properly). In some examples, the maintenance operating mode is an online mode in which the CDU 1708 continues to be able to cool the coolant 1704 in a manner that satisfies cooling requirements for the system.

In some examples, the CDU controller 1794 performs different operations depending on what maintenance needs to be performed on the CDU 1708. For instance, if the first pump 1730 is faulty or damaged, when in the maintenance mode, the CDU controller 1794 closes the valves 1726, 1734 on either side of the first pump 1730 to isolate the pump. In some examples, where the valves 1726, 1734 are manually operated, a user may need to close the valves. Once both valves 1726, 1734 are closed, the first pump 1730 can be removed and repaired and/or replaced. Thereafter, the valves 1726, 1734 may be reopened and the first flow path restored to operation. During the maintenance of the first pump 1730, the second pump 1732 can continue to operate and drive the coolant 1704 through the CDU 1708. If the second pump 1732 is damaged or faulty, the valves 1728 and 1736 on either side of the pump 1732 are closed to enable the removal, repair, and/or replacement of the second pump 1732 while the first pump 1730 enables the ongoing operation of the CDU 1708.

As noted above, in some examples, maintenance may need to be performed on the heat exchangers 1746, 1748 as part of a heat exchanger cleaning cycle. If the first heat exchanger 1746 is to be cleaned, the CDU controller 1794 turns off the first pump 1730 and closes the first downstream valve 1734 and closes (e.g., turns on the normally open, etc.) the first heat exchanger outlet valve 1756. In this manner, both the upstream and downstream sides of the first heat exchanger 1746 on the first flow path 1722 are closed off. In some examples, a user may manually close the first downstream valve 1734. In some examples, the first inlet valve 1726 can be closed in addition to or instead of the first downstream valve 1734. Once the valves 1734, 1756 upstream and downstream of the first heat exchanger 1746 on the first flow path 1722 are closed, the heat exchanger can be cleaned or otherwise maintained (e.g., repaired, replaced, etc.). During this cleaning process, the second pump 1732 can continue to operate and pass the coolant 1704 through the second heat exchanger 1748. If the second heat exchanger 1748 is to be cleaned, the second downstream valve 1736 (and/or the second inlet valve 1728) and the second heat exchanger outlet valve 1762 are closed while the first pump 1730 and the first heat exchanger 1746 continue to operate to cool the coolant 1704. Further detail regarding this maintenance mode of the CDU 1708 is provided in connection with the flowchart shown in FIG. 23.

Figure 19:
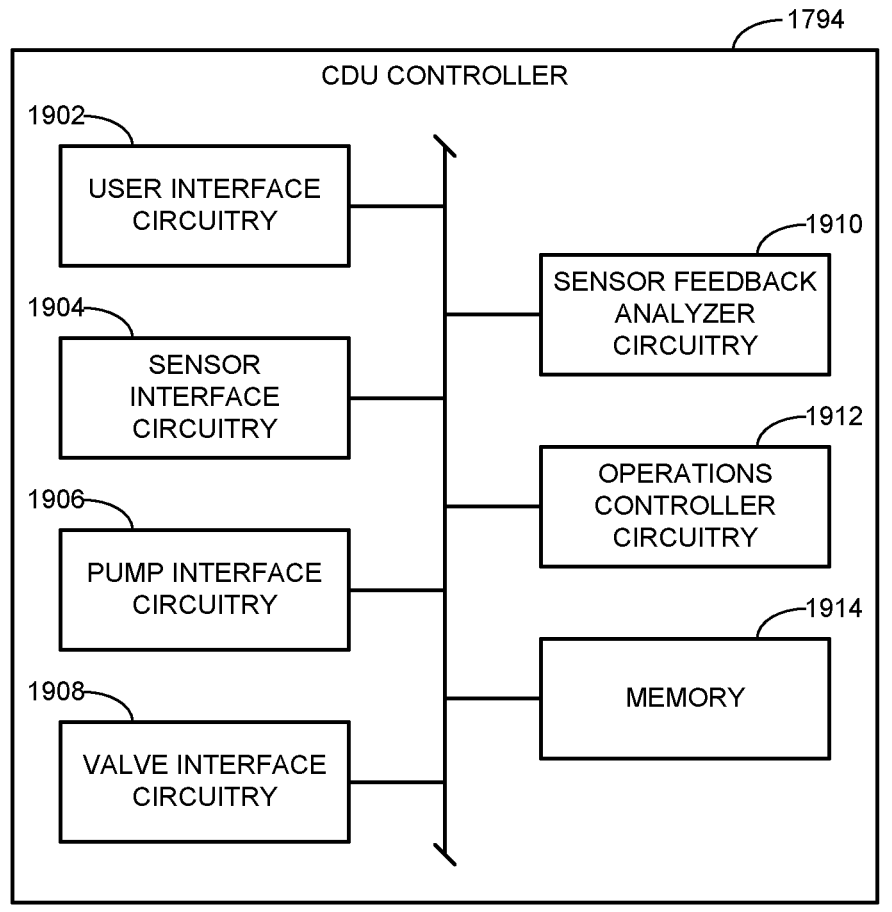
FIG. 19 is a block diagram of the example CDU controller of FIG. 17.

FIG. 19 is a block diagram of the example CDU controller 1794 that may be implemented to control operation of the CDU. The CDU controller 1794 of FIG. 19 may be instantiated (e.g., creating an instance of, bring into being for any length of time, materialize, implement, etc.) by processor circuitry such as a central processing unit executing instructions. Additionally or alternatively, the CDU controller 1794 of FIG. 19 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 19 may, thus, be instantiated at the same or different times. Some or all of the circuitry may be instantiated, for example, in one or more threads executing concurrently on hardware and/or in series on hardware. Moreover, in some examples, some or all of the circuitry of FIG. 19 may be implemented by microprocessor circuitry executing instructions to implement one or more virtual machines and/or containers.

As shown in FIG. 19, the example CDU controller 1794 includes example user interface circuitry 1902, example sensor interface circuitry 1904, example pump interface circuitry 1906, example valve interface circuitry 1908, example sensor feedback analyzer circuitry 1910, example operations controller circuitry 1912, and example memory 1914. The example user interface circuitry 1902 enables a user to interface with the CDU controller 1794 via an electronic device such as a PC, smartphone, display screen supported by the CDU housing, etc. In some examples, the user interface circuitry 1902 provides outputs (e.g., visual and/or audible, etc.) to the user. In some examples, the user interface circuitry 1902 receives inputs from a user. The example sensor interface circuitry 1904 enables the CDU controller 1794 to interface with and receives feedback from the various sensors (e.g., the pressure sensors 1738, 1742, one or more of the temperature sensors 1740, 1744, 1766, 1768, and/or the conductivity meter 1774, etc.). The example pump interface circuitry 1906 enables the CDU controller 1794 to interface with and provide control signals to the pumps 1730, 1732. The example valve interface circuitry 1908 enables the CDU controller 1794 to interface with and provide control signals to the valves 1726, 1728, 1734, 1736, 1756, 1762, 1782, 1784, 1786, 1792. In some examples, at least some of the valves may be manually operated and, therefore, not in communication with the CDU controller 1794. The example sensor feedback analyzer circuitry 1910 analyzes the feedback received from the sensors to compare it to set points (e.g., stored in the memory 1914, etc.) and or otherwise processes the sensor feedback data to facilitate the control of the various components within the CDU 1708. The example operations controller circuitry 1912 implements control signals and/or other operations in accordance with control logic (e.g., stored in the memory 1914, etc.) to enable the operations of the CDU when in any of the normal mode, the filtering mode, or the maintenance mode.

In some examples, the user interface circuitry 1902 is instantiated by programmable circuitry executing user interface instructions and/or configured to perform operations such as those represented by the flowchart(s) of FIGS. 20-23. In some examples, the CDU controller 1794 includes means for interfacing with a user. For example, the means for interfacing with a user may be implemented by the user interface circuitry 1902. In some examples, the user interface circuitry 1902 may be instantiated by programmable circuitry such as the example programmable circuitry 2412 of FIG. 24. For instance, the user interface circuitry 1902 may be instantiated by the example microprocessor 2500 of FIG. 25 executing machine executable instructions such as those implemented by at least blocks 2002, 2006, 2010 of FIG. 20, block 2114 of FIG. 21. In some examples, the user interface circuitry 1902 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the user interface circuitry 1902 may be instantiated by any other combination of hardware, software, and/or firmware. For example, the user interface circuitry 1902 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the sensor interface circuitry 1904 is instantiated by programmable circuitry executing sensor interface instructions and/or configured to perform operations such as those represented by the flowchart(s) of FIGS. 20-23. In some examples, the CDU controller 1794 includes means for interfacing with sensors. For example, the means for interfacing with sensors may be implemented by the sensor interface circuitry 1904. In some examples, the sensor interface circuitry 1904 may be instantiated by programmable circuitry such as the example programmable circuitry 2412 of FIG. 24. For instance, the sensor interface circuitry 1904 may be instantiated by the example microprocessor 2500 of FIG. 25 executing machine executable instructions such as those implemented by at least block 2106 of FIG. 21 and block 2308 of FIG. 23. In some examples, the sensor interface circuitry 1904 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the sensor interface circuitry 1904 may be instantiated by any other combination of hardware, software, and/or firmware. For example, the sensor interface circuitry 1904 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the pump interface circuitry 1906 is instantiated by programmable circuitry executing pump interface instructions and/or configured to perform operations such as those represented by the flowchart(s) of FIGS. 20-23. In some examples, the CDU controller 1794 includes means for interfacing with one or more pumps. For example, the interfacing with one or more pumps may be implemented by the pump interface circuitry 1906. In some examples, the pump interface circuitry 1906 may be instantiated by programmable circuitry such as the example programmable circuitry 2412 of FIG. 24. For instance, the pump interface circuitry 1906 may be instantiated by the example microprocessor 2500 of FIG. 25 executing machine executable instructions such as those implemented by at least blocks 2104, 2112, 2118 of FIG. 21 and blocks 2306, 2308, 2314, 2318 of FIG. 23. In some examples, the pump interface circuitry 1906 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the pump interface circuitry 1906 may be instantiated by any other combination of hardware, software, and/or firmware. For example, the pump interface circuitry 1906 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the valve interface circuitry 1908 is instantiated by programmable circuitry executing valve interface instructions and/or configured to perform operations such as those represented by the flowchart(s) of FIGS. 20-23. In some examples, the CDU controller 1794 includes means for interfacing with one or more valves. For example, the means for interface with one or more valves may be implemented by the valve interface circuitry 1908. In some examples, the valve interface circuitry 1908 may be instantiated by programmable circuitry such as the example programmable circuitry 2412 of FIG. 24. For instance, the valve interface circuitry 1908 may be instantiated by the example microprocessor 2500 of FIG. 25 executing machine executable instructions such as those implemented by at least block 2116 of FIG. 21, blocks 2206, 2208, 2210, 2216, 2218, 2220 of FIG. 22, and blocks 2304, 2306, 2310, 2316, 2322 of FIG. 23. In some examples, the valve interface circuitry 1908 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the valve interface circuitry 1908 may be instantiated by any other combination of hardware, software, and/or firmware. For example, the valve interface circuitry 1908 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the sensor feedback analyzer circuitry 1910 is instantiated by programmable circuitry executing sensor feedback analyzer instructions and/or configured to perform operations such as those represented by the flowchart(s) of FIGS. 20-23. In some examples, the CDU controller 1794 includes means for analyzing sensor feedback. For example, the means for analyzing sensor feedback may be implemented by the sensor feedback analyzer circuitry 1910. In some examples, the sensor feedback analyzer circuitry 1910 may be instantiated by programmable circuitry such as the example programmable circuitry 2412 of FIG. 24. For instance, the sensor feedback analyzer circuitry 1910 may be instantiated by the example microprocessor 2500 of FIG. 25 executing machine executable instructions such as those implemented by at least block 2102, 2108, 2110 of FIG. 21. In some examples, the sensor feedback analyzer circuitry 1910 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the sensor feedback analyzer circuitry 1910 may be instantiated by any other combination of hardware, software, and/or firmware. For example, the sensor feedback analyzer circuitry 1910 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the operations controller circuitry 1912 is instantiated by programmable circuitry executing operations controller instructions and/or configured to perform operations such as those represented by the flowchart(s) of FIGS. 20-23. In some examples, the CDU controller 1794 includes means for controlling operations. For example, the means for controlling operations may be implemented by the operations controller circuitry 1912. In some examples, the operations controller circuitry 1912 may be instantiated by programmable circuitry such as the example programmable circuitry 2412 of FIG. 24. For instance, the operations controller circuitry 1912 may be instantiated by the example microprocessor 2500 of FIG. 25 executing machine executable instructions such as those implemented by at least blocks 2002-2014 of FIG. 20, block 2120 of FIG. 21, blocks 2202, 2204, 2212, 2214, 2222 of FIG. 20, and blocks 2302, 2312 of FIG. 23 In some examples, the operations controller circuitry 1912 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the operations controller circuitry 1912 may be instantiated by any other combination of hardware, software, and/or firmware. For example, the operations controller circuitry 1912 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the CDU controller 1794 includes means for storing information. For example, the means for storing information may be implemented by the memory 1914. In some examples, the memory 1914 may be instantiated by programmable circuitry such as the example programmable circuitry 2412 of FIG. 24. In some examples, the memory 1914 may be instantiated by hardware logic circuitry, which may be implemented by an ASIC, XPU, or the FPGA circuitry 2600 of FIG. 26 configured and/or structured to perform operations corresponding to the machine readable instructions. Additionally or alternatively, the memory 1914 may be instantiated by any other combination of hardware, software, and/or firmware. For example, the memory 1914 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

While an example manner of implementing the CDU Controller 1794 of FIG. 17 is illustrated in FIG. 19, one or more of the elements, processes, and/or devices illustrated in FIG. 19 may be combined, divided, re-arranged, omitted, eliminated, and/or implemented in any other way. Further, the user interface circuitry 1902, the sensor interface circuitry 1904, the pump interface circuitry 1906, the valve interface circuitry 1908, the sensor feedback analyzer circuitry 1910, the operations controller circuitry 1912, the memory 1914, and/or, more generally, the example CDU Controller 1794 of FIG. 19, may be implemented by hardware alone or by hardware in combination with software and/or firmware. Thus, for example, any of the user interface circuitry 1902, the sensor interface circuitry 1904, the pump interface circuitry 1906, the valve interface circuitry 1908, the sensor feedback analyzer circuitry 1910, the operations controller circuitry 1912, the memory 1914, and/or, more generally, the example CDU Controller 1794, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example CDU Controller 1794 of FIG. 19 may include one or more elements, processes, and/or devices in addition to, or instead of, those illustrated in FIG. 19, and/or may include more than one of any or all of the illustrated elements, processes and devices.

Flowchart(s) representative of example machine readable instructions, which may be executed by programmable circuitry to implement and/or instantiate the CDU Controller 1794 of FIG. 19 and/or representative of example operations which may be performed by programmable circuitry to implement and/or instantiate the CDU Controller 1794 of FIG. 19, are shown in FIGS. 20-23. The machine readable instructions may be one or more executable programs or portion(s) of one or more executable programs for execution by programmable circuitry such as the programmable circuitry 2412 shown in the example processor platform 2400 discussed below in connection with FIG. 24 and/or may be one or more function(s) or portion(s) of functions to be performed by the example programmable circuitry (e.g., an FPGA) discussed below in connection with FIGS. 25 and/or 26. In some examples, the machine readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 20-23, many other methods of implementing the example CDU Controller 1794 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine readable instructions may be fragmented and stored on one or more storage devices, disks and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable, computer readable and/or machine readable media, as used herein, may include instructions and/or program(s) regardless of the particular format or state of the machine readable instructions and/or program(s).

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 20-23 may be implemented using executable instructions (e.g., computer readable and/or machine readable instructions) stored on one or more non-transitory computer readable and/or machine readable media. As used herein, the terms non-transitory computer readable medium, non-transitory computer readable storage medium, non-transitory machine readable medium, and/or non-transitory machine readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities, etc., the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities, etc., the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 20:
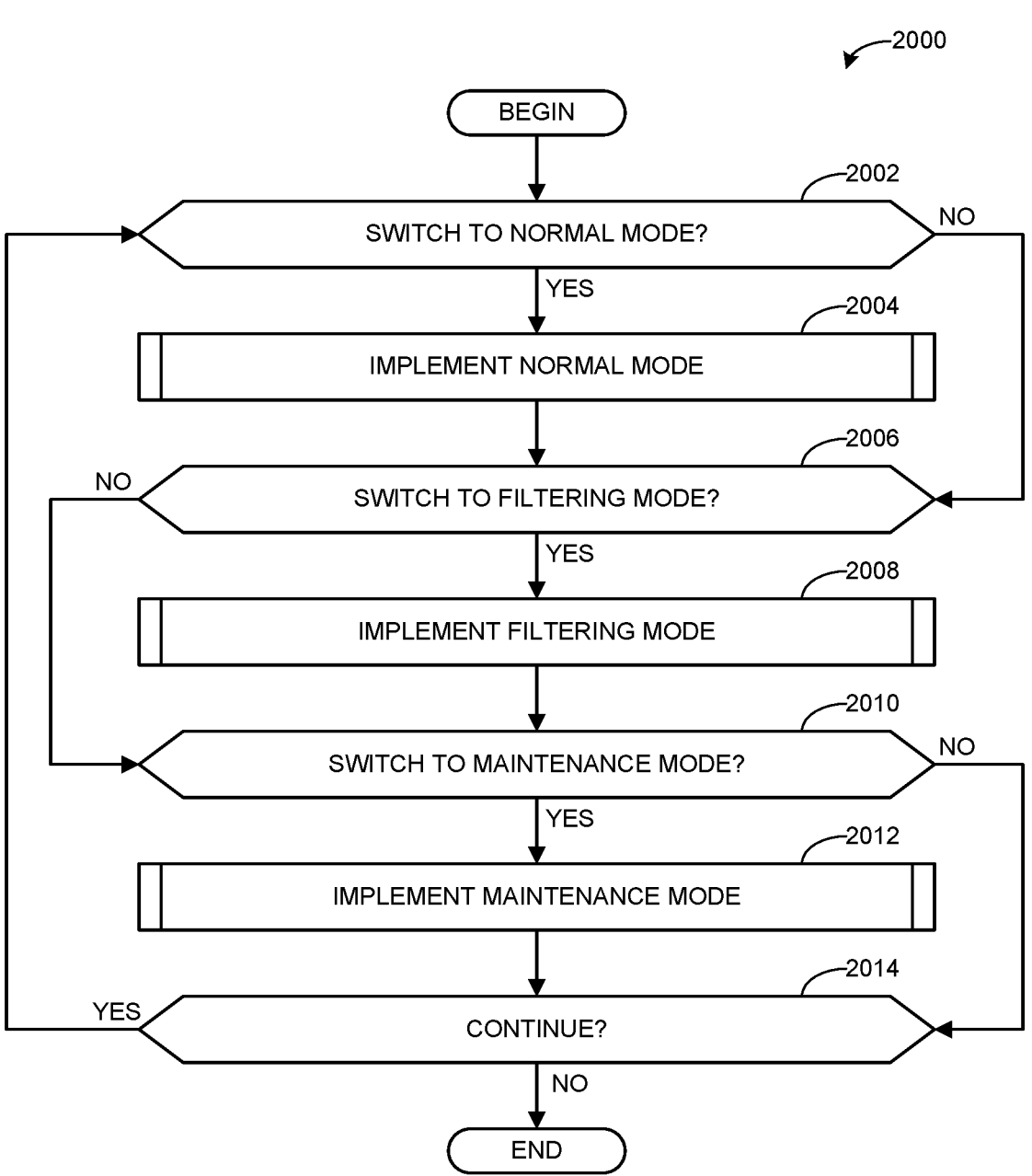
FIGS. 20-23 are flowcharts representative of example machine readable instructions and/or example operations that may be executed by example processor circuitry to implement the example CDU controller of FIG. 19.

FIG. 20 is a flowchart representative of example machine readable instructions and/or example operations 2000 that may be executed, instantiated, and/or performed by programmable circuitry to determine the operation mode of the CDU 1708 of FIG. 17. The example machine-readable instructions and/or the example operations 2000 of FIG. 20 begin at block 2002, at which the user interface circuitry 1902 and/or the operations controller circuitry 1912 determines if the operation mode of the CDU 1708 is to switch to a normal mode. For example, the user interface circuitry 1902 can determine if the operation mode is to switch to the normal mode based on a received user input. In some examples, the user interface circuitry 1902 and/or the operations controller circuitry 1912 can determine the CDU 1708 based on an absence of a command to operate in a different mode (e.g., maintenance mode, filtering mode, etc.). Additionally or alternatively, the user interface circuitry 1902 and/or the operations controller circuitry 1912 can determine if the operation mode of the CDU 1708 is to switch to the normal mode by any other suitable means (e.g., periodically, aperiodically, in response to a triggering condition, etc.). If the user interface circuitry and/or the operations controller circuitry 1912 determines the CDU 1708 is to operate in the normal mode, the operations 2000 advance to block 2004. If the user interface circuitry 1902 and/or the operations controller circuitry 1912 determines the CDU 1708 is not to operate in the normal mode, the operations 2000 advance to block 2006. At block 2004, the operations controller circuitry 1912 implements the normal operational mode. Example operations to implement block 2004 are described below in conjunction with FIG. 21.

At block 2006, the user interface circuitry 1902 and/or the operations controller circuitry 1912 determines if the operation mode of the CDU 1708 is to switch to a filtering mode. For example, the user interface circuitry 1902 can determine if the operation mode is to switch to the filtering mode based on a received user input. Additionally or alternatively, the user interface circuitry 1902 and/or the operations controller circuitry 1912 can determine if the operation mode of the CDU 1708 is to switch the filtering mode by any other suitable means (e.g., periodically, aperiodically, in response to a triggering condition, etc.). If the user interface circuitry and/or the operations controller circuitry 1912 determines the CDU 1708 is to operate in the filtering mode, the operations 2000 advance to block 2008. If the user interface circuitry 1902 and/or the operations controller circuitry 1912 determines the CDU 1708 is not to operate in the filtering mode, the operations 2000 advance to block 2010. At block 2008, the operations controller circuitry 1912 implements the filtering mode (e.g., filtering operational modes, filter operational mode, etc.). Example operations to implement block 2008 are described below in conjunction with FIG. 22.

At block 2010, the user interface circuitry 1902 and/or the operations controller circuitry 1912 determines if the operation mode of the CDU 1708 is to switch to a maintenance mode. For example, the user interface circuitry 1902 can determine if the operation mode is to switch to the maintenance mode based on a received user input (e.g., a user input indicating one or more of the pumps 1730, 1732 is to be replaced, a user input scheduling maintenance to the CDU 1708, a user input indicating the heat exchangers 1746, 1748 need to be cleaned, etc.). In some examples, the user interface circuitry 1902 and/or the operations controller circuitry 1912 can determine to switch to the maintenance mode in response to detecting a failure and/or damage to one or more of the pumps 1730, 1732 (e.g., via an input from the valve interface circuitry 1908, etc.). In some such examples, the user interface circuitry 1902 and/or the operations controller circuitry 1912 can determine to switch to the maintenance mode in response to detecting an outlet pressure of one or more of the pumps 1730, 1732 falls outside of an acceptable range defined by an associated set point (e.g., a threshold, etc.). Additionally or alternatively, the user interface circuitry 1902 and/or the operations controller circuitry 1912 can determine if the operation mode of the CDU 1708 is to switch to the maintenance mode by any other suitable means (e.g., periodically, aperiodically, in response to a triggering condition, etc.). If the user interface circuitry and/or the operations controller circuitry 1912 determines the CDU 1708 is to operate in the maintenance mode, the operations 2000 advance to block 2012. If the user interface circuitry 1902 and/or the operations controller circuitry 1912 determines the CDU 1708 is not to operate in the maintenance mode, the operations 2000 advance to block 2014. At block 2010, the operations controller circuitry 1912 implements the maintenance mode (e.g., maintenance operational modes, etc.). Example operations to implement block 2012 are described below in conjunction with FIG. 23.

At block 2014, the operations controller circuitry 1912 determines if the operations 2000 are to continue. For example, the operations controller circuitry 1912 can determine to not continue the operations 2300 in response to the CDU 1708 being power off. In other examples, the operations controller circuitry 1912 can determine to continue the operations 2000 based on a user input. Additionally or alternatively, the operations controller circuitry 1912 can determine to continue the operations 2000 based on any other suitable means. If the operations controller circuitry 1912 determines that the operations 2000 are to continue, the operations 2000 return to block 2002. If the operations controller circuitry 1912 determines that the operations 2000 are not to continue, the operations 2000 end.

Figure 21:
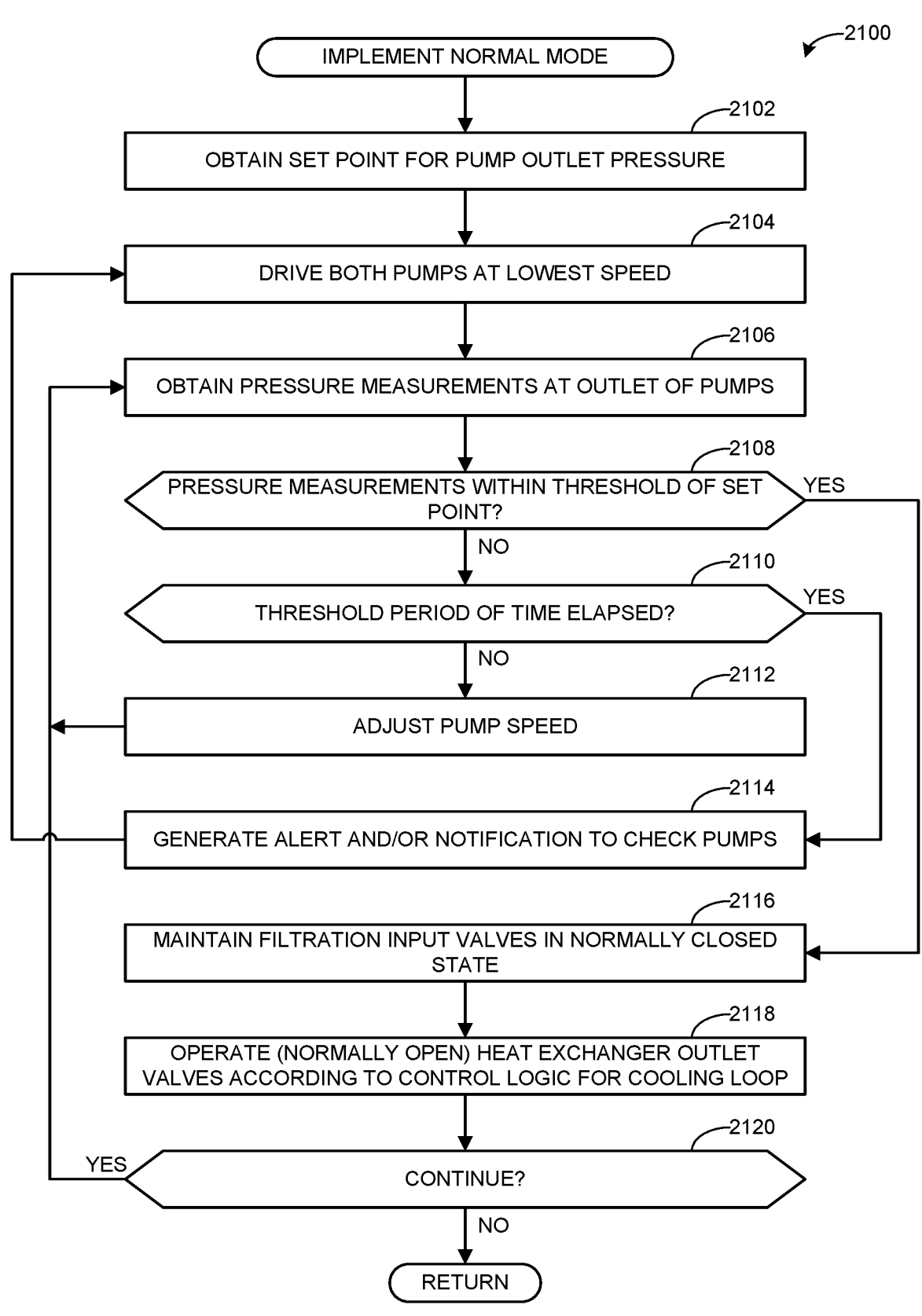

FIG. 21 is a flowchart representative of example machine readable instructions and/or example operations 2100 that may be executed, instantiated, and/or performed by programmable circuitry to operate the CDU 1708 in the normal mode and/or execute the block 2004 of FIG. 20. The example machine-readable instructions and/or the example operations 2100 of FIG. 21 begin at block 2102, at which the sensor feedback analyzer circuitry 1910 obtains one or more set point(s) for pump outlet pressure. For example, the sensor feedback analyzer circuitry 1910 can obtain one or more set point(s) (e.g., thresholds, etc.) from the memory 1914. In other examples, the sensor feedback analyzer circuitry 1910 can receive one or more set points via a user input (e.g., received from the user interface circuitry 1902, etc.)

At block 2104, the pump interface circuitry 1906 drives (e.g., operates, etc.) both of the pumps 1730, 1732 at a reduced (e.g., lowest, minimum, etc.) speed. For example, the pump interface circuitry 1906 can send a command (e.g., an electrical signal, a wired signal, a wireless signal, etc.) to the pumps 1730, 1732 to operate at a reduced speed. In some such examples, the pump interface circuitry 1906 can cause the pumps 1730, 1732 to operate as a variable frequency dual pump system to increase the power efficiency of the CDU 1708. At block 2106, the sensor interface circuitry 1904 obtains pressure measurements at the outlets of the pumps 1730, 1732. For example, the sensor interface circuitry 1904 can obtain the outlet pressure of the pumps 1730, 1732 from the pressure sensors 1738, 1742, respectively. At block 2108, the sensor feedback analyzer circuitry 1910 determines if the pressure measurements are within the thresholds of the set points. For example, the sensor feedback analyzer circuitry 1910 can determine if both of the pressure measurements associated with the outlet of the pumps 1730, 1732 satisfy one or more corresponding thresholds associated with the set points obtained during the execution of block 2102. If the sensor feedback analyzer circuitry 1910 determines both of the pressure measurements are within the threshold(s) associated with the set points, the operations 2100 advance to block 2116. If the sensor feedback analyzer circuitry 1910 determines both of the pressure measurements are not within the threshold(s) associated with the set points, the operations 2100 advance to block 2110.

At block 2110, the sensor feedback analyzer circuitry 1910 determines if a threshold period of time has elapsed. If the sensor feedback analyzer circuitry 1910 determines a threshold period has elapsed, the operations 2100 advance to block 2114. If the sensor feedback analyzer circuitry 1910 determines a threshold period has not elapsed, the operations 2100 advance to block 2112. At block 2112, the pump interface circuitry 1906 adjusts the speed of one or both of the pumps 1730, 1732. For example, the pump interface circuitry 1906 can increase the speed of the pumps 1730, 1732 by a predefined amount. In other examples, the pump interface circuitry 1906 can adjust the speed of the pumps 1730, 1732 by any other suitable amount. Thereafter, the operations 2100 returns to block 2106. At block 2114, the user interface circuitry 1902 generates an alert and/or notification to check the pumps 1730, 1732. In some examples, the user interface circuitry 1902 can generate an audio and/or visual alert and/or notification via a user interface associated with the CDU 1708. In some such examples, the generated alert and/or notification can include an indication to initiate the maintenance mode on the CDU 1708.

At block 2116, the valve interface circuitry 1908 maintains the filtration input valves 1782, 1784 in normally closed state. For example, the valve interface circuitry 1908 can not send a control signal to the filtration input valves 1782, 1784. In other examples, the valve interface circuitry 1908 can maintain a closed command signal to the filtration input valves 1782, 1784. At block 2118, the pump interface circuitry 1906 operates the (normally open) heat exchanger outlet valves 1756, 1762 according to the control logic for cooling loop. For example, the valve interface circuitry 1908 can maintain an open command signal to the heat exchanger outlet valves 1756, 1762. At block 2120, the operations controller circuitry 1912 determines if the normal mode is to continue. For example, the operations controller circuitry 1912 can determine to operate in the normal mode unless a command to enter another mode is received. If the operations controller circuitry 1912 determines that the normal mode is to continue, the operations 2100 return to block 2104. If the operations controller circuitry 1912 determines that the normal mode is not to continue, the operations 2100 end and return to the operations 2000 of FIG. 20.

Figure 22:
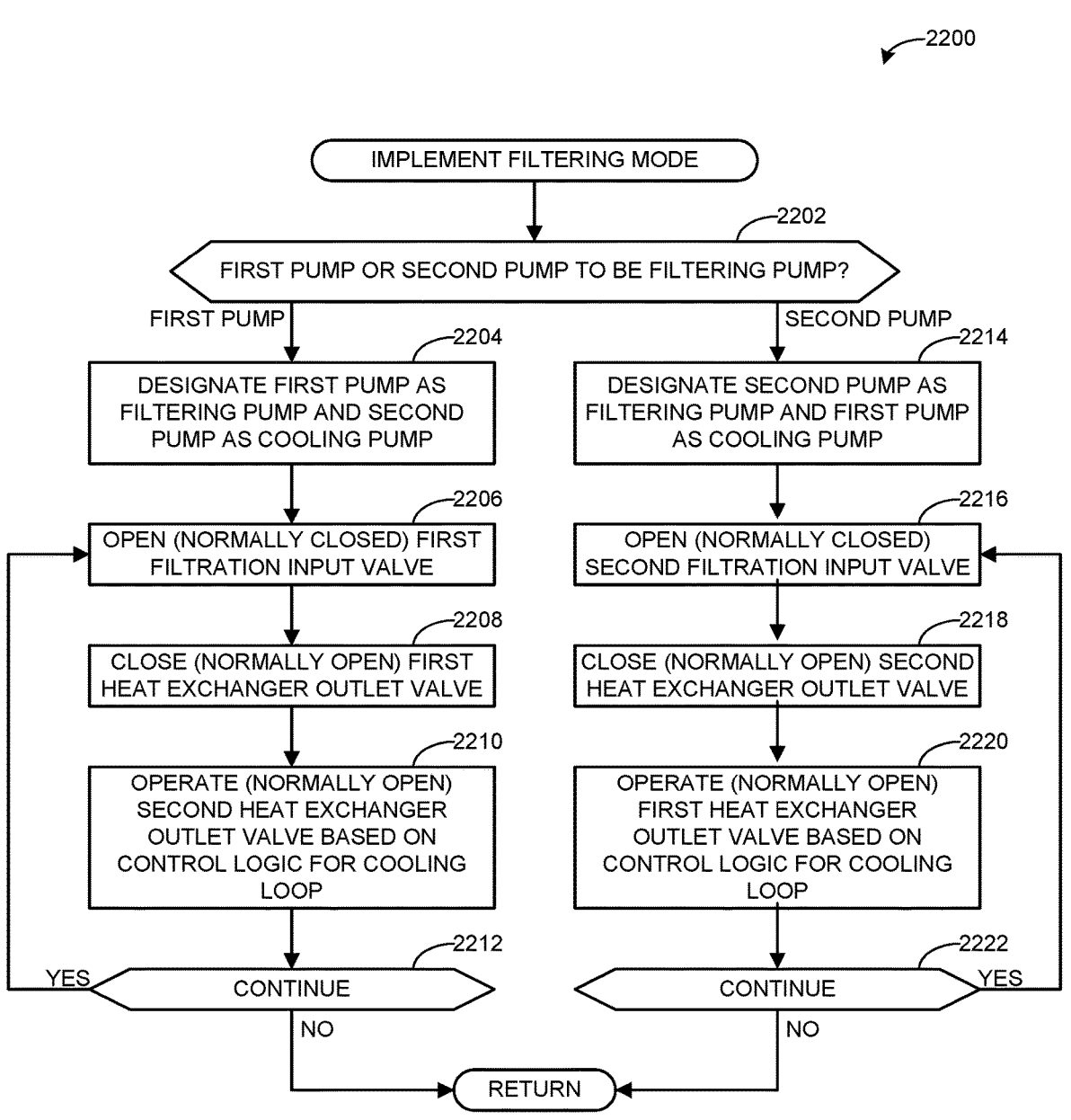

FIG. 22 is a flowchart representative of example machine readable instructions and/or example operations 2200 that may be executed, instantiated, and/or performed by programmable circuitry to execute implement the filtering operation mode of the CDU 1708 and/or execute block 2008 of FIG. 20. The example machine-readable instructions and/or the example operations 2200 of FIG. 22 begin at block 2202, at which the operations controller circuitry 1912 determines if the first pump 1730 or the second pump 1732 is to be the filtering pump. For example, the operations controller circuitry 1912 can determine which of the first pump 1730, or the second pump 1732 will pump coolant through the filter input flow path 1780 of the filtration system 1776 to remove impurities, contaminants, and/or particulates within the coolant of the CDU 1708. In some examples, the operations controller circuitry 1912 can select the first pump 1730 or the second pump 1732 based on the respective output pressures of the first pump 1730 or the second pump 1732 (e.g., a lower output pressure, a higher output pressure, etc.). In other examples, the operations controller circuitry 1912 can select the first pump 1730 or the second pump 1732 based on any other suitable metric (e.g., the pump with less total runtime, a most recently serviced pump, the other of the most recent filtering pump, etc.). If the operations controller circuitry 1912 determines the first pump 1730 is to be the filtering pump, the operations 2200 advance to block 2204. If the operations controller circuitry 1912 determines the second pump is to be the filtering pump, the operations 2200 advance to block 2214.

At block 2204, the operations controller circuitry 1912 designates the first pump 1730 as the filtering pump and the second pump 1732 as the cooling pump. For example, the operations controller circuitry 1912 can designate in the memory 1914 that the first pump 1730 is to pump coolant through the filtration flow path 1780 and the second pump 1732 is to pump coolant through the second flow path 1724. At block 2206, the valve interface circuitry 1908 opens the (normally closed) first filtration input valve 1782. For example, the valve interface circuitry 1908 can send a command signal (e.g., an electric signal, a hydraulic signal, a pneumatic signal, etc.) to the first filtration input valve 1782 to open the filtration input valve 1782. Additionally or alternatively, the valve interface circuitry 1908 can generate an alert to a user indicating the user should open the first filtration input valve 1782. At block 2208, the valve interface circuitry 1908 closes the (normally open) first heat exchanger outlet valve 1756. For example, the valve interface circuitry 1908 can send a command signal (e.g., an electric signal, a hydraulic signal, a pneumatic signal, etc.) to the first heat exchanger outlet valve 1756 to close the first heat exchanger outlet valve 1756. Additionally or alternatively, the valve interface circuitry 1908 can generate an alert to a user indicating the user should close the first heat exchanger outlet valve 1756. At block 2210, the valve interface circuitry 1908 can operate the (normally open) second heat exchanger outlet valve 1756 based on the control logic for the cooling loop. For example, the valve interface circuitry 1908 can access the control logic from the memory 1914. In some examples, the valve interface circuitry 1908 can send a command signal (e.g., an electric signal, a hydraulic signal, a pneumatic signal, etc.) to the second heat exchanger outlet valve 1756 to operate the second heat exchanger outlet valve 1756 according to the control logic. Additionally or alternatively, the valve interface circuitry 1908 can generate an alert to a user indicating the user should operate the second heat exchanger outlet valve 1756. At block 2212, the operations controller circuitry 1912 determines if the first pump 1730 is to continue to act as the filtering pump. For example, the operations controller circuitry 1912 can determine if the first pump 1730 is to continue to operate as the filtering pump based on an output pressure of the first pump 1730, detected level(s) of impurities, contaminants, and/or particulates within the coolant, and/or a user input. If the operations controller circuitry 1912 determines the first pump 1730 is to continue to operate as the filtering pump, the operations 2200 return to block 2206. If the operations controller circuitry 1912 determines the first pump 1730 is not to continue to operate as the filtering pump, the operations 2200 end and return to the operations 2000 of FIG. 20.

At block 2214, the operations controller circuitry 1912 designates the second pump 1732 as the filtering pump and the first pump 1730 as the cooling pump. For example, the operations controller circuitry 1912 can designate in the memory 1914 that the second pump 1732 is to pump coolant through the filtration flow path 1780 and the first pump 1732 is to pump coolant through the first flow path 1722. At block 2216, the valve interface circuitry 1908 opens (normally closed) the second filtration input valve 1784. For example, the valve interface circuitry 1908 can send a command signal (e.g., an electric signal, a hydraulic signal, a pneumatic signal, etc.) to the second filtration input valve 1784 to open the second filtration input valve 1784. Additionally or alternatively, the valve interface circuitry 1908 can generate an alert to a user indicating the user should open the second filtration input valve 1784. At block 2218, the valve interface circuitry 1908 closes the (normally open) second heat exchanger outlet valve 1754. For example, the valve interface circuitry 1908 can send a command signal (e.g., an electric signal, a hydraulic signal, a pneumatic signal, etc.) to the second heat exchanger outlet valve 1754 to close the second heat exchanger outlet valve 1754. Additionally or alternatively, the valve interface circuitry 1908 can generate an alert to a user indicating the user should close the second heat exchanger outlet valve 1754. At block 2220, the valve interface circuitry 1908 can operate the (normally closed) first heat exchanger outlet valve 1756 based on the control logic for the cooling loop. For example, the valve interface circuitry 1908 can access the control logic from the memory 1914. For example, the valve interface circuitry 1908 can send a command signal (e.g., an electric signal, a hydraulic signal, a pneumatic signal, etc.) to the first heat exchanger outlet valve 1756 to operate the first heat exchanger outlet valve 1756 according to the control logic. Additionally or alternatively, the valve interface circuitry 1908 can generate an alert to a user indicating the user should operate the first heat exchanger outlet valve 1756. At block 2222, the operations controller circuitry 1912 determines if the second pump 1732 is to continue to act as the filtering pump. For example, the operations controller circuitry 1912 can determine if the second pump 1732 is to continue to operate as the filtering pump based on an output pressure of the second pump 1732, detected level(s) of impurities, contaminants, and/or particulates within the coolant, and/or a user input. If the operations controller circuitry 1912 determines the second pump 1732 is to continue to operate as the filtering pump, the operations 2200 return to block 2206. If the operations controller circuitry 1912 determines the second pump 1732 is not to continue to operate as the filtering pump, the operations 2200 end and return to the operations 2000 of FIG. 20.

Figure 23:
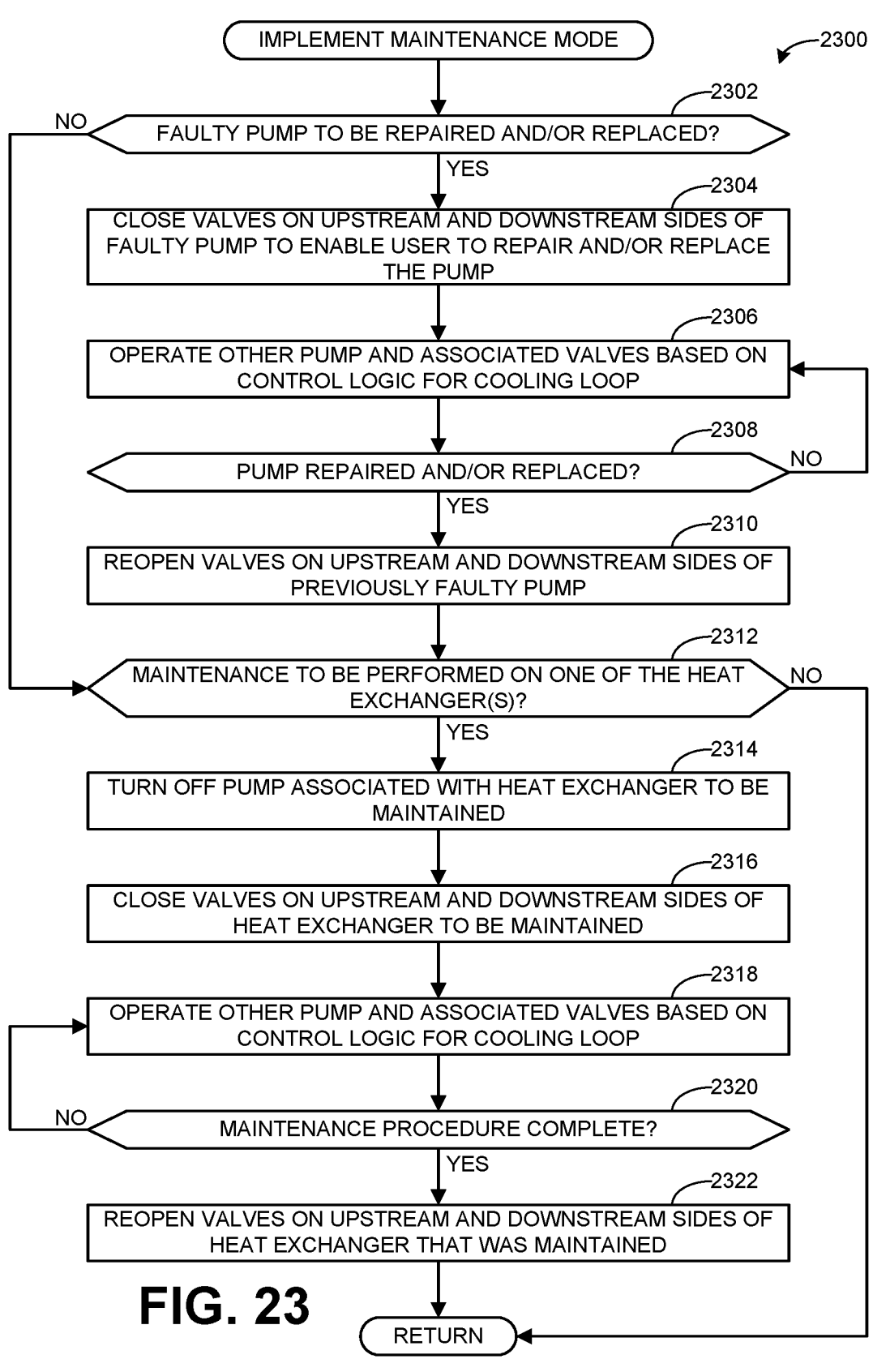

FIG. 23 is a flowchart representative of example machine readable instructions and/or example operations 2300 that may be executed, instantiated, and/or performed by programmable circuitry to operate the CDU 1708 in a maintenance operational mode and/or execute block 2012 of FIG. 20. The example machine-readable instructions and/or the example operations 2300 of FIG. 23 begin at block 2302, at which the operations controller circuitry 1912 determines if a faulty pump needs to be repaired and/or replaced. For example, the operations controller circuitry 1912 can determine if a faulty pump needs to be repaired or placed based on sensor data received from one or more of the sensors 1738, 1740, 1742, 1744, 1766, 1768. In some such examples, the operations controller circuitry 1912 can determine one or both of the pumps 1730, 1732 is faulty based on an output pressure of the pumps 1730, 1732 output by the sensors 1738, 1742. Additionally or alternatively, the operations controller circuitry 1912 can determine if a faulty pump needs to be repaired and/or replaced based on a user command and/or a total operation time of the associated pump. If the operations controller circuitry 1912 determines a faulty pump is to be repaired and/or replaced, the operations 2300 advance to block 2304. If the operations controller circuitry 1912 determines a faulty pump is not to be repaired and/or replaced, the operations 2300 advance to block 2312.

At block 2304, the valve interface circuitry 1908 closes the valves on the upstream and downstream sides of the faulty pump to enable the user to repair and/or replace the pump. For example, if the first pump 1730 needs to be replaced, the valve interface circuitry 1908 can send a command signal (e.g., an electric signal, a hydraulic signal, a pneumatic signal, etc.) to close the first CDU inlet valve 1726 and the first downstream valve 1734. For example, if the second pump 1732 needs to be replaced, the valve interface circuitry 1908 can send a command signal (e.g., an electric signal, a hydraulic signal, a pneumatic signal, etc.) to close the second CDU inlet valve 1728 and the second downstream valve 1736. At block 2306, the pump interface circuitry 1906 and/or the valve interface circuitry 1908 can operate the other pump and associated valves based on control logic for the cooling loop. For example, if the first pump 1730 is being replaced and/or repaired, the pump interface circuitry 1906 can operate the second pump 1732 and the valve interface circuitry 1908 can operate the second CDU inlet valve 1728, the second downstream valve 1736, the water inlet valve 1750, the water outlet valve 1752, and the second heat exchanger outlet valve 1762 according to the control logic. For example, if the second pump 1732 is being replaced and/or repaired, the pump interface circuitry 1906 can operate the first pump 1730 and the valve interface circuitry 1908 can operate the first CDU inlet valve 1726, the first downstream valve 1734, the water inlet valve 1750, the water outlet valve 1752, and the first heat exchanger outlet valve 1756 according to the control logic. In some examples, the pump interface circuitry 1906 and/or the valve interface circuitry 1908 can access the control logic from the memory 1914.

At block 2308, the pump interface circuitry 1906 and/or the user interface circuitry 1902 can determine if the pump has been repaired and/or replaced. For example, the user interface circuitry 1902 can determine whether the faulty pump has been repaired and/or replaced based on a user input indicating the faulty pump has been repaired and/or replaced. Additionally or alternatively, the pump interface circuitry 1906 can determine and/or detect the faulty pump has been repaired and/or replaced based on communications received from the repaired and/or replaced pump. If the pump interface circuitry 1906 and/or the user interface circuitry 1902 determines the pump has been repaired and/or replaced, the operations 2300 advance to block 2310. If the pump interface circuitry 1906 and/or the user interface circuitry 1902 determines the pump has not been repaired and/or replaced, the operations 2300 return to block 2306. At block 2310, the valve interface circuitry 1908 reopens the valves on the upstream and downstream sides of the previously faulty pump. For example, if the first pump 1730 was repaired and/or replaced, the valve interface circuitry 1908 can send a command signal (e.g., an electric signal, a hydraulic signal, a pneumatic signal, etc.) to reopen the first CDU inlet valve 1726 and the first downstream valve 1734. For example, if the second pump 1732 was repaired and/or replaced, the valve interface circuitry 1908 can send a command signal (e.g., an electric signal, a hydraulic signal, a pneumatic signal, etc.) to reopen the second CDU inlet valve 1728 and the second downstream valve 1736.

At block 2312, the operations controller circuitry 1912 determines if maintenance needs to be performed on one of the heat exchangers 1746, 1748. For example, the operations controller circuitry 1912 can determine if one or more of the heat exchangers 1746, 1748 needs to be maintained (e.g., repaired, cleaned, etc.) based on sensor data received from one or more of the sensors 1738, 1740, 1742, 1744, 1766, 1768. Additionally or alternatively, the operations controller circuitry 1912 can determine if one of the heat exchangers 1746, 1748 needs to be maintained based on a user command and/or a time since the last maintenance of the heat exchangers 1746, 1748. If the operations controller circuitry 1912 determines one of the heat exchangers 1746, 1748 is to be maintained, the operations 2300 advance to block 2314. If the operations controller circuitry 1912 determines one of the heat exchangers 1746, 1748 is not to be maintained, the operations 2300 end and return to the operations 2000 of FIG. 20.

At block 2314, the pump interface circuitry 1906 turns off (e.g., disables, powers off, etc.) the pump associated with the heat exchanger that is to be maintained. For example, if the first heat exchanger 1746 is to be maintained, the pump interface circuitry 1906 can turn off the first pump 1730 by sending a command signal to the first pump 1730. For example, if the second heat exchanger 1748 is to be maintained, the pump interface circuitry 1906 can turn off the second pump 1732 by sending a command signal to the second pump 1732. At block 2316, the valve interface circuitry 1908 closes the valves on the upstream and downstream sides of the first heat exchanger 1746 to be maintained. For example, if the first heat exchanger 1746 is to be maintained, the valve interface circuitry 1908 can send a command signal to close the first downstream valve 1734 and the first heat exchanger outlet valve 1756. For example, if the second heat exchanger 1748 is to be maintained, the valve interface circuitry 1908 can send a command signal (e.g., an electric signal, a hydraulic signal, a pneumatic signal, etc.) to close the second downstream valve 1736 and the second heat exchanger outlet valve 1762. At block 2318, the pump interface circuitry 1906 and/or the valve interface circuitry 1908 can operate the other pump and associated valves based on control logic for the cooling loop. For example, if the first heat exchanger 1746 is to be maintained, the pump interface circuitry 1906 can operate the second pump 1732 and the valve interface circuitry 1908 can operate the second CDU inlet valve 1728, the second downstream valve 1736, the water inlet valve 1750, the water outlet valve 1752, and the second heat exchanger outlet valve 1762 according to the control logic. For example, if the second heat exchanger 1748 is to be maintained, the pump interface circuitry 1906 can operate the first pump 1730 and the valve interface circuitry 1908 can operate the first CDU inlet valve 1726, the first downstream valve 1734, the water inlet valve 1750, the water outlet valve 1752, and the first heat exchanger outlet valve 1756 according to the control logic. In some examples, the pump interface circuitry 1906 and/or the valve interface circuitry 1908 can access the control logic from the memory 1914.

At block 2320, the user interface circuitry 1902 can determine if the maintenance procedure has been completed. For example, the user interface circuitry 1902 can determine the maintenance procedure has been completed for one of the heat exchangers 1746, 1748 based on a user input indicating the maintenance procedure has been completed. Additionally or alternatively, the user interface circuitry 1902 can determine whether the maintenance procedure has been completed based on an end of a preset amount of time and/or any other suitable metric. If the user interface circuitry 1902 determines the maintenance procedure has been completed for one of the heat exchangers 1746, 1748, the operations 2300 advance to block 2322. If the user interface circuitry 1902 determines the maintenance procedure has not been completed for one of the heat exchangers 1746, 1748, the operations 2300 return to block 2318. At block 2322, the valve interface circuitry 1908 reopens the valves on the upstream and downstream sides of the heat exchanger that was maintained. For example, if the first heat exchanger 1746 has been maintained, the valve interface circuitry 1908 can send a command signal to reopen the first downstream valve 1734 and the first heat exchanger outlet valve 1756. For example, if the second heat exchanger 1748 has been maintained, the valve interface circuitry 1908 can send a command signal (e.g., an electric signal, a hydraulic signal, a pneumatic signal, etc.) to reopen the second downstream valve 1736 and the second heat exchanger outlet valve 1762.

Figure 24:
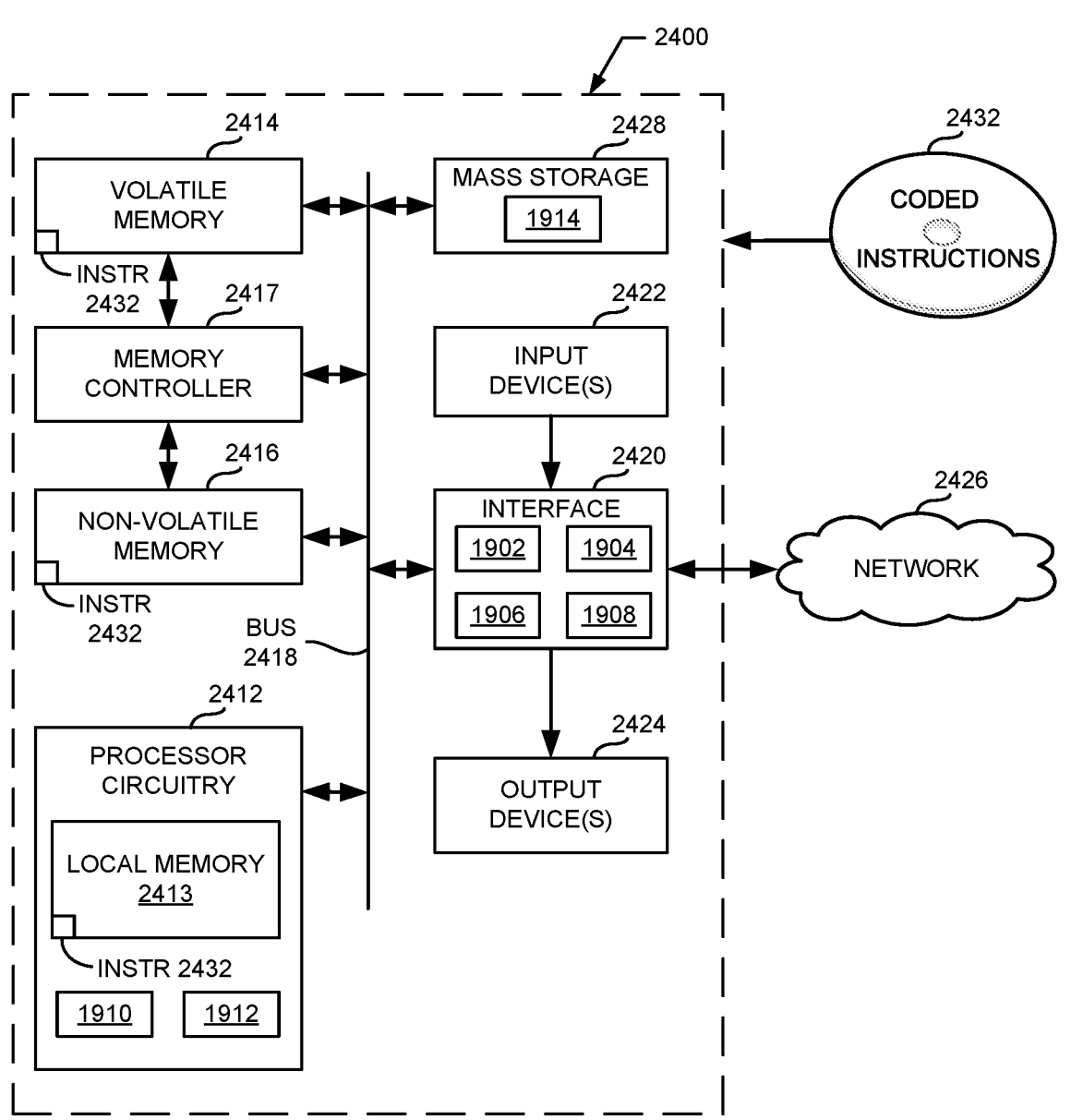
FIG. 24 is a block diagram of an example processing platform including processor circuitry structured to execute the example machine readable instructions and/or the example operations of FIG. 3 to implement the example CDU controller of FIG. 19.

FIG. 24 is a block diagram of an example programmable circuitry platform 2400 structured to execute and/or instantiate the example machine-readable instructions and/or the example operations of FIGS. 20-23 to implement the CDU controller 1794 of FIG. 19. The programmable circuitry platform 2400 can be, for example, a server, a personal computer, a workstation, a self-learning machine (e.g., a neural network), a mobile device (e.g., a cell phone, a smart phone, a tablet such as an iPad'), a personal digital assistant (PDA), an Internet appliance, a DVD player, a CD player, a Blu-ray player, a gaming console, a headset (e.g., an augmented reality (AR) headset, a virtual reality (VR) headset, etc.) or other wearable device, or any other type of computing and/or electronic device.

The programmable circuitry platform 2400 of the illustrated example includes programmable circuitry 2412. The programmable circuitry 2412 of the illustrated example is hardware. For example, the programmable circuitry 2412 can be implemented by one or more integrated circuits, logic circuits, FPGAs, microprocessors, CPUs, GPUs, DSPs, and/or microcontrollers from any desired family or manufacturer. The programmable circuitry 2412 may be implemented by one or more semiconductor based (e.g., silicon based) devices. In this example, the programmable circuitry 2412 implements the sensor feedback analyzer circuitry 1910 and the operations controller circuitry 1912.

The programmable circuitry 2412 of the illustrated example includes a local memory 2413 (e.g., a cache, registers, etc.). The programmable circuitry 2412 of the illustrated example is in communication with main memory 2414, 2416, which includes a volatile memory 2414 and a non-volatile memory 2416, by a bus 2418. The volatile memory 2414 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2416 may be implemented by flash memory and/or any other desired type of memory device. Access to the main memory 2414, 2416 of the illustrated example is controlled by a memory controller 2417. In some examples, the memory controller 2417 may be implemented by one or more integrated circuits, logic circuits, microcontrollers from any desired family or manufacturer, or any other type of circuitry to manage the flow of data going to and from the main memory 2414, 2416.

The programmable circuitry platform 2400 of the illustrated example also includes interface circuitry 2420. The interface circuitry 2420 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 2422 are connected to the interface circuitry 2420. The input device(s) 2422 permit(s) a user (e.g., a human user, a machine user, etc.) to enter data and/or commands into the programmable circuitry 2412. The input device(s) 2422 can be implemented by, for example, an audio sensor, a microphone, a camera (still or video), a keyboard, a button, a mouse, a touchscreen, a trackpad, a trackball, an isopoint device, and/or a voice recognition system.

One or more output devices 2424 are also connected to the interface circuitry 2420 of the illustrated example. The output device(s) 2424 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2420 of the illustrated example, thus, typically includes a graphics driver card, a graphics driver chip, and/or graphics processor circuitry such as a GPU.

The interface circuitry 2420 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2426. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc. In this example, the interface circuitry 2420 implements the user interface circuitry 1902, the sensor interface circuitry 1904, the pump interface circuitry 1906, and the valve interface circuitry 1908.

The programmable circuitry platform 2400 of the illustrated example also includes one or more mass storage discs or devices 2428 to store firmware, software, and/or data. Examples of such mass storage discs or devices 2428 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 2432, which may be implemented by the machine readable instructions of FIGS. 20-23, may be stored in the mass storage device 2428, in the volatile memory 2414, in the non-volatile memory 2416, and/or on at least one non-transitory computer readable storage medium such as a CD or DVD which may be removable.

Figure 25:
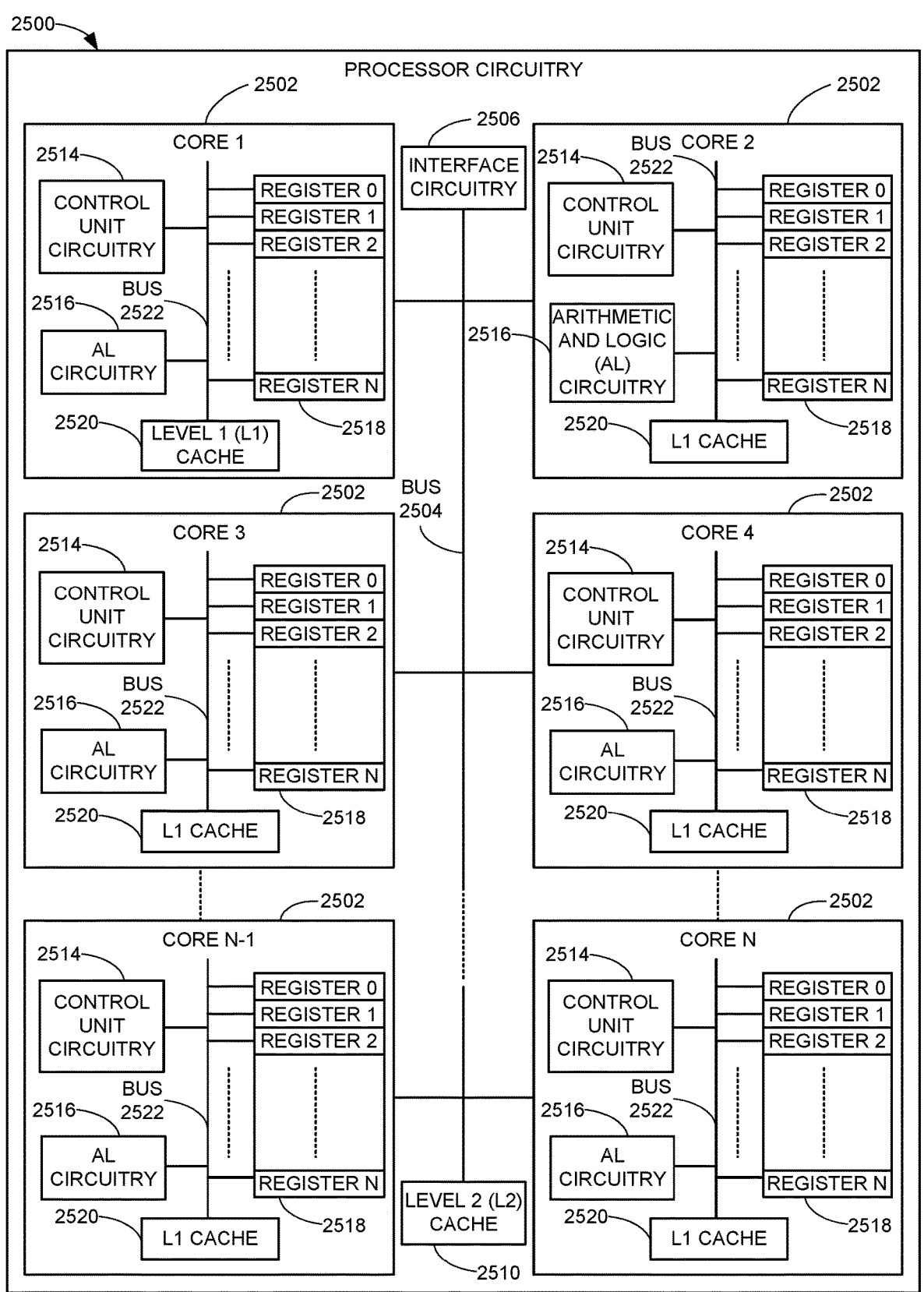
FIG. 25 is a block diagram of an example implementation of the processor circuitry of FIG. 24.

FIG. 25 is a block diagram of an example implementation of the programmable circuitry 2412 of FIG. 24. In this example, the programmable circuitry 2412 of FIG. 24 is implemented by a microprocessor 2500. For example, the microprocessor 2500 may be a general-purpose microprocessor (e.g., general-purpose microprocessor circuitry). The microprocessor 2500 executes some or all of the machine-readable instructions of the flowcharts of FIGS. 20-23 to effectively instantiate the circuitry of FIG. 19 as logic circuits to perform operations corresponding to those machine readable instructions. In some such examples, the circuitry of FIG. 19 is instantiated by the hardware circuits of the microprocessor 2500 in combination with the machine-readable instructions. For example, the microprocessor 2500 may be implemented by multi-core hardware circuitry such as a CPU, a DSP, a GPU, an XPU, etc. Although it may include any number of example cores 2502 (e.g., 1 core), the microprocessor 2500 of this example is a multi-core semiconductor device including N cores. The cores 2502 of the microprocessor 2500 may operate independently or may cooperate to execute machine readable instructions. For example, machine code corresponding to a firmware program, an embedded software program, or a software program may be executed by one of the cores 2502 or may be executed by multiple ones of the cores 2502 at the same or different times. In some examples, the machine code corresponding to the firmware program, the embedded software program, or the software program is split into threads and executed in parallel by two or more of the cores 2502. The software program may correspond to a portion or all of the machine readable instructions and/or operations represented by the flowcharts of FIGS. 20-23.

The cores 2502 may communicate by a first example bus 2504. In some examples, the first bus 2504 may be implemented by a communication bus to effectuate communication associated with one(s) of the cores 2502. For example, the first bus 2504 may be implemented by at least one of an Inter-Integrated Circuit (I2C) bus, a Serial Peripheral Interface (SPI) bus, a PCI bus, or a PCIe bus. Additionally or alternatively, the first bus 2504 may be implemented by any other type of computing or electrical bus. The cores 2502 may obtain data, instructions, and/or signals from one or more external devices by example interface circuitry 2506. The cores 2502 may output data, instructions, and/or signals to the one or more external devices by the interface circuitry 2506. Although the cores 2502 of this example include example local memory 2520 (e.g., Level 1 (L1) cache that may be split into an L1 data cache and an L1 instruction cache), the microprocessor 2500 also includes example shared memory 2510 that may be shared by the cores (e.g., Level 2 (L2 cache)) for high-speed access to data and/or instructions. Data and/or instructions may be transferred (e.g., shared) by writing to and/or reading from the shared memory 2510. The local memory 2520 of each of the cores 2502 and the shared memory 2510 may be part of a hierarchy of storage devices including multiple levels of cache memory and the main memory (e.g., the main memory 2414, 2416 of FIG. 24). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 2502 may be referred to as a CPU, DSP, GPU, etc., or any other type of hardware circuitry. Each core 2502 includes control unit circuitry 2514, arithmetic and logic (AL) circuitry (sometimes referred to as an ALU) 2516, a plurality of registers 2518, the local memory 2520, and a second example bus 2522. Other structures may be present. For example, each core 2502 may include vector unit circuitry, single instruction multiple data (SIMD) unit circuitry, load/store unit (LSU) circuitry, branch/jump unit circuitry, floating-point unit (FPU) circuitry, etc. The control unit circuitry 2514 includes semiconductor-based circuits structured to control (e.g., coordinate) data movement within the corresponding core 2502. The AL circuitry 2516 includes semiconductor-based circuits structured to perform one or more mathematic and/or logic operations on the data within the corresponding core 2502. The AL circuitry 2516 of some examples performs integer based operations. In other examples, the AL circuitry 2516 also performs floating-point operations. In yet other examples, the AL circuitry 2516 may include first AL circuitry that performs integer-based operations and second AL circuitry that performs floating-point operations. In some examples, the AL circuitry 2516 may be referred to as an Arithmetic Logic Unit (ALU).

The registers 2518 are semiconductor-based structures to store data and/or instructions such as results of one or more of the operations performed by the AL circuitry 2516 of the corresponding core 2502. For example, the registers 2518 may include vector register(s), SIMD register(s), general-purpose register(s), flag register(s), segment register(s), machine-specific register(s), instruction pointer register(s), control register(s), debug register(s), memory management register(s), machine check register(s), etc. The registers 2518 may be arranged in a bank as shown in FIG. 25. Alternatively, the registers 2518 may be organized in any other arrangement, format, or structure, such as by being distributed throughout the core 2502 to shorten access time. The second bus 2522 may be implemented by at least one of an I2C bus, a SPI bus, a PCI bus, or a PCIe bus.

Each core 2502 and/or, more generally, the microprocessor 2500 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 2500 is a semiconductor device fabricated to include many transistors interconnected to implement the structures described above in one or more integrated circuits (ICs) contained in one or more packages.

The microprocessor 2500 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those discussed herein. A GPU, DSP and/or other programmable device can also be an accelerator. Accelerators may be on-board the microprocessor 2500, in the same chip package as the microprocessor 2500 and/or in one or more separate packages from the microprocessor 2500.

Figure 26:
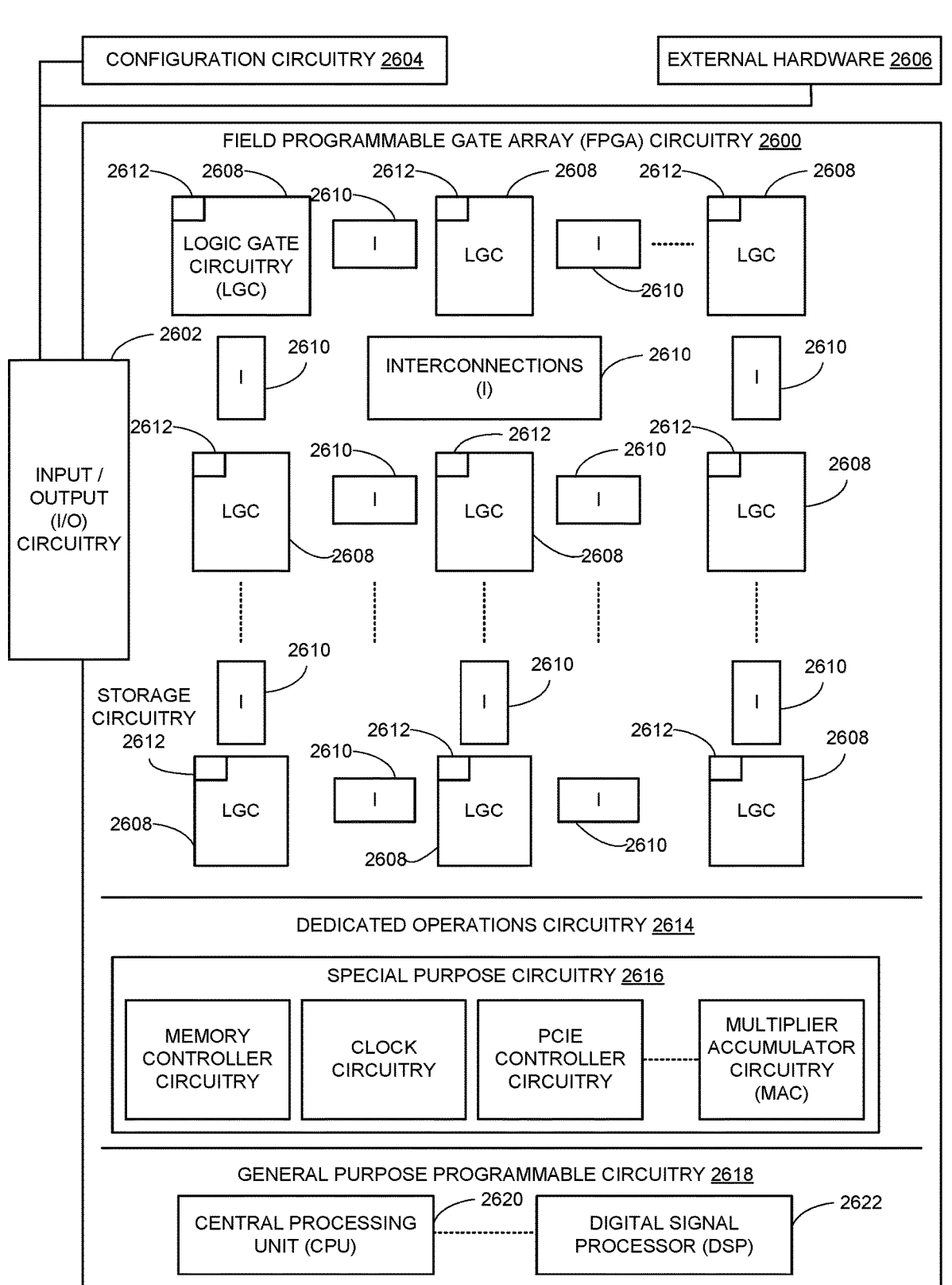
FIG. 26 is a block diagram of another example implementation of the processor circuitry of FIG. 24.

FIG. 26 is a block diagram of another example implementation of the programmable circuitry 2412 of FIG. 24. In this example, the programmable circuitry 2412 is implemented by FPGA circuitry 2600. For example, the FPGA circuitry 2600 may be implemented by an FPGA. The FPGA circuitry 2600 can be used, for example, to perform operations that could otherwise be performed by the example microprocessor 2500 of FIG. 25 executing corresponding machine readable instructions. However, once configured, the FPGA circuitry 2600 instantiates the operations and/or functions corresponding to the machine readable instructions in hardware and, thus, can often execute the operations/functions faster than they could be performed by a general-purpose microprocessor executing the corresponding software.

More specifically, in contrast to the microprocessor 2500 of FIG. 25 described above (which is a general purpose device that may be programmed to execute some or all of the machine readable instructions represented by the flowchart(s) of FIGS. 20-23 but whose interconnections and logic circuitry are fixed once fabricated), the FPGA circuitry 2600 of the example of FIG. 26 includes interconnections and logic circuitry that may be configured, structured, programmed, and/or interconnected in different ways after fabrication to instantiate, for example, some or all of the operations/functions corresponding to the machine readable instructions represented by the flowchart(s) of FIGS. 20-23. In particular, the FPGA circuitry 2600 may be thought of as an array of logic gates, interconnections, and switches. The switches can be programmed to change how the logic gates are interconnected by the interconnections, effectively forming one or more dedicated logic circuits (unless and until the FPGA circuitry 2600 is reprogrammed). The configured logic circuits enable the logic gates to cooperate in different ways to perform different operations on data received by input circuitry. Those operations may correspond to some or all of the instructions (e.g., the software and/or firmware) represented by the flowchart(s) of FIGS. 20-23. As such, the FPGA circuitry 2600 may be configured and/or structured to effectively instantiate some or all of the operations/functions corresponding to the machine readable instructions of the flowchart(s) of FIGS. 20-23 as dedicated logic circuits to perform the operations/functions corresponding to those software instructions in a dedicated manner analogous to an ASIC. Therefore, the FPGA circuitry 2600 may perform the operations/functions corresponding to the some or all of the machine readable instructions of FIGS. 20-23 faster than the general-purpose microprocessor can execute the same.

In the example of FIG. 26, the FPGA circuitry 2600 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 2600 of FIG. 26 may access and/or load the binary file to cause the FPGA circuitry 2600 of FIG. 26 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 2600 of FIG. 26 to cause configuration and/or structuring of the FPGA circuitry 2600 of FIG. 26, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 2600 of FIG. 26 may access and/or load the binary file to cause the FPGA circuitry 2600 of FIG. 26 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 2600 of FIG. 26 to cause configuration and/or structuring of the FPGA circuitry 2600 of FIG. 26, or portion(s) thereof.

The FPGA circuitry 2600 of FIG. 26, includes example input/output (I/O) circuitry 2602 to obtain and/or output data to/from example configuration circuitry 2604 and/or external hardware 2606. For example, the configuration circuitry 2604 may be implemented by interface circuitry that may obtain a binary file, which may be implemented by a bit stream, data, and/or machine-readable instructions, to configure the FPGA circuitry 2600, or portion(s) thereof. In some such examples, the configuration circuitry 2604 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 2606 may be implemented by external hardware circuitry. For example, the external hardware 2606 may be implemented by the microprocessor 2500 of FIG. 25.

The FPGA circuitry 2600 also includes an array of example logic gate circuitry 2608, a plurality of example configurable interconnections 2610, and example storage circuitry 2612. The logic gate circuitry 2608 and the configurable interconnections 2610 are configurable to instantiate one or more operations/functions that may correspond to at least some of the machine readable instructions of FIGS. 20-23 and/or other desired operations. The logic gate circuitry 2608 shown in FIG. 26 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 2608 to enable configuration of the electrical structures and/or the logic gates to form circuits to perform desired operations/functions. The logic gate circuitry 2608 may include other electrical structures such as look-up tables (LUTs), registers (e.g., flip-flops or latches), multiplexers, etc.

The configurable interconnections 2610 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 2608 to program desired logic circuits.

The storage circuitry 2612 of the illustrated example is structured to store result(s) of the one or more of the operations performed by corresponding logic gates. The storage circuitry 2612 may be implemented by registers or the like. In the illustrated example, the storage circuitry 2612 is distributed amongst the logic gate circuitry 2608 to facilitate access and increase execution speed.

The example FPGA circuitry 2600 of FIG. 26 also includes example dedicated operations circuitry 2614. In this example, the dedicated operations circuitry 2614 includes special purpose circuitry 2616 that may be invoked to implement commonly used functions to avoid the need to program those functions in the field. Examples of such special purpose circuitry 2616 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 2600 may also include example general purpose programmable circuitry 2618 such as an example CPU 2620 and/or an example DSP 2622. Other general purpose programmable circuitry 2618 may additionally or alternatively be present such as a GPU, an XPU, etc., that can be programmed to perform other operations.

Although FIGS. 25 and 26 illustrate two example implementations of the programmable circuitry 2412 of FIG. 24, many other approaches are contemplated. For example, FPGA circuitry may include an on-board CPU, such as one or more of the example CPU 2620 of FIG. 25. Therefore, the programmable circuitry 2412 of FIG. 24 may additionally be implemented by combining at least the example microprocessor 2500 of FIG. 25 and the example FPGA circuitry 2600 of FIG. 26. In some such hybrid examples, one or more cores 2502 of FIG. 25 may execute a first portion of the machine readable instructions represented by the flowchart(s) of FIGS. 20-23 to perform first operation(s)/function(s), the FPGA circuitry 2600 of FIG. 26 may be configured and/or structured to perform second operation(s)/function(s) corresponding to a second portion of the machine readable instructions represented by the flowcharts of FIGS. 21-23, and/or an ASIC may be configured and/or structured to perform third operation(s)/function(s) corresponding to a third portion of the machine readable instructions represented by the flowcharts of FIGS. 20-23.

It should be understood that some or all of the circuitry of FIG. 19 may, thus, be instantiated at the same or different times. For example, same and/or different portion(s) of the microprocessor 2500 of FIG. 25 may be programmed to execute portion(s) of machine-readable instructions at the same and/or different times. In some examples, same and/or different portion(s) of the FPGA circuitry 2600 of FIG. 26 may be configured and/or structured to perform operations/functions corresponding to portion(s) of machine-readable instructions at the same and/or different times.

In some examples, some or all of the circuitry of FIG. 19 may be instantiated, for example, in one or more threads executing concurrently and/or in series. For example, the microprocessor 2500 of FIG. 25 may execute machine readable instructions in one or more threads executing concurrently and/or in series. In some examples, the FPGA circuitry 2600 of FIG. 26 may be configured and/or structured to carry out operations/functions concurrently and/or in series. Moreover, in some examples, some or all of the circuitry of FIG. 19 may be implemented within one or more virtual machines and/or containers executing on the microprocessor 2500 of FIG. 25.

In some examples, the programmable circuitry 2412 of FIG. 24 may be in one or more packages. For example, the microprocessor 2500 of FIG. 25 and/or the FPGA circuitry

2600 of FIG. 26 may be in one or more packages. In some examples, an XPU may be implemented by the programmable circuitry 2412 of FIG. 24, which may be in one or more packages. For example, the XPU may include a CPU (e.g., the microprocessor 2500 of FIG. 25, the CPU 2620 of FIG. 26, etc.) in one package, a DSP (e.g., the DSP 2622 of FIG. 26) in another package, a GPU in yet another package, and an FPGA (e.g., the FPGA circuitry 2600 of FIG. 26) in still yet another package.

Figure 27:
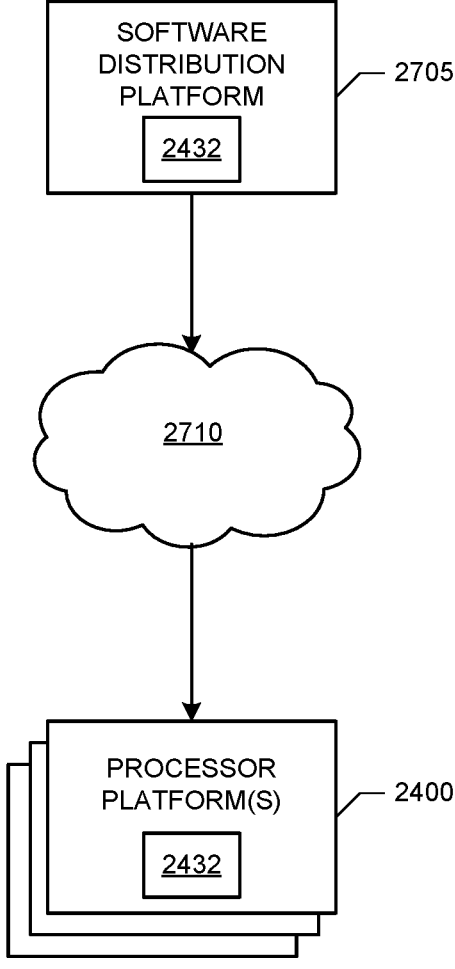
FIG. 27 is a block diagram of an example software distribution platform (e.g., one or more servers) to distribute software (e.g., software corresponding to the example machine readable instructions of FIGS. 20-23) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 2705 to distribute software such as the example machine readable instructions 2432 of FIG. 24 to other hardware devices (e.g., hardware devices owned and/or operated by third parties from the owner and/or operator of the software distribution platform) is illustrated in FIG. 27. The example software distribution platform 2705 may be implemented by any computer server, data facility, cloud service, etc., capable of storing and transmitting software to other computing devices. The third parties may be customers of the entity owning and/or operating the software distribution platform 2705. For example, the entity that owns and/or operates the software distribution platform 2705 may be a developer, a seller, and/or a licensor of software such as the example machine readable instructions 2432 of FIG. 24. The third parties may be consumers, users, retailers, OEMs, etc., who purchase and/or license the software for use and/or re-sale and/or sub-licensing. In the illustrated example, the software distribution platform 2705 includes one or more servers and one or more storage devices. The storage devices store the machine readable instructions 2432, which may correspond to the example machine readable instructions of FIGS. 20-23, as described above. The one or more servers of the example software distribution platform 2705 are in communication with an example network 2710, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 2432 from the software distribution platform 2705. For example, the software, which may correspond to the example machine readable instructions of FIG. 21-23, may be downloaded to the example programmable circuitry platform 2400, which is to execute the machine readable instructions 2432 to implement the CDU controller 1794. In some examples, one or more servers of the software distribution platform 2705 periodically offer, transmit, and/or force updates to the software (e.g., the example machine readable instructions 2432 of FIG. 24) to ensure improvements, patches, updates, etc., are distributed and applied to the software at the end user devices. Although referred to as software above, the distributed "software" could alternatively be firmware.

Figure 28:
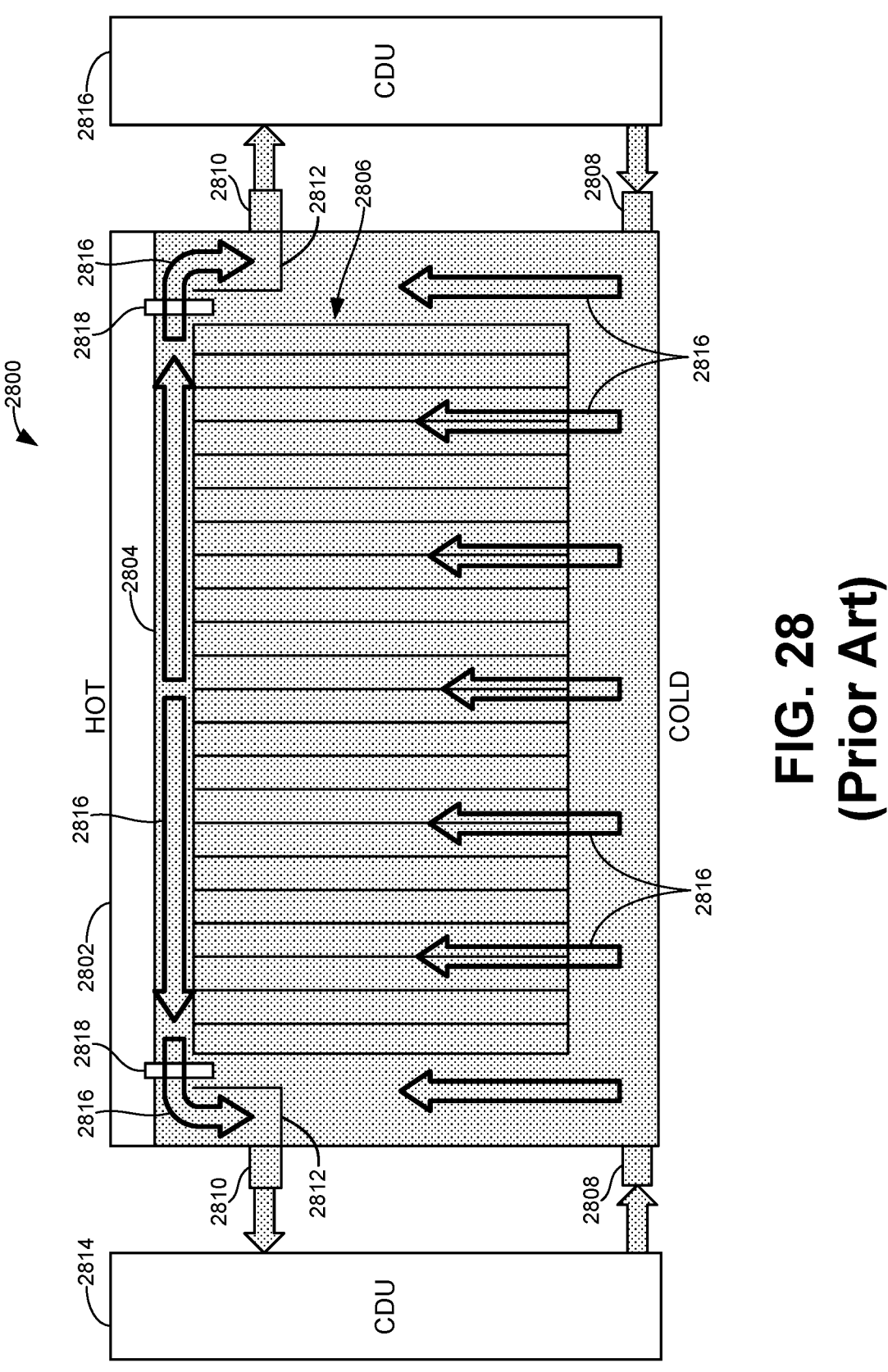
FIG. 28 illustrates a known immersion cooling system.

FIG. 28 illustrates a known immersion cooling system 2800 that includes an immersion tank 2802 to hold a coolant 2804 (e.g., a dielectric liquid) in which one or more electronic components are immersed. The electronic components include servers and will be referred to as servers 2806 in connection with FIG. 28 with the understanding that other electronic components could additionally or alternatively be immersed in the immersion tank 2802. Similarly, the electronic components will be referred to as servers in connection with other immersion tanks disclosed herein for illustrative purposes. The coolant 2804 can be any suitable dielectric coolant (e.g., FC40). As shown in FIG. 28, the coolant 2804 is introduced at a relatively cold temperature via coolant supply inlets 2808 located near the bottom of the tank 2802 (according to the direction of gravity when the tank 2802 is orientated as shown in FIG. 28). As a result, the general flow of the coolant 2804 is in an upward direction from the bottom of the tank 2802. Further, as the coolant 2804 comes into contact with the servers 2806, the coolant 2804 heats up as it draws heat from the servers 2806, thereby maintaining the servers 2806 at suitable operating temperatures. As the coolant 2804 heats up, the coolant 2804 expands (e.g., becomes less dense) and rises to the top of the tank 2802. Thus, as labelled in FIG. 28, the top of the tank 2802 is associated with relatively high (e.g., hot) temperatures of the coolant 2804 and the bottom of the tank 2802 is associated with relatively low (e.g., cold) temperatures for the coolant 2804. As the hot coolant 2804 reaches the upper surface of the coolant 2804, the coolant 2804 flows laterally along a length of the tank 2802 due to natural convection and due to the fact that the coolant 2804 is being sucked out of the tank 2802 through outlets 2810 at laterals sides or ends of the tank 2802. More particularly, as shown in FIG. 28, the outlets 2810 are located near the top of the tank 2802 (according to the direction of gravity when the tank 2802 is orientated as shown in FIG. 28) and fluidly coupled to overflow chambers 2812 through which the coolant 2804 must pass to reach the outlets 2810.

As represented in FIG. 28, the coolant 2804 is drawn out of the tank 2802 via the outlets 2810 by corresponding coolant distribution units (CDU) 2814. The CDUs 2814 implement one or more heat exchangers to draw out heat from the coolant 2804 (via the outlets 2810) and then, once the coolant 2804 has been cooled, return the coolant 2804 back to the tank 2802 (via the supply inlets 2808). Typically, each pair of inlets and outlets is associated with a separate CDU 2814. Thus, in FIG. 28, there are two CDUs 2814 corresponding to the two separate supply inlets 2808 and outlets 2810.

The general fluid flow of the coolant 2804 within the tank 2802 is represented by the arrows 2816. As described above, the flow field generally moves from the bottom of the tank 2802 to the top of the tank 2802 and then laterally towards (e.g., and then down through, etc.) the overflow chambers 2812 and out through the outlets 2810. However, as represented in FIG. 28, the flow field within a main cavity of the tank 2802 is often not uniform because the upward flow is typically greater near the supply inlets 2808 (e.g., where the coolant 2804 is pumped into the tank 2802, etc.) than it is farther away from the supply inlets 2808. Thus, the arrow 2816 in the middle of the upward moving flow field (e.g., farthest away from both of the supply inlets 2808, etc.) is smaller than the other arrows (e.g., closer to the supply inlets 2808, etc.). Non-uniformity in the flow field can lead to non-uniformity in the temperature of the coolant 2804 across the tank 2802 thereby reducing the heat transfer efficiency of the coolant 2804 for certain ones of the servers 2806 relative to other ones of the servers 2806. The reduced heat transfer is exacerbated by the properties of the coolant 2804, which typically has a relatively high viscosity and relatively high density.

Non-uniformity of the coolant flow field becomes a greater problem for larger sized tanks 2802 (capable of holding and cooling more servers 2806) because there are greater distances between the inlets 2808 and the rest of the tank 2802. In some instances, to reduce this distance, two CDUs 2814 are used at opposite ends of the tank 2802 (as shown in FIG. 28). However, this solution has the disadvantage of requiring more space than a single CDU 2814 and also increases costs to implement and maintain the cooling system 2800. Moreover, in the event that one of the two CDUs 2814 fails, becomes inoperable, or otherwise stops working (e.g., due to maintenance), the uniformity of the flow field for the overall system can dramatically change relative to when both CDUs 2814 are operating, thereby degrading cooling performance and give rise to reliability concerns.

In addition to the non-uniform flow field created by the coolant be introduced into the tank 2802 via the inlets 2808 at one or both ends of the tank 2802, additional problems undermining the efficiency of the system 2800 can arise from the operation and position of the outlets 2810. For instance, when the cooling capacity is relatively high, such that a relatively high flow rate of the coolant 2804 into and out of the tank 2802, relatively strong vortex effects can occur near the outlets 2810 due the suction of the coolant 2804 out of the tank 2802. Such vortex effects can cause the liquid level in the tank 2802 to appear to drop as detected by a level sensor 2818 located proximate to the outlets 2810 to trigger an alarm. However, such an alarm is often a false positive because the fluid level has not actually dropped within the tank but only appears to have dropped at a localized region near the outlet due to the formation of a vortex or eddy. Further, the location of the outlets 2810 at one or both ends of the tank 2802 results in longer heat dissipation paths for the coolant 2804 in regions of the tank farther away from the outlet 2810 that regions proximate the outlets 2810. The longer dissipation paths can cause the coolant 2804 to circulate more slowly thereby reducing the heat transfer efficiency of the system. Examples disclosed herein overcome at least some of the above problems faced by known systems to increase flow field uniformity while also reducing costs and the space required for a cooling system by only needing a single CDU.

Figure 29:
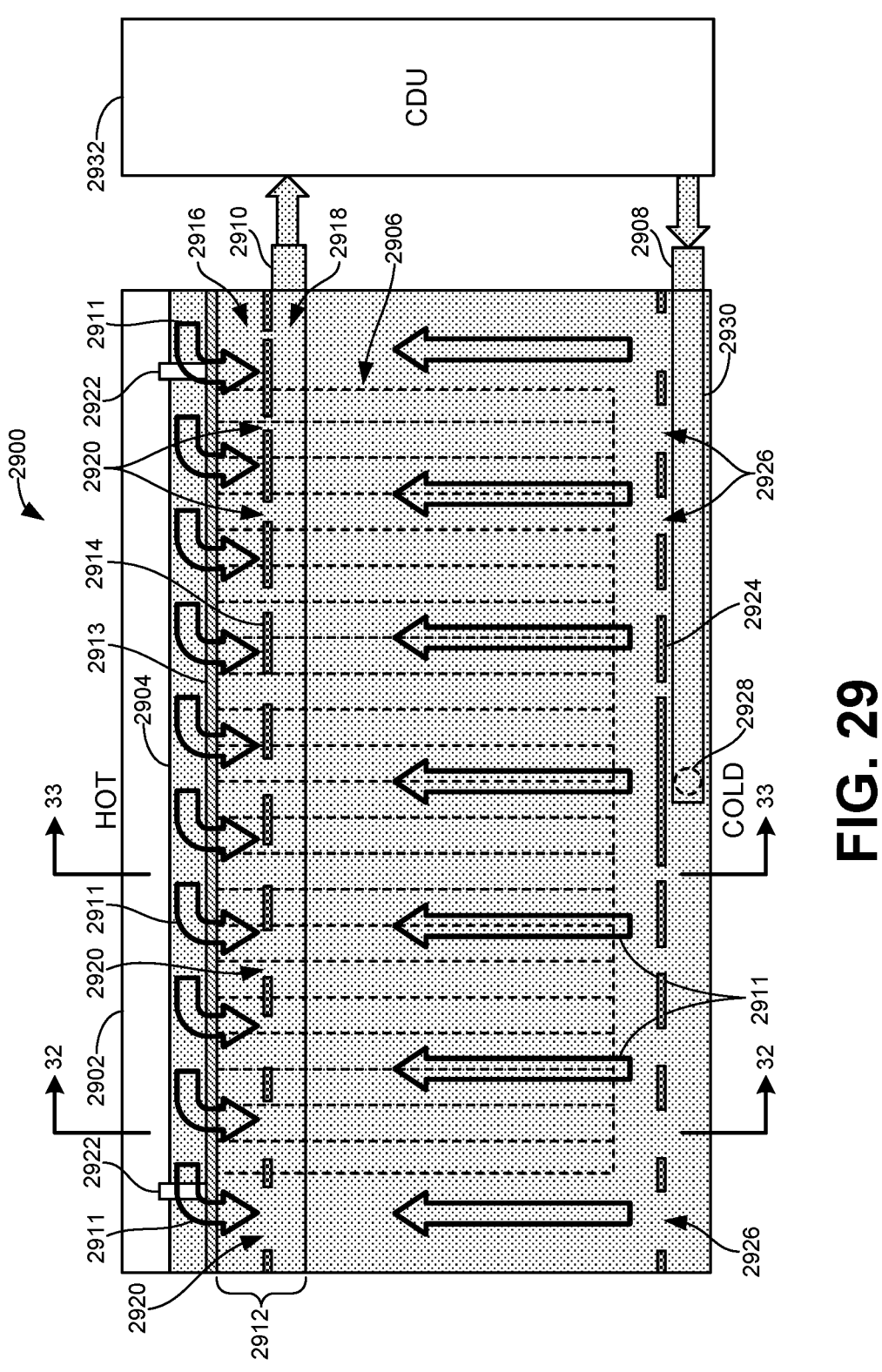
FIGS. 29-33 illustrate different views of an example immersion cooling system constructed in accordance with teachings disclosed herein.
Figure 30:
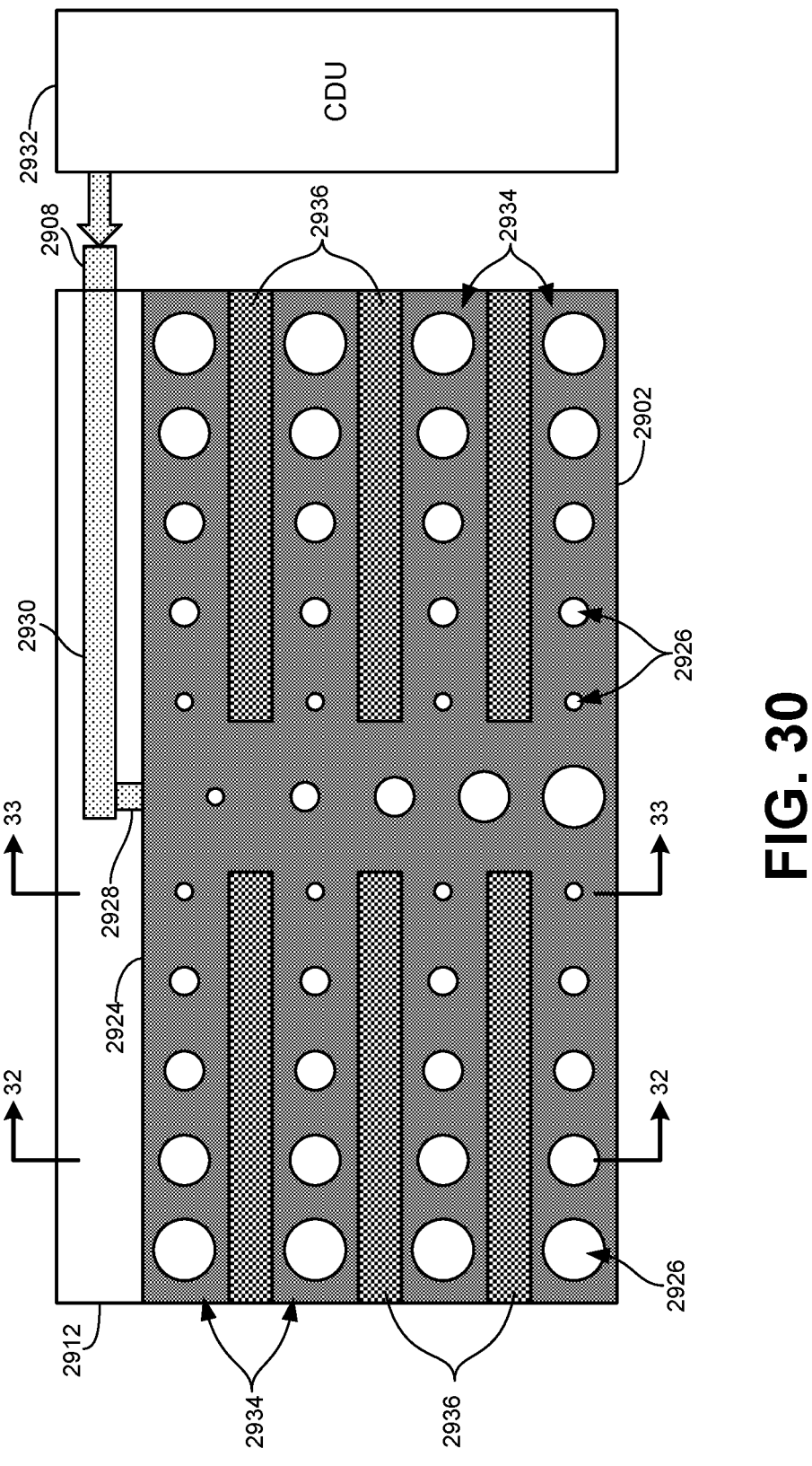
Figure 31:
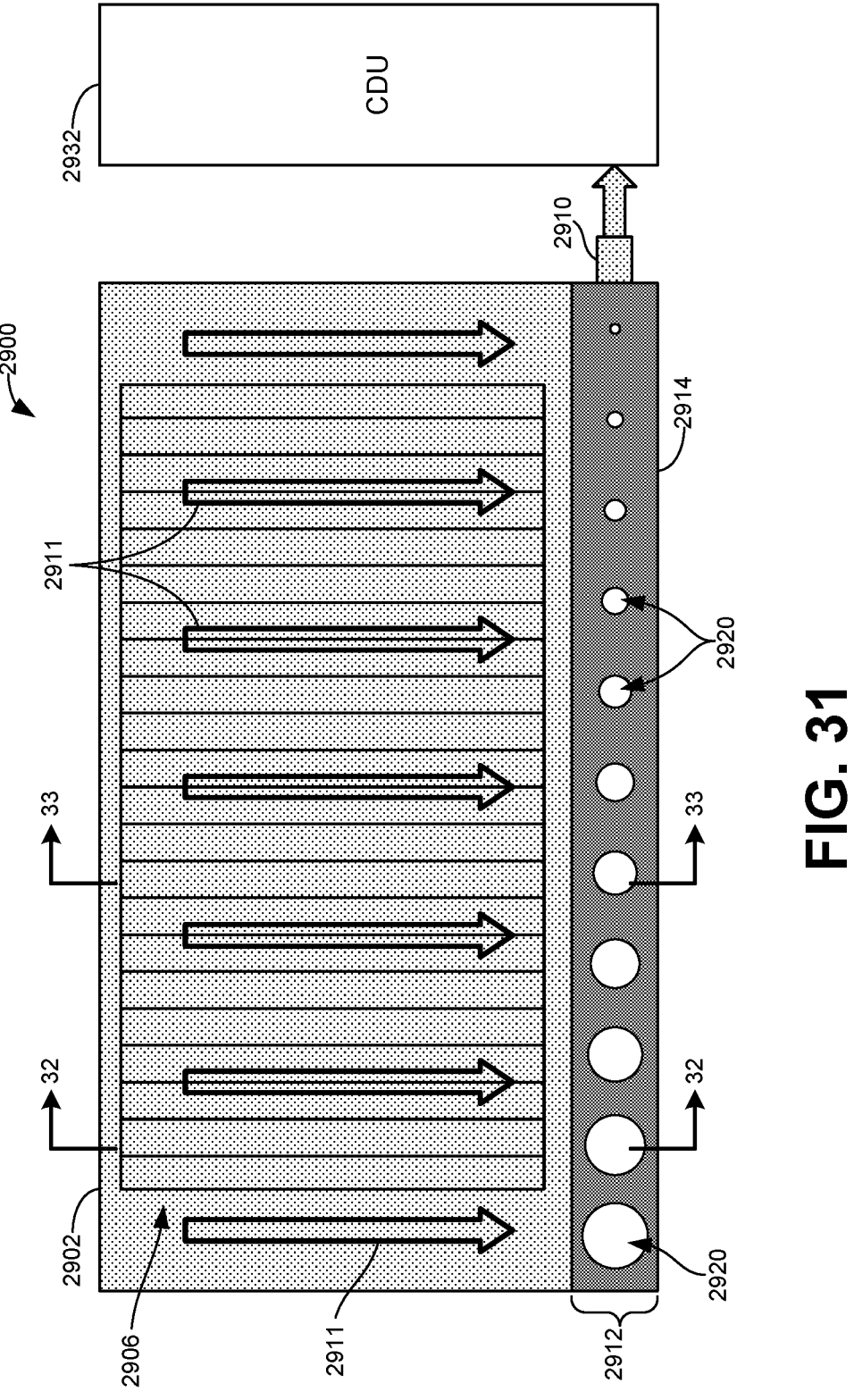
Figures 32, 33:
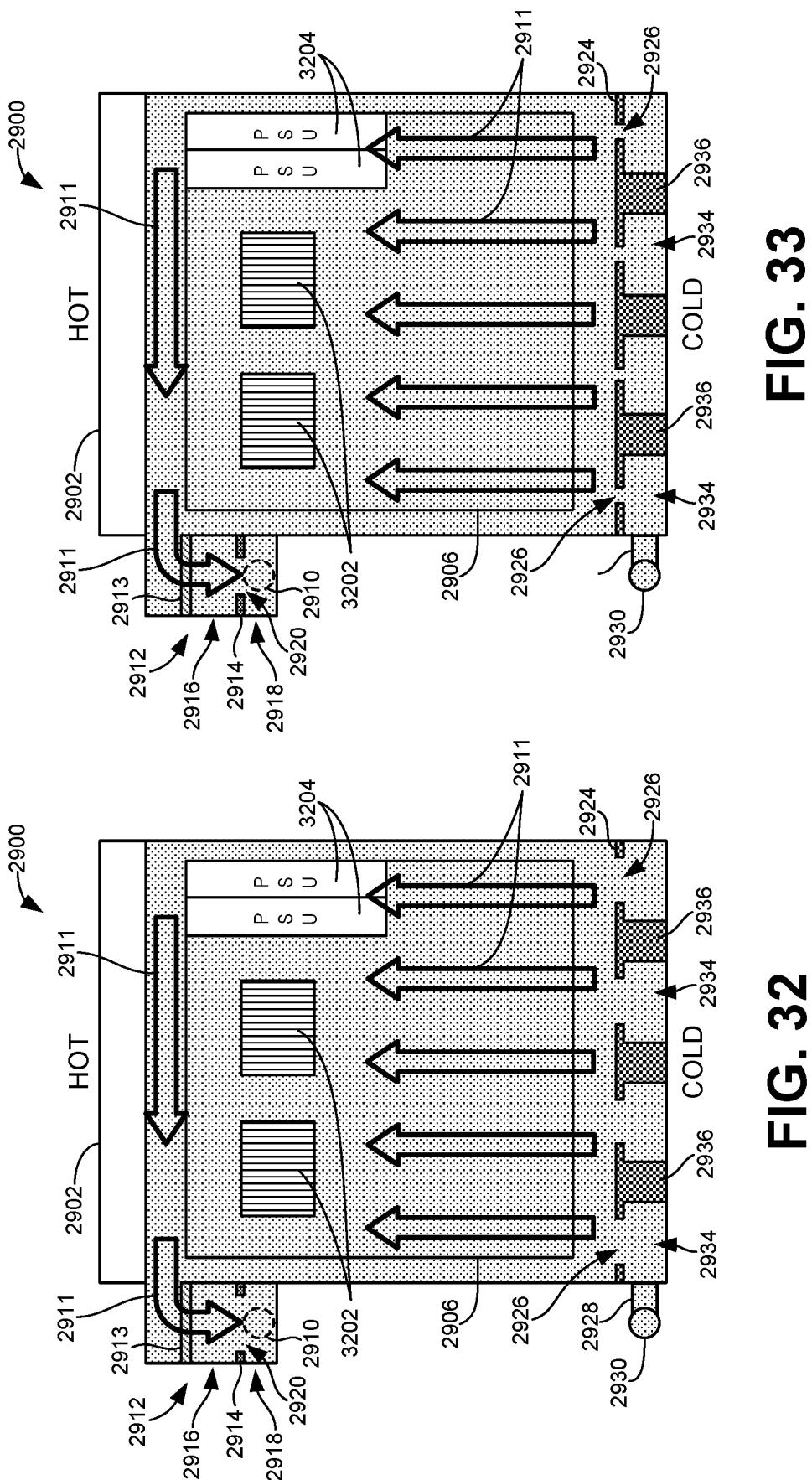

FIGS. 29, 30, 31, 32, and 33 illustrate different views of an example immersion cooling system 2900 constructed in accordance with teachings disclosed herein. More particularly, FIG. 29 is a rear or backside view of the immersion cooling system 2900, FIG. 30 is a bottom view of the immersion cooling system 2900, FIG. 31 is a top view of the immersion cooling system 2900, and FIGS. 32 and 33 are side views of the immersion cooling system 2900 at different points of cross-section. Specifically, FIG. 32 is a cross-sectional view taken along line 32-32 shown in each of FIGS. 29-31 and FIG. 33 is a cross-sectional view taken along line 33-33 shown in each of FIGS. 29-31. The example immersion cooling system 2900 of FIGS. 29-33 may be implemented in any of the example data centers 102, 106, 116, 200 and/or building(s) 110 of FIGS. 1 and/or 2. The immersion cooling system 2900 of FIGS. 29-33 can be used in conjunction with the CDU 1708 of FIGS. 17 and 18 and the operations 2000, 2100, 2200, 2300 of FIGS. 20-23, respectively.

The example immersion cooling system 2900 includes a tank 2902 (e.g., an immersion cooling tank, etc.) to hold a coolant 2904 (e.g., a dielectric liquid) in which one or more electronic components are immersed. The electronic components include servers and will be referred to as servers 2906 in connection with FIG. 29 with the understanding that other electronic components could additionally or alternatively be immersed in the tank 2902. Similarly, the electronic components will be referred to as servers in connection with other immersion tanks disclosed herein for illustrative purposes. Particular ones of the servers 2906 are shown in each of FIGS. 32 and 33 with different power supply units 3202 and heatsinks 3204 carried thereon. In this example, the coolant 2904 is FC40. However, any other suitable dielectric coolant may be used. As shown in FIG. 29, the coolant 2904 is introduced at a relatively cold temperature via a single coolant supply inlet 2908 located near the bottom of the tank 2902 (according to the direction of gravity when the tank 2902 is orientated as shown in FIG. 29). Further, after drawing heat from the servers 2906, the coolant 2904 is sucked out of the tank 2902 through an outlet 2910 near the top of the tank 2902 (according to the direction of gravity when the tank 2902 is orientated as shown in FIG. 29). As a result, the general flow of the coolant 2904 (represented by arrows 2911 in FIG. 29) is in an upward direction from the bottom of the tank 2902 with cooler coolant 2904 near the bottom and hotter coolant 2904 near the top of the tank 2902. Thus, as labelled in the illustrated example, the top of the tank 2902 is associated with relatively high (e.g., hot) temperatures of the coolant 2904 and the bottom of the tank 2902 is associated with relatively low (e.g., cold) temperatures for the coolant 2904.

In some examples, multiple servers 2906 are arranged along the length of tank 2902 (in a horizontal direction) with each server 2906 being vertically oriented so that, as the coolant 2904 rises, the coolant 2904 passes between adjacent ones of the servers 2906. However, unlike the cooling system 2800 of FIG. 28 in which the coolant 2904 flows laterally along the length of the tank 2802 towards the outlets 2810, the hot coolant 2904 near the top of the tank 2902 in FIGS. 29-33 flows laterally in a direction generally transverse to the length of the tank 2902 (represented most clearly by arrows 2911 in FIGS. 29, 31, 32 and 33). As used herein, the length of the tanks 2802, 2902 is defined as the distance between the opposite ends or sides of the tanks between which the servers 2806, 2906 are arranged in a row. That is, the servers 2806, 2906 are arranged in an array that is aligned with and extends along the length of the respective tanks 2802, 2902 (e.g., the length extends from the left side of the tank to the right side of the tank in FIG. 29). The difference in flow in the cooling system 2800 of FIG. 28 and the immersion cooling system 2900 of FIGS. 29-33 noted above is based on the immersion cooling system 2900 including an overflow chamber 2912 that extends along the length of the tank 2902, whereas the overflow chambers 2812 in FIG. 28 are located at the ends of the of the tank 2802 adjacent the outlets 2810. As shown most clearly by the arrows 2911 in FIG. 29, the overflow chamber 2912 extending the full length of enables the coolant 2904 to pass over the top lip of the overflow chamber 2912 at any point along the length of the tank. In some examples, the top of the overflow chamber 2912 is covered by a filter 2913 to filter the coolant 2904 as it passes into the chamber 2912. Such a filter serves to remove impurities from the coolant than can degrade the heat dissipation capacity of the coolant and that can damage a pump that is used to remove the coolant from the tank 2902 via the outlet 2910. In some examples the overflow chamber 2912 may extend most of the length of the tank 2902 but less than the full length.

While the coolant 2904 can enter the overflow chamber 2912 anywhere along the length of the overflow chamber 2912, as shown in the illustrated example, the coolant 2904 is still only being sucked out of the tank 2902 at one end of the overflow chamber 2912 where the outlet 2910 is located. Placement of the suction port at one end of the tank overflow chamber 2912 would give rise to the vortex effects described above and likely greater flow of the coolant 2904 near the outlet 2910 than the flow of the coolant 2904 farther away (e.g., near the opposite end of the tank 2902). To overcome these concerns, in this example, a first perforated plate 2914 (also referred to herein as a hot-side perforated plate) is positioned within the overflow chamber 2912 to divide an upper portion 2916 of the overflow chamber 2912 from a lower portion 2918 of the chamber along a full length of the overflow chamber 2912. In this example, the lower portion 2918 is an extension of the upper portion 2916 and has a generally rectangular cross-section. However, in other examples, the lower portion 2918 may be implemented as a pipe that is distinct from the upper portion 2916 but fluidly coupled thereto via multiple holes or openings corresponding to the openings 2920. In some such examples, the pipe can have a different cross-sectional shape than what is shown in the figures (e.g., a circular cross-section). In some examples, the perforated plate 2914 is composed of poly-tetrafluoroethylene (PTFE), Teflon, aluminum, and/or stainless steel.

As shown in the illustrated example, the outlet 2910 is fluidly coupled to the lower portion 2918 of the overflow chamber 2912. As a result, the coolant 2904 must pass through the first perforated plate 2914 within the overflow chamber 2912 to reach the outlet 2910. In some examples, the first perforated plate 2914 includes holes or openings 2920 along the length of the first perforated plate 2914 that differ in size relative to a distance from the outlet 2910. That is, the smallest openings 2920 are closest to the outlet 2910 while the largest openings 2920 are the farthest away. Each of the openings 2920 effectively becomes separate suction ports through which the coolant is drawn to distribute the force of suction along the length of the tank 2902 rather than being localized at one end. The different sizes of the openings 2920 restrict the flow of the coolant 2904 through the first perforated plate at locations closer to the outlet 2910 while permitting greater flow through the first perforated plate 2914 at locations farther away to offset the effects arising from the force of suction being greater near the outlet 2910 than the force of suction would be farther away. In particular, smaller holes provide more flow resistance or impedance to fluid flow while the larger holes provide less resistance or impedance. Thus, the first perforated plate 2914 within the overflow chamber 2912 serves to increase the uniformity of the flow field of the coolant at the top of the tank 2902 (e.g., more uniform suction) along the length of the tank 2902. Further, the more consistent flow of the coolant into the overflow chamber 2912 and out through the outlet 2910 also reduces vortex effects for faster heat dissipation and the resulting false positive alarms that may arise from sensors 2922 used to monitor the level of the coolant 2904 within the tank. Furthermore, the openings 2920 in the first perforated plate 2914 separate the initial point of suction (at the openings 2920) from the final point of suction (at the outlet 2910) where a pump is located to implement the pumping. This distance between the pump and the initial point of suction reduces the risk of damage to the pump from sucking in air that can occur when vortices are formed.

In some examples, a second perforated plate 2924 (also referred to herein as a cold-side perforated plate) is located near the bottom of the tank 2902 to help increase the uniformity of the flow of the coolant into the tank 2902 from the inlet 2908. More particularly, in some examples, this is accomplished by positioning holes or openings 2926 of different sizes within the second perforated plate 2924 to either restrict or permit flow of the coolant 2904 in a similar manner described above for the first perforated plate 2914 within the overflow chamber 2912. More particularly, smaller openings 2926 are positioned closer to an entry point 2928 of the coolant 2904 underneath the second perforated plate 2924 and larger openings 2926 are positioned farther away from the entry point. As shown in the illustrated example, the entry point 2928 for the coolant 2904 into the tank 2902 is spaced apart from the inlet 2908 by a coolant entry pipe 2930 extending therebetween. Use of the coolant entry pipe 2930 enables the coolant 2904 to be introduced near a midpoint of the tank 2902 (for faster distribution of the coolant needed for larger volume tanks) while the inlet 2908 remains at the side or end of the tank 2902 (for easy coupling to the CDU 2932 and to leave space behind the tank for cable routing and/or power distribution units (PDUs)). However, in other examples, the coolant entry pipe 2930 is omitted such that the entry point 2928 corresponds to the inlet 2908. Further, in this example, the coolant entry pipe 2930 extends along the rear side of the tank 2902 such that while the entry point 2928 is near the middle of the tank 2902 along the length of the tank 2902, the entry point is at the rear of the tank 2902. In other examples, the entry point is at the front of the tank 2902. In other examples, the coolant entry pipe 2930 may extend underneath the tank 2902 to position the entry point 2928 at a position midway between (or at any other suitable location) between the front and back sides of the tank 2902. In any of the above examples, the location and size of the openings 2926 in the perforated plate 2924 can be suitable adapted to increase the uniformity of the flow of the coolant into the main cavity of the tank 2902 past the servers 2906. In some examples, the perforated plate 2924 is composed of polytetrafluoroethylene (PTFE), Teflon, aluminum, and/or stainless steel.

In some examples, a similar pipe (e.g., a coolant exit pipe) may be fluidly coupled to the outlet 2910 to separate the exit point of the coolant 2904 from the overflow chamber 2912 and the outlet 2910. In some examples, such a coolant exit pipe is internal to the overflow chamber 2912. In other examples, such a coolant exit pipe may be external to the overflow chamber 2912. In some examples, the size and positioning of the openings 2920 in the perforated plate may be suitably adjusted from what is shown in the illustrated example.

In some examples, as shown in FIGS. 30, 32, and 33, different ones of the openings 2926 in the openings are arranged along channels 2934 defined by walls 2936 or protrusions extending from the second perforated plate 2924. In some examples, the walls 2936 are integrally formed with the perforated plate 2924. In other examples, the walls 2936 are separately forms and subsequently coupled to the perforated plate 2924. The walls 2936 define the channels 2934 to direct the flow of the coolant 2904 underneath the perforated plate toward the different sized openings 2926 in a manner that results in the coolant 2904 reaching the smaller openings 2926 before reaching larger openings. In this manner, the coolant passing through the openings 2926 can be controlled for greater uniformity upon entry into the main cavity of the tank 2902 above the second perforated plate 2924 where the servers 2906 are located. As a result, greater consistency and, thus, reliability and efficiency, of heat transfer from the servers 2906 to the coolant 2904 is made possible. The second perforated plate 2924 and the walls 2936 are collectively referred to herein as part of a uniform flow assembly. In some examples, the openings 2926 are arranged in lines extending transverse to the length of the tank 2902 so as to be aligned with the orientation of the servers 2906 within the tank 2902. Furthermore, in some examples, the openings 2926 are spaced apart at a pitch corresponding to the spacing between adjacent ones of the servers 2906.

Figure 34:
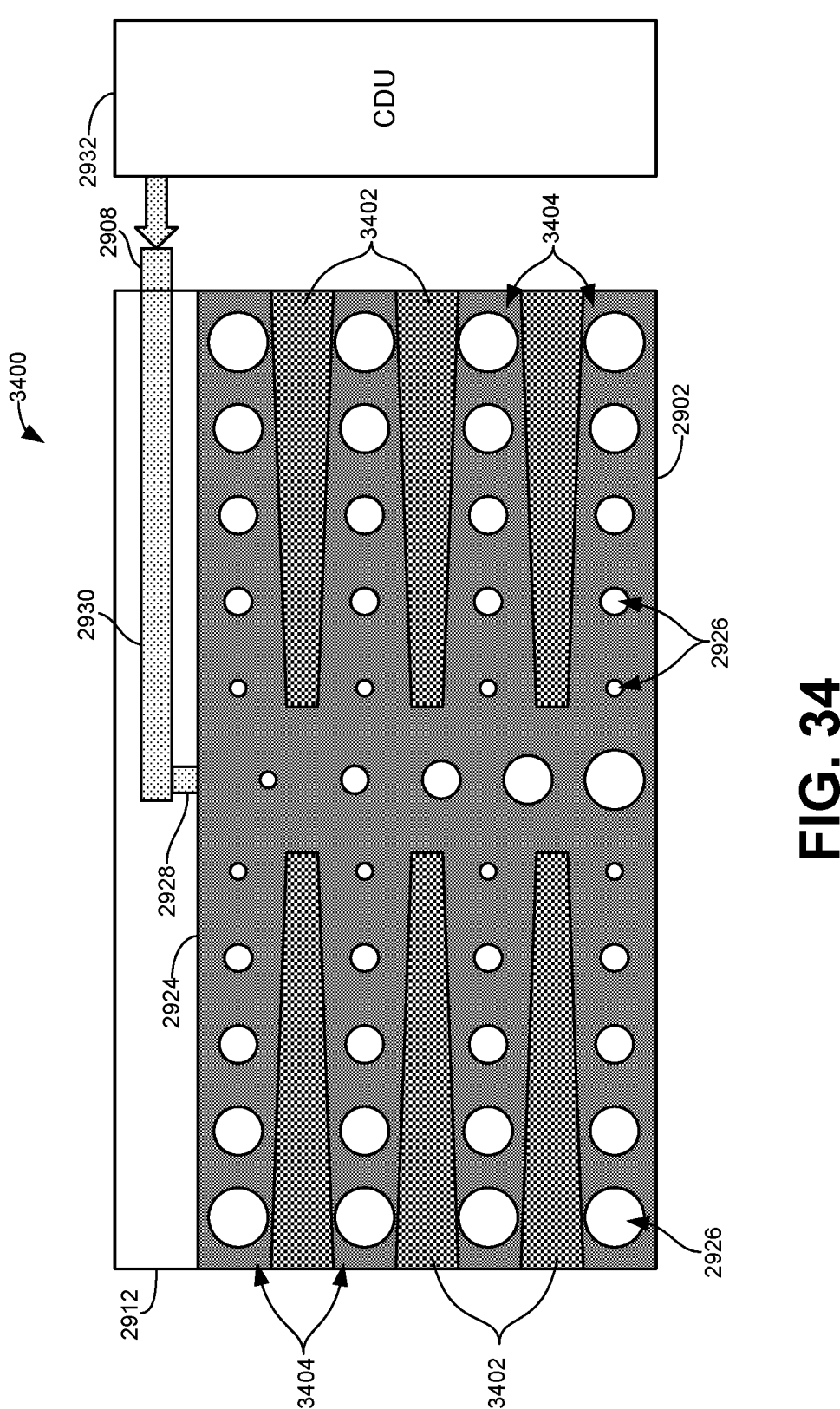
FIG. 34 illustrates another example immersion cooling system constructed in accordance with teachings disclosed herein.

FIG. 34 illustrates another example cooling system 3400 constructed in accordance with teachings disclosed herein. The example cooling system 3400 of FIG. 34 is substantially the same as the example cooling system of FIGS. 29-33 such that similar components are identified by similar reference numerals and the disclosure provided above for such components applies equal to the corresponding components in FIG. 34. The example cooling system 3400 of FIG. 34 differs from FIGS. 29-33 in that the openings 2926 in the cold-side perforated plate 2924 are separate by walls 3402 having different shapes than the walls 2936 shown in FIG. 30. In particular, whereas the walls 2936 of FIG. 29 have a straight profile, the walls 3402 in FIG. 34 are tapered. As a result, the walls 3402 in FIG. 34 define channels 3404 having a trapezoidal shape that narrows as the channel moves away from the entry point 2928 of the coolant. The trapezoidal shape of the channels 3404 can accelerate the coolant flow based on the principle that flow rate is equal to the cross-sectional area multiplies by the flow velocity. In some examples, the size, shape, and/or position of openings 2926 may be suitable adapted relative to what is shown in FIG. 30 based on the different flow characteristics of the coolant 2904 arising from the different shape of the channels 3404. The immersion cooling system 3400 of FIG. 34 can be used in conjunction with the CDU 1708 of FIGS. 17 and 18 and the operations 2000, 2100, 2200, 2300 of FIGS. 20-23, respectively.

Figure 35:
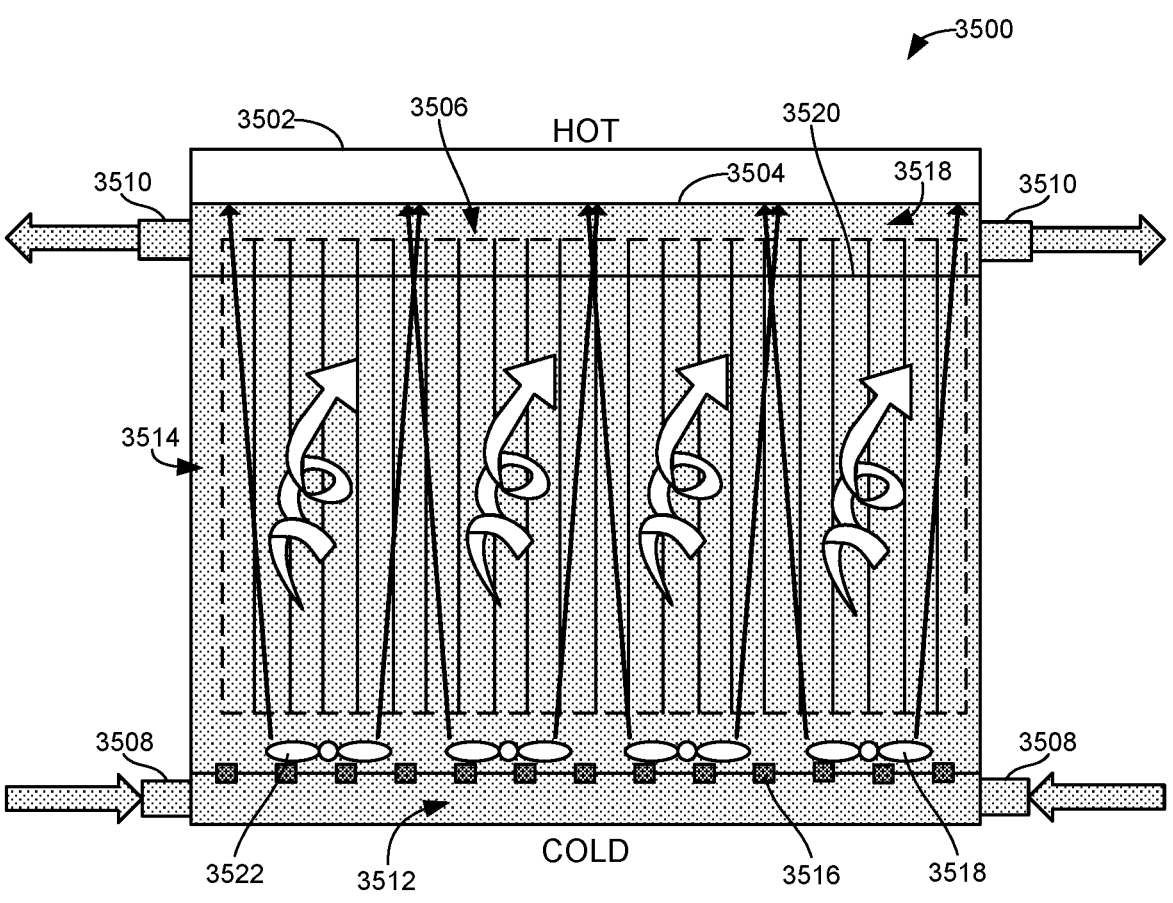
FIG. 35 illustrates an example immersion cooling system that may be implemented in any of the example data centers and/or building(s) of FIGS. 1 and/or 2.

FIG. 35 illustrates an example immersion cooling system 3500 that may be implemented in any of the example data centers 102, 106, 116, 200 and/or building(s) 110 of FIGS. 1 and/or 2, the immersion cooling system 2900 of FIGS. 29-33, and/or the CDU 1708 of FIGS. 17 and 18. The example immersion cooling system 3500 includes a tank 3502 (e.g., an immersion cooling tank, etc.) to hold a coolant 3504 in which one or more electronic components are immersed. In examples disclosed herein, the electronic components include servers and will be referred to as servers 3506 in connection with FIG. 35 with the understanding other electronic components could additionally or alternatively be immersed in the tank 3502. Similarly, the electronic components will be referred to as servers in connection with other immersion tanks disclosed herein for illustrative purposes. In this example, the coolant 3504 is FC40. However, any other suitable dielectric coolant may be used. In this example, the coolant 3504 is introduced at a relatively cold temperature via coolant supply inlets 3508 located near the bottom of the tank 3502 (according to the direction of gravity when the tank 3502 is orientated as shown in FIG. 35). As the coolant 3504 comes into contact with the servers 3506, the coolant 3504 heats up as it draws heat from the servers 3506, thereby maintaining the servers 3506 at suitable operating temperatures. As the coolant 3504 heats up, the coolant 3504 expands (e.g., becomes less dense) and rises to the top of the tank 3502 due to the thermal buoyancy effect where the coolant 3504 is drawn from the tank 3502 via outlets 3510 located near the top of the tank 3502 (according to the direction of gravity when the tank 3502 is orientated as shown in FIG. 35). Thus, as labelled in FIG. 35, the top of the tank 3502 is associated with relatively high (e.g., hot) temperatures of the coolant 3504 and the bottom of the tank 3502 is associated with relatively low (e.g., cold) temperatures for the coolant 3504.

In this example, there are two separate inlets (e.g., the inlets 3508, etc.) and two separate outlets (e.g., the outlets 3510, etc.) at each end (or side) of the tank 3502. In other examples, only one inlet 3508 and one outlet 3510 are used. In other examples, more than two inlets 3508 and more than two outlets 3510 are used. In some examples, the heated coolant 3504 at the top of the tank 3502 is removed from the tank 3502 (via the outlets 3510) and processed through a cooling system loop that includes one or more heat exchangers to draw out heat from the coolant 3504. Once the coolant 3504 has been cooled, the coolant 3504 is then reintroduced into the tank 3502 (via the inlets 3508) at the bottom of the tank 3502 to continue the cooling process.

In some examples, to produce a more uniform temperature field within the tank 3502, the coolant 3504 is introduced (via the inlets 3508) into a cold isolation area 3512 (e.g., also referred to as a "cold zone," etc.) of the tank 3502. The cold isolation area 3512 is separated from a main cavity 3514 of the tank 3502 where the servers 3506 are located by a perforated plate 3516. As its name implies, the perforated plate 3516 includes perforations or openings through which the coolant 3504 passes into the main cavity of the tank 3502. In some examples, the perforated plate 3516 is composed of polytetrafluoroethylene (PTFE), Teflon, aluminum, and/or stainless steel. The perforated plate 3516 serves to establish a more uniform temperature for the coolant across the bottom of the tank 3502 for more even (e.g., consistent) and controlled heat transfer as the coolant 3504 rises through the tank 3502 passed the servers 3506. More particularly, in some examples, the perforations or openings in the perforated plate 3516 are designed so that the impedance through the openings is higher near the inlets 3508 than the impedance through the openings away from the inlets 3508 (e.g., towards the middle when there are inlets 3508 on both sides of the tank 3502 or towards the distal end of the tank 3502 opposite a single tank inlet 3508). In some examples, the different impedance across different regions of the perforated plate 3516 is achieved with different sizes of openings in the perforated plate 3516 at the different regions (e.g., the holes increase in size as they get further away from the inlets 3508). In some examples, the perforated plate 3516 can be implemented by the perforated plate 2914 of FIG. 29 and/or the perforated plate 2924 of FIG. 29. Additionally or alternatively, in some examples, the different impedance is achieved by including a different amount of holes at different regions in the plate 3516 (e.g., fewer holes proximate the inlets 3508 with more holes at distances farther away). Providing different impedances across different regions of the perforated plate 3516 further facilitates uniformity in the flow field of the coolant 3504 into the main cavity 3514 of the tank 3502. In some examples, a hot isolation area (or hot zone) 3518 is separated from the main cavity of the tank 3502 by a baffle 3520 to facilitate the isolation of the heated coolant 3504 before it is drawn out through the outlets 3510.

As mentioned above, as the coolant 3504 heats up, the coolant 3504 will rise to the top of the tank 3502 due to convection (e.g., the thermal buoyancy effect) because the coolant at colder temperatures has a greater density than when at a higher temperature. However, due to the relatively high viscosity and density of most coolants (e.g., higher than the viscosity and density of water), coolants exhibit relatively low fluidity. As a result, the thermal buoyancy effect of natural convection for coolants can be relatively slow, thereby limiting the heat transfer efficiency of system that rely on principles of natural convection. Further, independent of natural convection, the coolant 3504 introduced at the bottom of the tank 3502 rises to the top of the tank 3502 due to the coolant 3504 being pumped into the tank 3502 at the bottom (via the inlets 3508) and drawn out of the tank 3502 at the top (via the outlets 3510). Notably, the flow of the coolant 3504 due to the pumping in (at the bottom) and out (at the top) of the coolant 3504 is the same direction the coolant will flow as it heats up (from bottom to top) based on the thermal buoyancy effect, but the opposite direction colder portions of the coolant would normally flow (from top to bottom). As a result, the flow of the coolant 3504 through the tank 3502 due to the pumping action (in which cold coolant 3504 is forced into and upwards in the tank 3502) can move contrary to the force of gravity (pushing cool coolant up instead of it falling down) and against the heat convection coefficient of the overall system, thereby leading to a reduction in heat transfer efficiency.

Many typical cooling systems rely exclusively on the thermal buoyancy effect of natural convection in conjunction with the flow of the coolant 3504 being driven by one or more pumps removing (via the outlets 3510) and reintroducing (via the inlets 3508) the coolant 3504 into the tank 3502. However, unlike typical cooling systems, the example cooling system 3500 of FIG. 35 includes one or more turbulators 3522 to improve the heat transfer efficiency of the system. As used herein, a turbulator is a mechanical device that facilitates the agitation, disturbance, or mixing of a fluid to reduce temperature stratification and increase the thermal convection coefficient for improved heat transfer. In some instances the turbulator facilitates the forcing of the fluid in a direction away from the turbulator to further increase the thermal convection coefficient for improved heat transfer. As used herein, a turbulator can include any of grooves, roughness, rotating elements (e.g., blades), and/or appurtenances that have shapes and/or geometries to induce a particular flow. In the illustrated example of FIG. 35, the turbulators 3522 include fan blades (e.g., the turbulators are fans). However, in other examples, the turbulators 3522 include turbine blade-shaped blades. In some examples, the turbulators 3522 include an arrangement of moving and fixed blades (e.g., similar to what is employed in jet engines). In some examples, the turbulators 3522 carry one or more electronic components mounted thereon (e.g., on the fixed blades and/or other structures of the turbulators) to be cooled by the coolant 3504. In some examples, the turbulators 3522 are constructed to rotate at relatively high speeds. In the illustrated example of FIG. 35, four turbulators 3522 are shown. However, in other examples, less than four turbulators 3522 can be used. In other examples, more than four turbulators 3522 can be used. In some examples, different ones of the turbulators 3522 are different sizes and/or driven at different speeds. In some examples, the different sizes and/or different speeds can be designed in conjunction with the different impedances at different regions of the perforated plate 3516 as discussed above. In some examples, multiple ones of turbulators 3522 can be deployed in series or in parallel in a sub-chamber to induce any suitable flow field.

As shown in FIG. 35, the turbulators 3522 are positioned near the bottom of the tank 3502 adjacent the perforated plate 3516. More particularly, in this example, the turbulators 3522 are positioned above the perforated plate 3516 within the main cavity 3514 of the tank 3502. However, in other examples, the turbulators 3522 can be positioned below the perforated plate 3516 within the cold isolation area 3512. In some examples, the turbulators 3522 are mechanically driven by non-contact (e.g., magnetic drive) devices or actuators that are external to the tank 3502. In some examples, the turbulators 3522 are mechanically driven by contact (e.g., motor drive) devices or actuators that are at least partially within the tank 3502 (e.g., entirely within the tank, external to the tank but with a rotating shaft that extends into the tank, etc.).

As noted above, in this example, the turbulators 3522 include fan blades. Fan blades are designed to resist gravity and assist thermal buoyancy effects to increase thermal convection, thereby improving the heat transfer efficiency relative to typical cooling systems that rely exclusively on natural convection and the flow rate of pumping coolant through a tank. This is particularly helpful in situations where the coolant 3504 has a relatively high viscosity and density such that it does not move very quickly based on natural convection.

Figures 36, 37, 38:
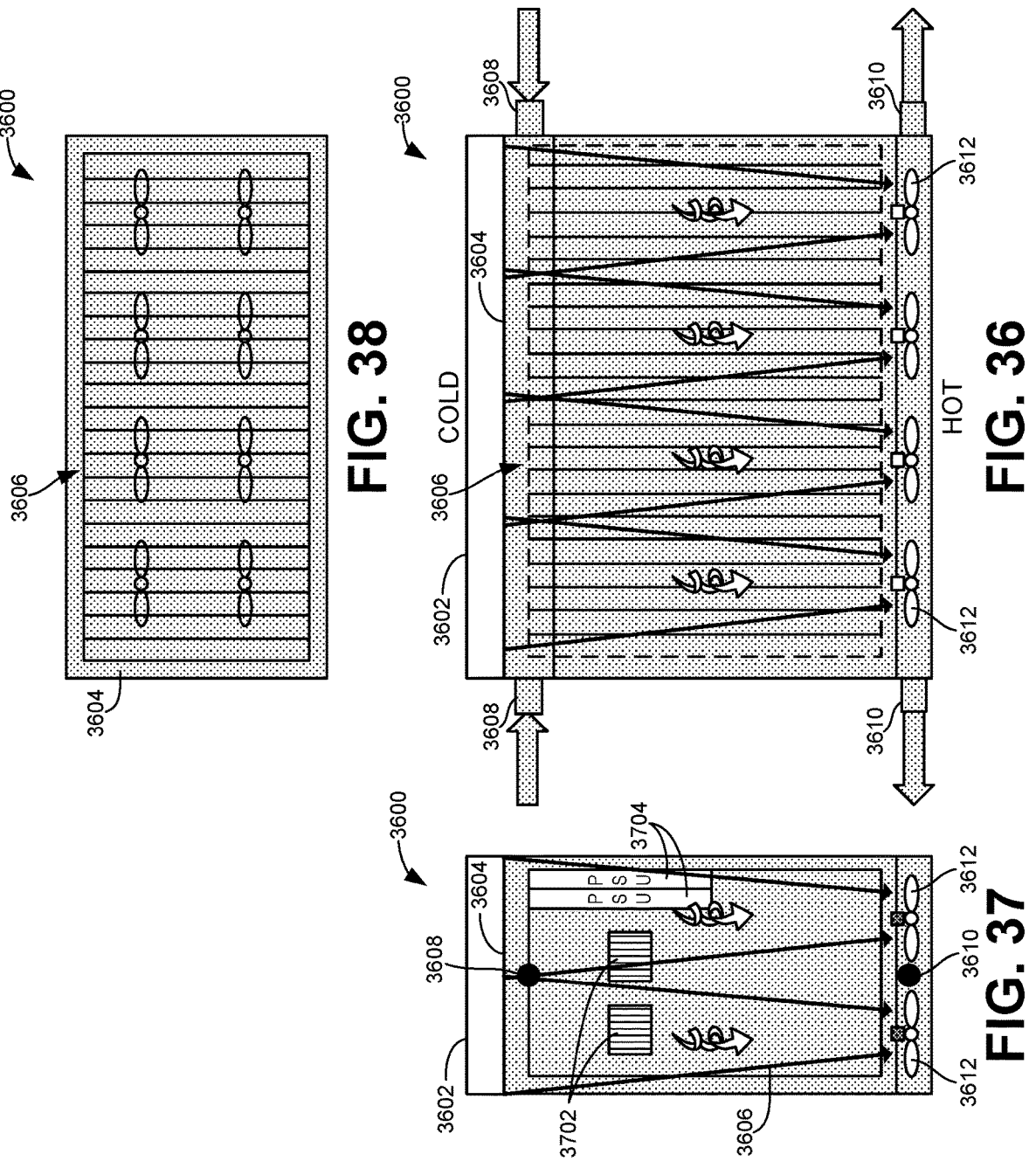
FIGS. 36-38 illustrate another example immersion cooling system that may be implemented in any of the example data centers and/or building(s) of FIGS. 1 and/or 2.

FIG. 36-38 illustrate another example immersion cooling system 3600 that may be implemented in any of the example data centers 102, 106, 116, 200 and/or building(s) 110 of FIGS. 1 and/or 2, the immersion cooling system 2900 of FIGS. 29-33, and/or the CDU 1708 of FIGS. 17 and 18. More particularly, FIG. 36 is a front view of the example immersion cooling system 3600, FIG. 37 is a side view of the example immersion cooling system 3600, and FIG. 38 is a top view of the example immersion cooling system 3600. The example immersion cooling system 3600 includes a tank 3602 to hold a coolant 3604 in which one or more servers 3606 (or other electronic components) are immersed. A particular one of the servers 3606 is shown in FIG. 37 with different power supply units 3702 and heatsinks 3704 carried thereon. In this example, the coolant 3604 is FC40. However, any other suitable dielectric coolant may be used. As shown in the illustrated example, the coolant 3604 is introduced at a relatively cold temperature via coolant supply inlets 3608 and removed from the tank 3602 after drawing heat from the servers 3606 via outlets 3610. In this example, there are two separate inlets (e.g., the coolant supply inlets 3608, etc.) and two separate outlets (e.g., the outlets 3610 at each end (or side) of the tank 3602. In other examples, only one inlet and one outlet are used. In other examples, more than two inlets and more than two outlets 3610 are used.

Unlike what is shown in FIG. 35, in the illustrated example of FIG. 36, the coolant supply inlets 3608 are located near the top of the tank 3602 while the outlets 3610 are located near the bottom of the tank 3602 (according to the direction of gravity when the tank 3602 is orientated as shown in FIG. 36). Thus, as labelled in FIG. 36, the top of the tank 3602 is associated with relatively low (e.g., cold) temperatures of the coolant 3604 and the bottom of the tank 3602 is associated with relatively high (e.g., hot) temperatures for the coolant 3604. Notably, this is the reverse of the temperature profile that would result based on the thermal buoyancy effect associated with natural convection. In addition to reversing the location of the coolant supply inlets 3608 and outlets 3610, the inverted temperature profile shown in the illustrated example is achieved through the use of turbulators 3612 positioned near the bottom of the tank 3602. In this example, the turbulators 3612 include turbine blade shaped blades. In other examples, the turbulators 3612 include fan blades, although turbine blade shaped blades may be more efficient in this scenario with respect to facilitating flow of the coolant 3604. As shown in FIG. 20, there are a total of eight turbulators 3612 arranged in an array having two rows of four. However, in other examples, less than eight turbulators 3612 can be used. In other examples, more than eight turbulators 3612 can be used. Further, the number of rows and/or the number of turbulators 3612 in the array can differ from what is shown in the illustrated example. Further, the particular shape of the array can differ from what is shown. In some examples, the turbulators 3612 are mechanically driven by non-contact (e.g., magnetic drive) devices or actuators that are external to the tank 3602. In some examples, the turbulators 3612 are mechanically driven by contact (e.g., motor drive) devices or actuators that are at least partially within the tank 3602 (e.g., entirely within the tank, external to the tank but with a rotating shaft that extends into the tank, etc.). In some examples, different ones of the turbulators 3612 are different sizes and/or driven at different speeds.

In this example, the turbulators 3612 cause a disturbance in the coolant 3604 that draws a cold portion of the coolant 3604 from the top of the tank 3602 towards the bottom in a direction that is the reverse of the flow direction resulting from the thermal buoyancy effect. This forced movement of the coolant 3604 acts against thermal buoyancy to isolate the heated coolant at the bottom of the tank 3602 where it is removed via the outlets 3610 to be externally cooled before being reintroduced into the tank 3602 at the top (e.g., via the coolant supply inlets 3608, etc.). Further, the forced movement against thermal buoyancy also serves to enhance the turbulence effect for improved heat transfer. In some examples, the modular design of the servers 3606 place relatively high power (e.g., high heat flux) components and/or relative low temperature limit components near the top of the servers 3606. The placement of such components near the top (where the cold coolant is introduced into the tank) along with the force convection of the turbulators 3612 work together to overcome coolant viscosity issues and the natural phenomenon of thermal buoyancy, thereby improving heat transfer efficiency. Furthermore, the example immersion cooling system 3600 of FIG. 36-38 can effectively generate cold and hot compartments to enable improved thermal management mechanisms for the system.

Although not represented in FIG. 36-38, in some examples, perforated plates and/or baffles may be located near the top and/or bottom of the tank 3602 to facilitate the isolation of the hot and cold coolant to establish a more uniform flow field and to improve heat transfer between the servers 3606 and the coolant 3604. Such perforated plates and/or baffles may be implemented in accordance with teachings disclosed above in connection with FIG. 35 and/or FIGS. 29-34.

Figures 39, 40, 41:
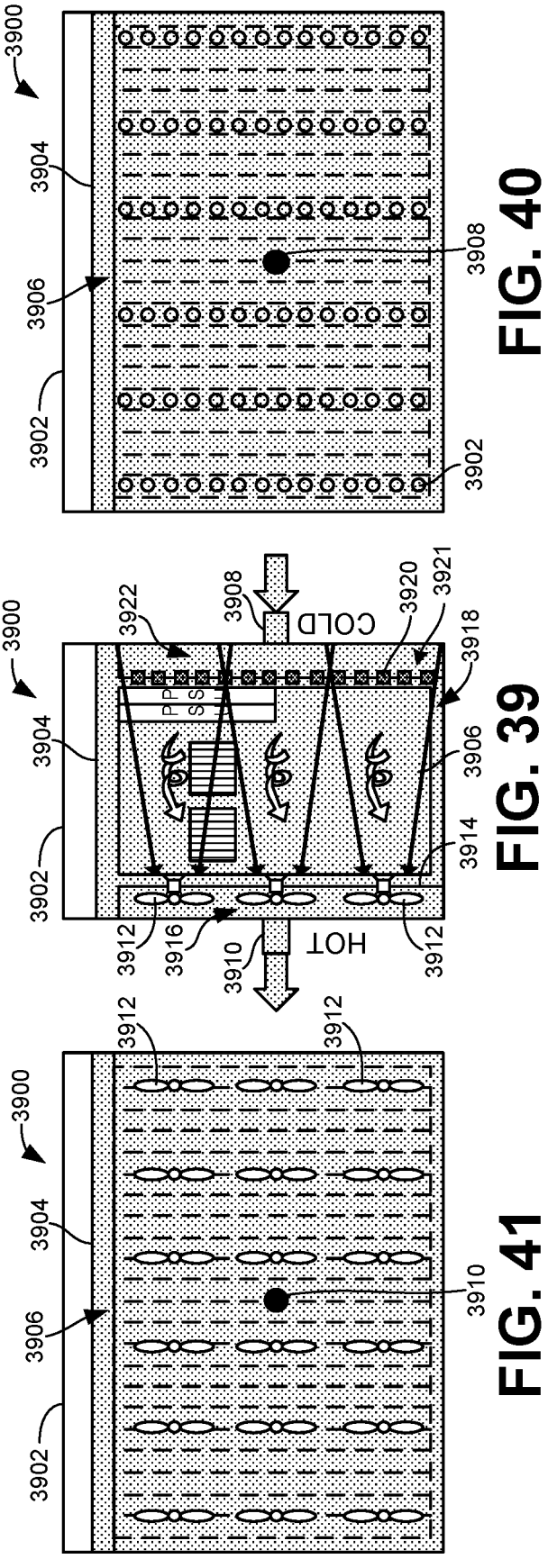
FIGS. 39-41 illustrate another example immersion cooling system that may be implemented in any of the example data centers and/or building(s) of FIGS. 1 and/or 2.

FIGS. 39-41 illustrate another example immersion cooling system 3900 that may be implemented in any of the example data centers 102, 106, 116, 200, building(s) 110 of FIGS. 1 and/or 2, the immersion cooling system 2900 of FIGS. 29-33, and/or the CDU 1708 of FIGS. 17 and 18. More particularly, FIG. 39 is a side view of the example immersion cooling system 3900, FIG. 40 is a front view of the example immersion cooling system 3900, and FIG. 41 is a rear view of the example immersion cooling system 3900. The example immersion cooling system 3900 includes a tank 3902 to hold a coolant 3904 in which one or more servers 3906 (or other electronic components) are immersed. In this example, the coolant 3904 is FC40. However, any other suitable dielectric coolant may be used. As shown in the illustrated example, the coolant 3904 is introduced at a relatively cold temperature via a coolant supply inlet 3908 and removed from the tank 3902 after drawing heat from the servers 3906 via an outlet 3910. In this example, the coolant supply inlet 3908 and outlet 3910 are on opposite lateral sides (e.g., front and back) of the tank 3902 with different ones of the servers 3906 therebetween. Thus, as labelled in FIG. 39, the front side of the tank 3902 (by the coolant supply inlet 3908) is associated with relatively low (e.g., cold) temperatures of the coolant 3904 and the rear side of the tank 3902 (by the outlet 3910) is associated with relatively high (e.g., hot) temperatures for the coolant 3904. In this example, there is only one inlet (e.g., the coolant supply inlet 3908, etc.) and one outlet (e.g., the coolant supply outlet 3910, etc.). In other examples, more than one inlet and/or more than one outlet are used. In this example, the coolant supply inlet 3908 and the outlet 3910 are positioned approximately midway between the top and bottom of the tank 3902. In other examples, the coolant supply inlet 3908 and outlet 3910 can be positioned higher or lower than what is shown.

As shown in the illustrated example, the coolant supply inlet 3908, outlet 3910, and servers 3906 are positioned relative to one another so that the general flow from the inlet side of the tank 3902 (e.g., the "cold" side, etc.) to the outlet side of the tank 3902 (e.g., the "hot" side, etc.) travels across the surfaces of the servers 3906 in a generally horizontal direction. In this example, the horizontal flow is achieved through the use of turbulators 3912 positioned near the outlet side (e.g., the rear side) of the tank 3902. In this example, the turbulators 3912 include turbine blade shaped blades. In some such examples, the turbulators 3912 function as turbines. In other examples, the turbulators 3912 include fan blades, although turbine blade shaped blades may be more efficient in this scenario with respect to facilitating flow of the coolant 3904. As shown in FIG. 41, there are a total of eighteen of the turbulators 3912 arranged in an array having three rows of six. However, in other examples, less than eighteen of the turbulators 3912 can be used. In other examples, more than eighteen turbulators can be used. Further, the number of rows and/or the number of turbulators in the array can differ from what is shown in the illustrated example. Further, the particular shape of the array can differ from what is shown. In some examples, the turbulators 3912 are mechanically driven by non-contact (e.g., magnetic drive) devices or actuators that are external to the tank 3902. In some examples, the turbulators 3912 are mechanically driven by contact (e.g., motor drive) devices or actuators that are at least partially within the tank 3902 (e.g., entirely within the tank, external to the tank but with a rotating shaft that extends into the tank, etc.). In some examples, different ones of the turbulators 3912 are different sizes and/or driven at different speeds.

In this example, the turbulators 3912 cause a disturbance in the coolant 3904 that draws a cold portion of the coolant 3904 from the cold side (e.g., front) of the tank 3902 towards the opposite (rear) side of the tank 3902 to facilitate heat transfer between the servers 3906 and the coolant 3904. This forced movement of the coolant 3904 acts against thermal buoyancy (which results in hot liquid rising and cold liquids falling rather than being moved horizontally) to isolate the heated coolant near the rear of the tank 3902 where it is removed via the outlets 3910 to be externally cooled before being reintroduced into the tank 3902 at the front of the tank 3902 (via the inlet 3908). In some examples, the turbulators 3912 are positioned adjacent a baffle 3914 that defines a hot isolation area 3916 separate from a main cavity 3918 of the tank 3902. In this example, the turbulators 3912 are positioned within the hot isolation area 3916. However, in other examples, the turbulators 3912 can be adjacent the baffle 3914 within the main cavity 3918 of the tank 3902. Further, in some examples, the immersion cooling system 3900 includes a perforated plate 3920 to separate the main cavity 3918 from a cold isolation area 3922 adjacent the inlet 3908. The baffle 3914 and the perforated plate 3920 help to isolate the hot and cold portions of coolant 3904, thereby increasing the thermal convection coefficient as the cold current is drawn across the servers 3906. FIG. 39 shows an array of openings 3921 associated with the perforated plate 3920. While the openings 3921 are in straight lines and all have the same size in the illustrated example, other arrangements are possible. For instance, in some examples, the openings 3921 can be positioned radially about the inlet 3908. Further, in some examples, the spacing, size, and/or number of holes differs from one region to another across the perforated plate 3920 to adjust the impedance as discussed above in connection with FIG. 35. In some examples, the perforated plate 3920 is composed of polytetrafluoroethylene (PTFE), Teflon, aluminum, and/or stainless steel.

Figure 42:
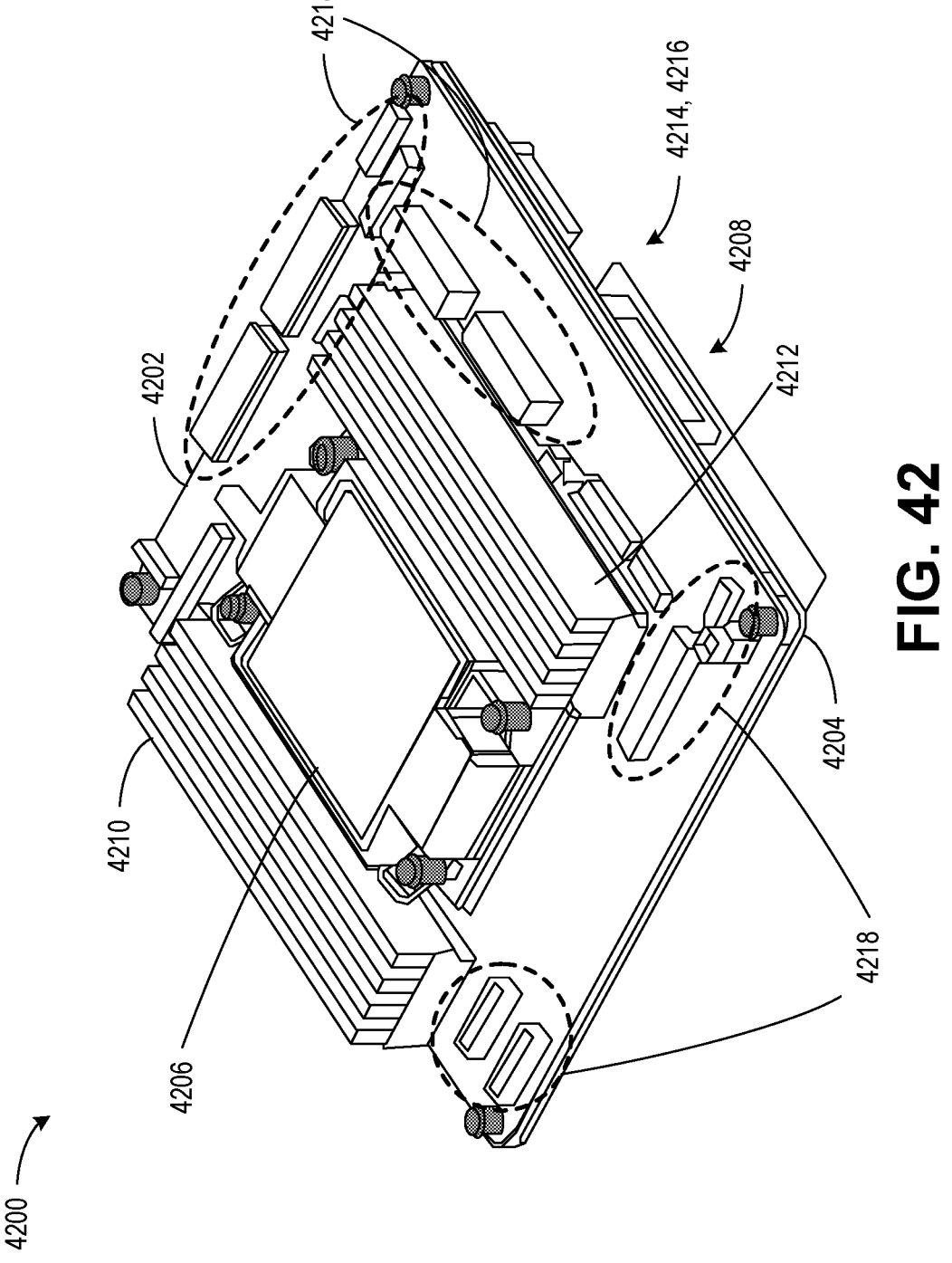
FIG. 42 is a perspective view of an example compute node having a form factor in accordance with teachings of this disclosure.
Figure 43:
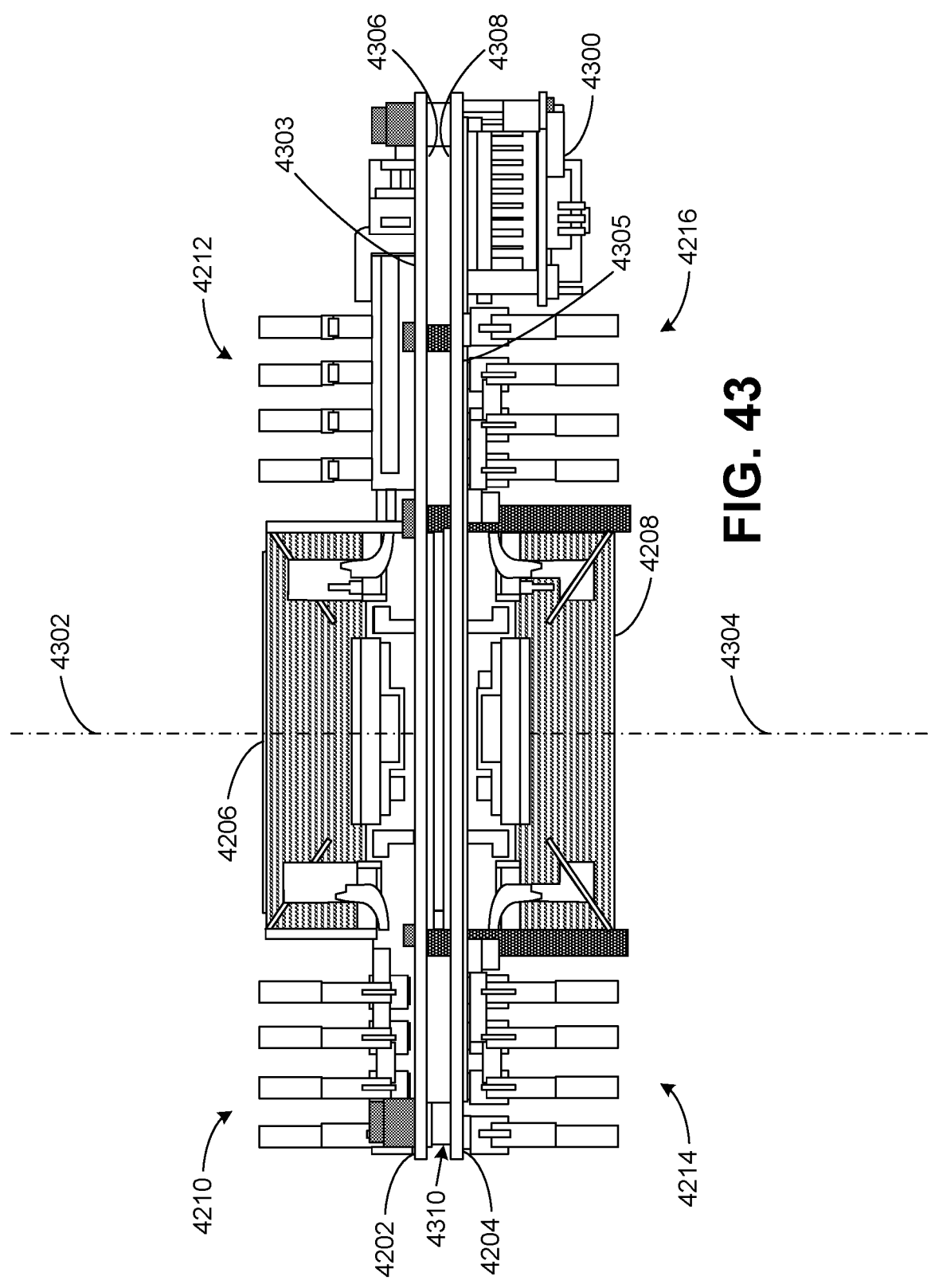
FIG. 43 is a side view of the example compute node of FIG. 42.

FIG. 42 is a perspective view of an example compute node 4200 having a stacked form factor in accordance with teachings of this disclosure. The example compute node 4200 can include a central processing unit (CPU) of a server. In some examples compute node 4200 can be associated with the immersion cooling system 3500 of FIG. 35, the immersion cooling system 3600 of FIGS. 36-38, the immersion cooling system 3900 of FIGS. 39-41, the immersion cooling system 2900 of FIGS. 29-33, and/or the CDU 1708 of FIGS. 17 and 18. However, the form factors disclosed herein can be implemented with other types of server components and/or nodes (e.g., memory nodes, PCIe cards, etc.). FIG. 43 is a side view of the compute node 4200 of FIG. 42. In the illustrated examples of FIGS. 42 and 43, the compute node 4200 includes an example first circuit board 4202 and an example second circuit board 4204. A first surface 4303 of the first circuit board 4202 carries example first processor circuitry 4206 and an example first memory 4210 and an example second memory 4212. A first surface 4305 of the second circuit board 4204 carries example second processor circuitry 4208 example third memory 4214, and example fourth memory 4216. The first circuit board 4202 including the first processor circuitry 4206, the first memory 4210, and the example second memory 4212 can be considered a first compute unit of the compute node 4200. The second circuit board 4204 including the second processor circuitry 4208, the third memory 4214, and the fourth memory 4216 can be considered a second compute unit of the compute node 4200.

In the illustrated example of FIGS. 42 and 43, the first circuit board 4202 includes example connection ports 4218. As illustrated in FIG. 43, an example third circuit board 4300 is coupled to a portion of the first surface 4305 of the second circuit board 4204. In the illustrated example of FIG. 42, the first circuit board 4202 has a second surface 4306 opposite the first surface 4303. Also, the second circuit board 4204 has a second surface 4308 opposite the first surface 4305. As disclosed herein, when circuit boards 4202, 4204 are coupled as shown in FIG. 42, the surfaces 4306, 4308 (e.g., interior surfaces) define an example gap 4310 therebetween.

The circuit boards 4202, 4204, 4300 are a substrate medium that electrically couple computing components (e.g., processor circuitry 4206, 4208, the memories 4210, 4212, 4214, 4216, etc.). In the illustrated example of FIGS. 42 and 43, the circuit boards 4202, 4204, 4300 are planar (i.e., the circuit boards 4202, 4204, 4300 define planes). In some examples, the circuit boards 4202, 4204, 4300 are formed via layered structures of conductive materials and/or insulative structures that enable computing components to communicate with other computing components. In the illustrated example of FIGS. 42 and 43, the first circuit board 4202 and the second circuit board 4204 are substantially the same size (e.g., the larger circuit board has a length, width, and height are within 10% of corresponding dimensions of the smaller circuit board, etc.) The circuit boards 4202, 4204, 4300 can have different sizes and/or shapes than the examples shown in FIGS. 42 and 43. Also, the compute node

4200 can include additional or fewer circuit boards (and, thus, additional or fewer compute units).

The processor circuitry 4206, 4208 include processing circuits coupled to (e.g., mounted to) the circuit boards 4202, 4204, respectively. Each of the processor circuitry 4206, 4208 can be configured as a single socket CPU system and booted-up individually. When assembled in the stacked form factor shown in FIGS. 42 and 43, the processor circuitry 4206, 4208 can function as a dual socket CPU system. In some such examples, the first processor circuitry 4206 can function as carrier circuitry (e.g., 10 circuitry, etc.) and the second processor circuitry 4208 is the CPU.

Although, the processor circuitry 4206, 4208 of the respective circuit boards 4202, 4204 are disclosed as CPUs, the processor circuitry 4206, 4208 can include any suitable physical resource (e.g., similar to the physical resources 720 of FIG. 7, etc.). For example, the processor circuitry 4206, 4208 include any type of processor, controller, or other compute circuit capable of performing various tasks such as compute functions and/or controlling the functions of the compute node 4200 depending on, for example, the type or intended functionality of the compute node 4200. For example, the processor circuitry 4206, 4208 may be embodied as high-performance processors, as accelerator co-processors or circuits, and/or storage controllers.

In the illustrated example of FIG. 42, the first processor circuitry 4206 defines an example first centerline axis 4302 and an example second centerline axis 4304. In the illustrated example of FIG. 42, the centerline axes 4302, 4304 can include, for instance, axes extending from a geometric center of the processor circuitry 4206, 4208. In the illustrated example of FIG. 42, the centerline axes 4302, 4304 extending through the processor circuitry 4206, 4208 are substantially collinear (e.g., within ten degrees of exactly parallel and displaced by less than 5% of the length of the processor circuitry 4206 and/or the processor circuitry 4208, etc.). In other examples, the centerline axes 4302, 4304 can have any other suitable relationship (e.g., parallel and offset, etc.).

The circuit boards 4202, 4204 are disposed such that the planes defined by the circuit boards 4202, 4204 are aligned. In the illustrated example of FIGS. 42 and 43, the circuit boards 4202, 4204 are disposed such that the planes defined by the circuit boards 4202, 4204 are parallel or substantially parallel (e.g., within 10 degrees of exactly parallel). As shown in FIG. 43, the first surface 4306 of the first circuit board 4202 faces the second surface 4308 of the second circuit board 4204 when the circuit boards 4202, 4204 are coupled. In some examples, the circuit boards 4202, 4204 are at least partially offset or misaligned relative to one another. As also shown in FIG. 43, in some examples, at least a portion of the second surface 4306 of the first circuit board 4202 is spaced apart from the second surface 4308 of the second circuit board 4204 to define the gap 4310. In some examples, when the compute node 4200 is disposed in an immersion cooling system, fluid can flow through the gap 4310. As also shown in FIGS. 42 and 43, the first circuit board 4202 and the second circuit board 4204 are oriented so that processor circuitry 4206, 4208 are on opposing sides of the compute node 4200 when the circuit boards 4202, 4204 are coupled. However, the circuit boards 4202, 4204 and/or the components (e.g., the processor circuitry 4206, 4208, etc.) carried by the boards 4202, 4204 can be arranged in other configurations than shown in FIGS. 42 and 43. For example, the circuit boards 4202, 4204 can be arranged such that the gap 4310 varies in size along the length and/or width of the compute node 4200. In some such examples, the surfaces 4306, 4308 can be oriented such that planes defined by the circuit boards 4202, 4204 converge (e.g., converge upstream of the compute node 4200, converge downstream of the node 4200, converge in a direction perpendicular to immersion cooling fluid flow, etc.). In some examples, gap varies in size along the length and/or width of the compute node 4200 such that a first portion of the gap 4310 is wider than a second portion of the gap 4310 based on, for instance, the direction of fluid flow through the gap 4310 when the compute node is disposed in an immersion cooling system. Also, the compute node 4200 can include additional circuit boards arranged in parallel (e.g., four circuit boards in parallel).

In some examples, the circuit boards 4202, 4204 can be coupled and oriented vertically such that when the compute node 4200 is disposed in an immersion cooling tank, fluid flows in parallel to planes defined by the circuit boards 4202, 4204. In other examples, the circuit boards 4202, 4204 can be coupled and oriented horizontally such that when the compute node 4200 is disposed in an immersion cooling tank, the flow flows perpendicularly to the circuit boards 4202, 4204.

As disclosed herein, in some examples, the first circuit board 4202 is an example input/output (IO) board and the second circuit board 4204 is a CPU for the server. In some examples, the third circuit board 4300 is a baseboard management circuit (BMC) board. In other examples, the third circuit board 4300 can be absent and/or disaggregated from the compute node 4200 (i.e., the compute node 4200 only includes the first circuit board 4202 and the second circuit board 4204 and can be coupled to the third circuit board 4300 via cables). Additionally or alternatively, in some examples, components such as platform controller hub (PCH) components, field-programmable gate array (FPGA) components, and complex programmable logic device (CPLD) components can be incorporated into some or all of the circuit boards 4202, 4204, 4300. As such, the modular nature of the example compute node 4200 provides for flexibility in scaling the components of the compute node 4200 based on considerations such as footprint size.

However, unlike some known server components, the compute node 4200 of FIGS. 42 and 43 may not include components that are typically incorporated at the node, such as peripheral computing components coupled to the circuit boards 4202, 4204, 4300 via riser slots (e.g., PCIe cards), solid state drives, hard disk drives, the input/output subsystem components, power sources, clocking components, flexible display interface components, direct media interface components, etc. Rather, in the illustrated examples of FIGS. 42 and 18, the compute node 4200 can be coupled to such components via cables or other means for establishing communicative couplings. As a result, the size/footprint of the compute node 4200 can be reduced as compared to some known server components (e.g., CPU boards). In some examples, the compute node 4200 is between one-half to one-third the size of equivalent components that are arranged in a spreadcore and/or shadowed configuration. Further, a server including one or more of the example compute nodes 4200 can also have a modular nature in that the disaggregated components (e.g., the compute node 4200, the interface components, the PCIe cards, additional node(s), etc.) can be flexibly arranged in a server chassis, can be scaled, and/or selectively included or removed from the chassis.

The comparatively small size of the example compute node 4200 of FIGS. 42 and 43 reduces the material costs of the compute node 4200. For example, if the compute node

4200 includes a PCH, the compute node 4200 can be 220 millimeters (mm) in length, 200 mm in width, and 82 mm in height. In some examples, if the compute node 4200 does not include a PCH, the compute node 4200 can be 200 millimeters (mm) in length, 200 mm in width, and 82 mm in height. In some such examples, the example compute node 4200 can have a significantly smaller footprint than comparable compute nodes with different form factors (e.g., 40% smaller, 20% smaller, etc.). The example compute node 4200 of FIGS. 42 and 43 can have different dimensions than the example dimensions disclosed herein. In some such examples, the compute node 4200 is substantially smaller than compute nodes with different form factors such as shadow or spreadcore form factors (e.g., the example compute node 4200 of FIGS. 42 and 43 can have a length that is 100 mm less than known compute nodes). The comparatively reduced size of the form factor of the example compute node 4200 of FIGS. 42 and 43 can also reduce the volume of the immersion cooling tank housing the server chassis including the example compute node 4200. The reduced tank size also reduces the volume of coolant to fill the tank and cool the compute node 4200. Additionally, the stacked form factor of the compute node 4200 reduces the thermal resistance of the processor circuitry 4206, 4208 due to the increased TDP density of the compute node 4200 when compared to prior form factors For example, the thermal resistance associated with the compute node 4200 is comparatively lower than similar compute nodes due to the comparatively reduced footprint of the compute node 4200, the increased heat capacity of liquid when compared to air, and direct contact between the liquid and the heat-generating elements of the compute node 4200 (e.g., the processor circuitry 4206, 4208, etc.)

Figure 44:
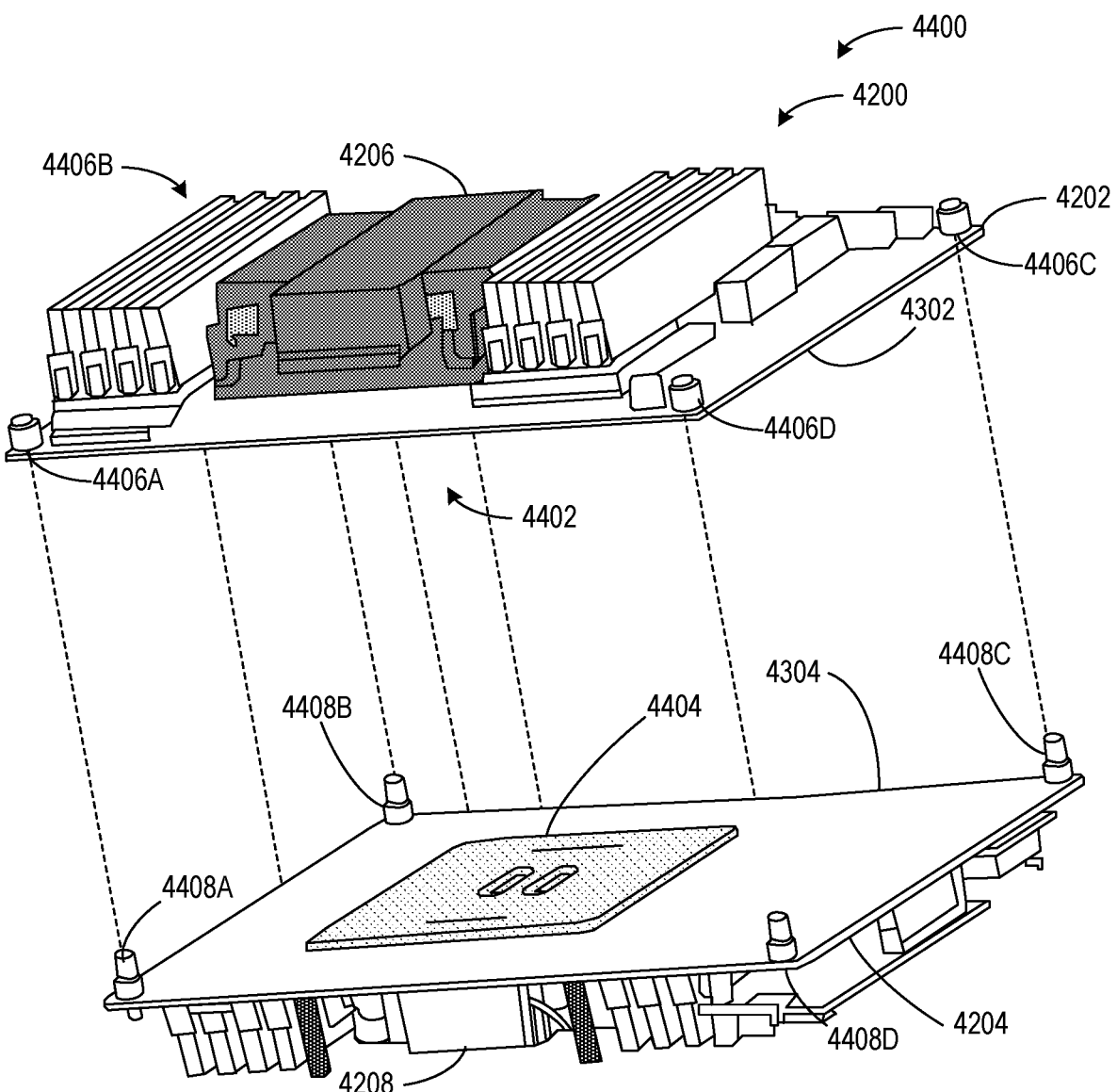
FIG. 44 is a partially exploded view of the example compute node of FIGS. 42 and 43.

FIG. 44 is a partially exploded view 4400 of the example compute node 4200 of FIGS. 42 and 43. In the illustrated example of FIG. 44, the first circuit board 4202 includes an example first fastener 4406A, an example second fastener 4406B, an example third fastener 4406C, and an example fourth fastener 4406D. In the illustrated example of FIG. 44, the second circuit board 4204 includes an example fifth fastener 4408A, an example sixth fastener 4408B, an example seventh fastener 4408C, and an example eighth fastener 4408D. The compute node 4200 can include additional or fewer fasteners.

In the illustrated example, the circuit boards 4202, 4204 have a substantially rectangular shape and each of the fasteners 4406A, 4406B, 4406C, 4406D are disposed in corresponding ones of the corners of the first circuit board 4202 and each of the fasteners 4408A, 4408B, 4408C, 4408D are disposed in corresponding ones of the corners of the second circuit board 4204. However, the circuit boards 4202, 4204 can have other shapes and/or the fasteners 4406A, 4406B, 4406C, 4406D, 4408A, 4408B, 4408C, 4408D can be disposed at other locations relative to the circuit boards 4202, 4204 than shown in FIG. 44.

In the illustrated example of FIG. 44, the fasteners 4406A, 4406B, 4406C, 4406D of the first circuit board 4202 include holes to receive corresponding bosses (e.g., protruding portions, fastener bodies, fastener heads, screw heads, etc.) of the fasteners 4408A, 4408B, 4408C, 4408D of the second circuit board 4204. In some examples, the fasteners 4406A, 4406B, 4406C, 4406D and the fasteners 4408A, 4408B, 4408C, 4408D can be joined via press-fits, shrink fits, welds, and or one or more chemical adhesive(s). Additionally or alternatively, the fasteners 4406A, 4406B, 4406C, 4406D and/or the 4408A, 4408B, 4408C, 4408D can include threads to enable threaded coupling with corresponding ones of the fasteners (e.g., the first fastener 4406A and the fifth fastener 4408A, the second fastener 4406B and the sixth fastener 4408B, etc.). In some examples, some or all of the fasteners 4406A, 4406B, 4406C, 4406D and/or the fasteners 4408A, 4408B, 4408C, 4408D can be absent. In some examples, the circuit boards 4202, 4204 include other types of mechanical fasteners (e.g., latches to couple the circuit boards 4202, 4204 at respective edges of the boards). In some such examples, the circuit boards 4202, 4204 can be coupled in any other suitable matter (e.g., using chemical fasteners).

In the illustrated example of FIG. 44, the first processor circuitry 4206 has an example first back plate 4402 and the second processor circuitry 4208 includes an example second back plate 4404. In some examples, when the compute node 4200 is assembled (i.e., the circuit boards 4202, 4204 are coupled via the fasteners 4406A, 4406B, 4406C, 4406D, 4408A, 4408B, 4408C, 4408D), the back plates 4402, 4404 abut or are substantially flush (e.g., as shown in FIG. 42). In other examples, a gap (e.g., the gap 4310 of FIG. 42, etc.) can exist between the back plates 4402, 4404 when the circuit boards 4202, 4204 are coupled.

Referring again to FIG. 43, in some examples when the circuit boards 4202, 4204 are coupled via the fasteners 4406A, 4406B, 4406C, 4406D, 4408A, 4408B, 4408C, 4408D, gap(s) 4310 are also formed between portions of the facing surfaces 4306, 4308 of the circuit boards 4202, 4204 that do not include the processor circuitry 4206, 4208. The gap(s) 4310 between the facing surfaces 4306, 4308 of the circuit boards 4202, 4204 can permit fluid flow through the compute node when the compute node 4200 is disposed in a coolant. In some examples, one or more of the circuit boards 4202, 4204 include channels (e.g., openings) defined in the circuit boards 4202, 4204 to facilitate fluid flow.

Figure 45A:
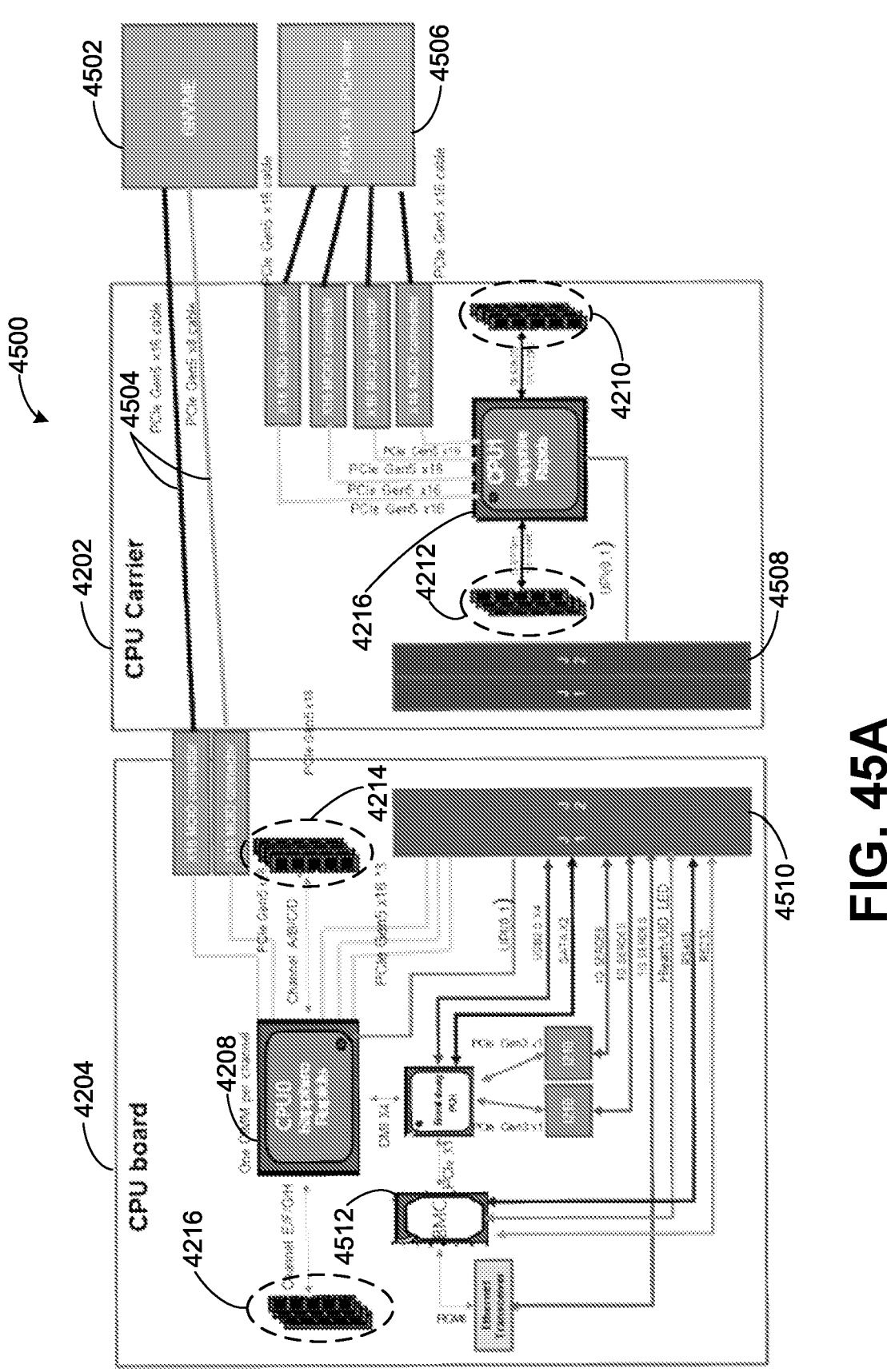
FIG. 45A illustrates an example system architecture of a portion of an example modular server including the example compute node of FIGS. 42-44.

FIG. 45A is an illustration of an example system architecture of a portion of an example modular server 4500 including the example compute node 4200 of FIGS. 42-44. As disclosed herein, the example compute node 4200 includes the processor circuitry 4206, 4208 and the memory 4210, 4212, 4214, 4216. In the example of FIG. 45A, the compute node 4200 is communicatively coupled to an NVMe (non-volatile memory express) host controller interface 4502 via cables 4504. Also, the compute node 4200 is coupled to a PCIe riser slot 4506 via cables to communicatively couple the processor circuitry 4206, 4208 to a PCIe card inserted in the slot. Thus, rather than the NVMe (non-volatile memory express) host controller interface 4502 and the PCIe riser slot 4506 being carried by the compute node 4200, these components are offloaded or disaggregated from the compute node 4200. In the illustrated example of FIG. 45A, the first circuit board 4202 includes an example first connector 4508 (labeled J1/J2) and the second circuit board 4204 includes an example second connector 4510 (labeled J1/J2). The connectors 4508, 4510 can be, for example, board-to-board connectors and/or provide for cable connections between the circuit boards 4202, 4204. In some such examples, the connectors 4508, 4510 enable the circuit boards 4202, 4204 to function as a dual socket system. In some examples, the modular server 4500 can include a liquid sensor (not illustrated) in communication with an example BMC 4512. In some such examples, the liquid sensor can detect if leakage of the immersion fluid has occurred. As disclosed herein, the modular or disaggregated nature of the components of the modular server 4500 enables the compute node 4200 to have a smaller form factor. Although one example modular server 4500 is depicted in FIG. 45A, the compute node 4200 can have any other suitable system architecture.

Figure 45B:
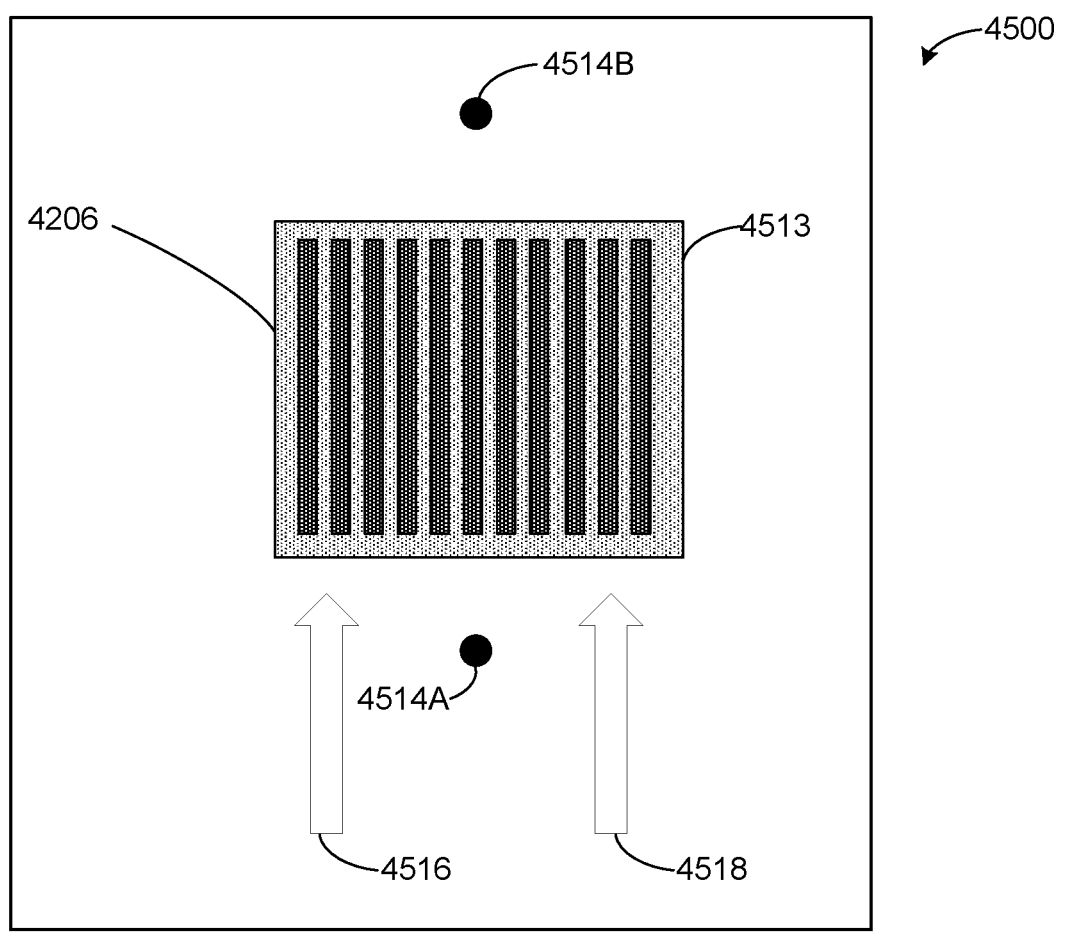
FIG. 45B illustrates an example arrangement of a thermal sensor relative to the example modular server of FIG. 45A.

FIG. 45B illustrates an example arrangement of a thermal sensor relative to the example modular server 4500 of FIG. 45A. In particular, FIG. 45B illustrates the processor circuitry 4206 of the example compute node 4200 of FIGS. 42-45A and a heat sink 4513 disposed over the processor circuitry 4206. The flow of immersion fluid over the processor circuitry 4206 is represented by arrows 4516, 4518, in FIG. 45B. FIG. 45B illustrates placement of example thermal sensors 4514A, 4514B on the example modular server 4500 of FIG. 45A. In the illustrated example of FIG. 45B, the server 4500 includes the first thermal sensor 4514A upstream of the heat sink 4513 and the processor circuitry 4206 and the second thermal sensor 4514B downstream of the heat sink 4513 and the processor circuitry 4206. For example, the first thermal sensor 4514A measures the temperature associated with the inlet of the heat sink 4513 and the second thermal sensor 4514B measures the temperature associated with the outlet of the heat sink 4513. Thus, in the example of FIG. 45B, the thermal sensors 4514A, 4514B are proximate to the processor circuitry 4206 and placed parallel to the flow field and fins of the heat sink 4513. In some examples, the compact form factor of the compute node 4200 enables the compute node 4200 to be placed at any suitable location on the server 4500. Accordingly, the thermal sensors 4514A, 4514B can be placed at any suitable location in the modular server 4500 based on the location of the compute node 4200 servers. Further, the modular server 4500 can be rotated for different immersion cooling system configurations with the thermal sensors 4514A, 4514B disposed parallel to the direction of the flow field.

Figure 46:
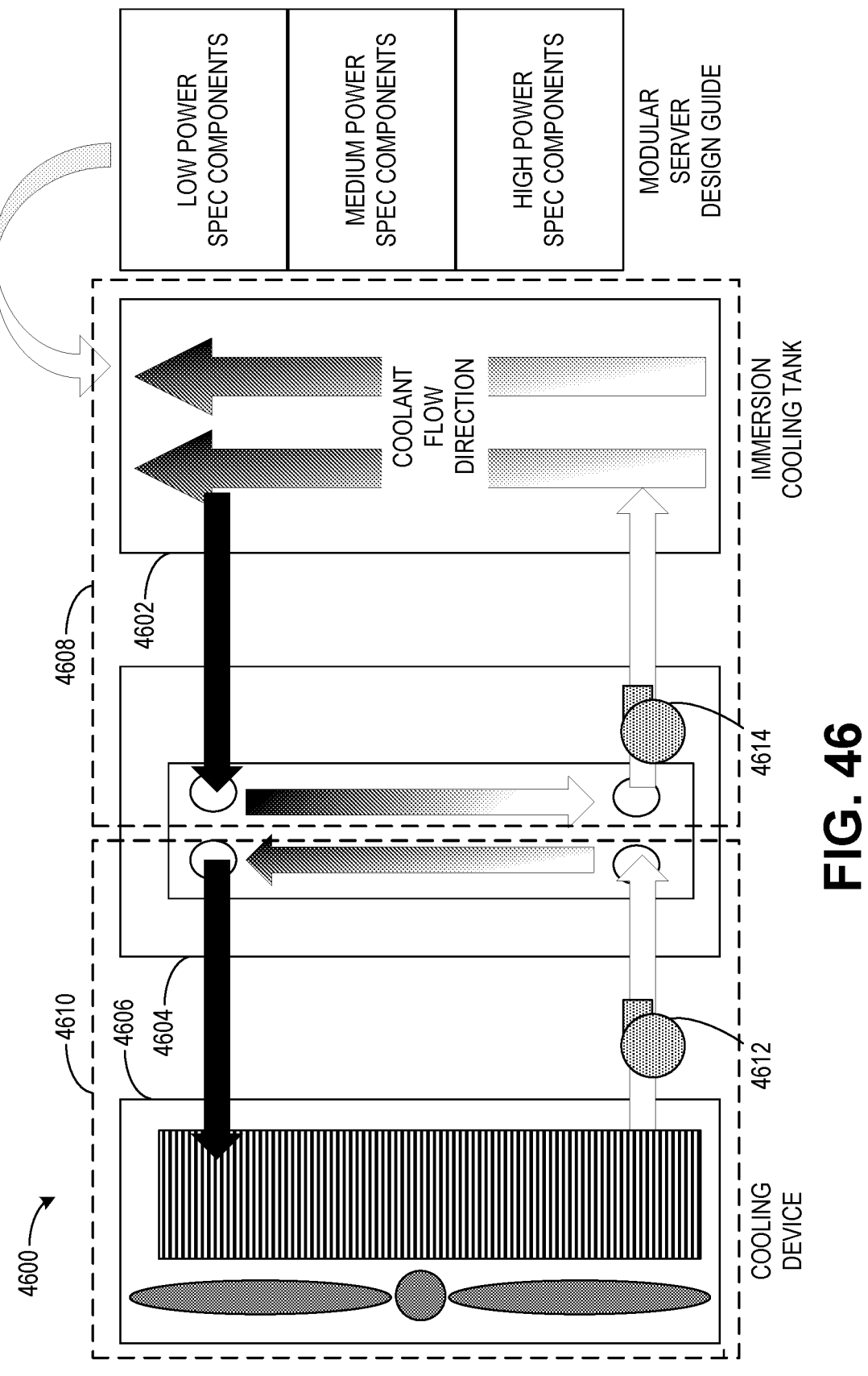
FIG. 46 is a system diagram representing an example server including the example compute node of FIGS. 42-44.

FIG. 46 is a schematic system diagram of an example immersion cooling system 4600 in which the compute node 4200 of FIGS. 42-44 can be disposed to provide for cooling of the compute node 4200 during operation of the compute node. In the illustrated example of FIG. 46, the immersion cooling system 4600 includes an example tank 4602, an example heat exchanger 4604, and an example radiator 4606. In the illustrated example of FIG. 46, the immersion cooling system 4600 includes an example first flow circuit 4608 and an example second flow circuit 4610, which are driven by an example first pump 4612 and an example second pump 4614, respectively. In some examples, the immersion cooling system 4600 can be implemented by the immersion cooling system 3500 of FIG. 35, the immersion cooling system 3600 of FIGS. 36-38, the immersion cooling system 3900 of FIGS. 39-41, the immersion cooling system 2900 of FIGS. 29-33, and/or the immersion cooling system 1700 of FIG. 17.

The tank 4602 is a container that contains operating computing components, including one or more compute nodes similar to the compute node 4200 of FIGS. 42-44. The compute nodes can be disposed in a chassis. During operation of the compute components, the compute components generate heat. The immersion cooling system 4600 facilities cooling of the components and dissipation of the heat to prevent overheating and/or damage to the computing components which can affect operational performance of the components. To cool the computing components, the second pump 4614 and/or a natural flow (e.g., caused by a heat gradient over the length of the tank 4602, etc.) causes coolant to flow through the tank 4602, thereby cooling the computing components via convection (e.g., forced convection, natural convection, etc.). The coolant used to cool is circulated via the first flow circuit 4608 and cooled via the heat exchanger 4604.

The heat exchanger 4604 cools coolant from the first flow circuit 4608 via the circulation of the second flow circuit 4610. For example, as the comparatively warm coolant of the first flow circuit 4608 enters the heat exchanger, the coolant encounters the comparatively cool fluid of the second flow circuit 4610 and gradually cools as it flows through the heat exchanger 4604 to the inlet of the tank 4602, thereby heating the fluid of the second flow circuit 4610. In some examples, the heat exchanger 4604 can be implemented via a shell and tube heat exchanger, a plate fin heat exchanger, a phase exchange heat exchanger, helical-coil heat exchanger, a spiral heat exchanger, a tube-in-tube heat exchanger, and/or a combination thereof. In the illustrated example of FIG. 46, the heat exchanger 4604 has a counterflow configuration (e.g., the fluids of the flow circuits 4608, 4610 flow in opposite directions, etc.). In other examples, the heat exchanger 4604 can have any other suitable configuration.

The radiator 4606 dissipates heat from the fluid of the second flow circuit 4610. For example, the radiator 4606 can dissipate heat from the fluid of the second flow circuit 4610 via forced air convection over a series of coils. In other examples, the radiator 4606 can dissipate heat from the second flow circuit 4610 by any other suitable means and/or method. In some examples, the radiator 4606 can be absent. In such examples, the first flow circuit 4608 can draw from a continuously restored source of fresh fluid and hot fluid leaving the heat exchanger 4604 can be disposed of. For example, the heat exchanger 4604 can draw comparatively cold water from a tap associated with a water supply of the facility housing the immersion cooling system 4600 (e.g., a municipal water system, etc.) and can discharge comparatively hot water into a drain associated with the water supply of the facility.

In the illustrated example of FIG. 46, the example first flow circuit 4608 includes a coolant that is suitable for direct contact with computing components. For example, the first flow circuit 4608 can be implemented by any suitable insulative dielectric fluid. In contrast, because the second flow circuit 4610 does not encounter the computing components, the fluid of the second flow circuit 4610 does not need to be electrical insulative/non-conductive. In some examples, the second flow circuit 4610 and/or the heat exchanger 4604 can be absent, and the coolant of the first flow circuit 4608 can be absent. In such examples, the coolant can be cooled via the operation of the radiator 4606. However, because insulative dielectric fluid is expensive, configurations that minimize the total required volume of the first flow circuit 4608 can be significantly less costly. Example implementations of the immersion cooling system 4600 are described in greater detail below in conjunction with FIGS. 47A and 47B.

The example immersion cooling system 4600 can be used to cool a server having a modular or disaggregated design including one or more of the example compute node 4200 of FIGS. 42-44. The modular nature of the server including the compute node 4200 enables the other components of the server to be arranged to maximize cooling of the high power server components, such as the compute node 4200 (e.g., a CPU) in view of a location of inlets and outlets of the immersion cooling system (e.g., the inlets and outlets of the second flow circuit 4608). For example, as represented in FIG. 46, the compute node 4200 and/or other high TDP components of a server can be disposed near the inlet of the tank 4602 (e.g., the bottom of the tank 4602 in bottom-to-top flow configuration in the illustrated example of FIG. 45A, at the top of the tank 4602 in a top-to-bottom flow configuration, etc.) and the low TDP components of server can be disposed near the outlet of the tank 4602 and/or distal to the inlet of the tank 4602 (e.g., the top of the tank 4602 in the illustrated example of FIG. 45A, at the bottom of the tank 4602 in top-to-bottom flow configurations, etc.). Medium TDP components can be disposed between the high TDP and low TPD components to optimize cooling of the components based on TDP.

Figure 47A:
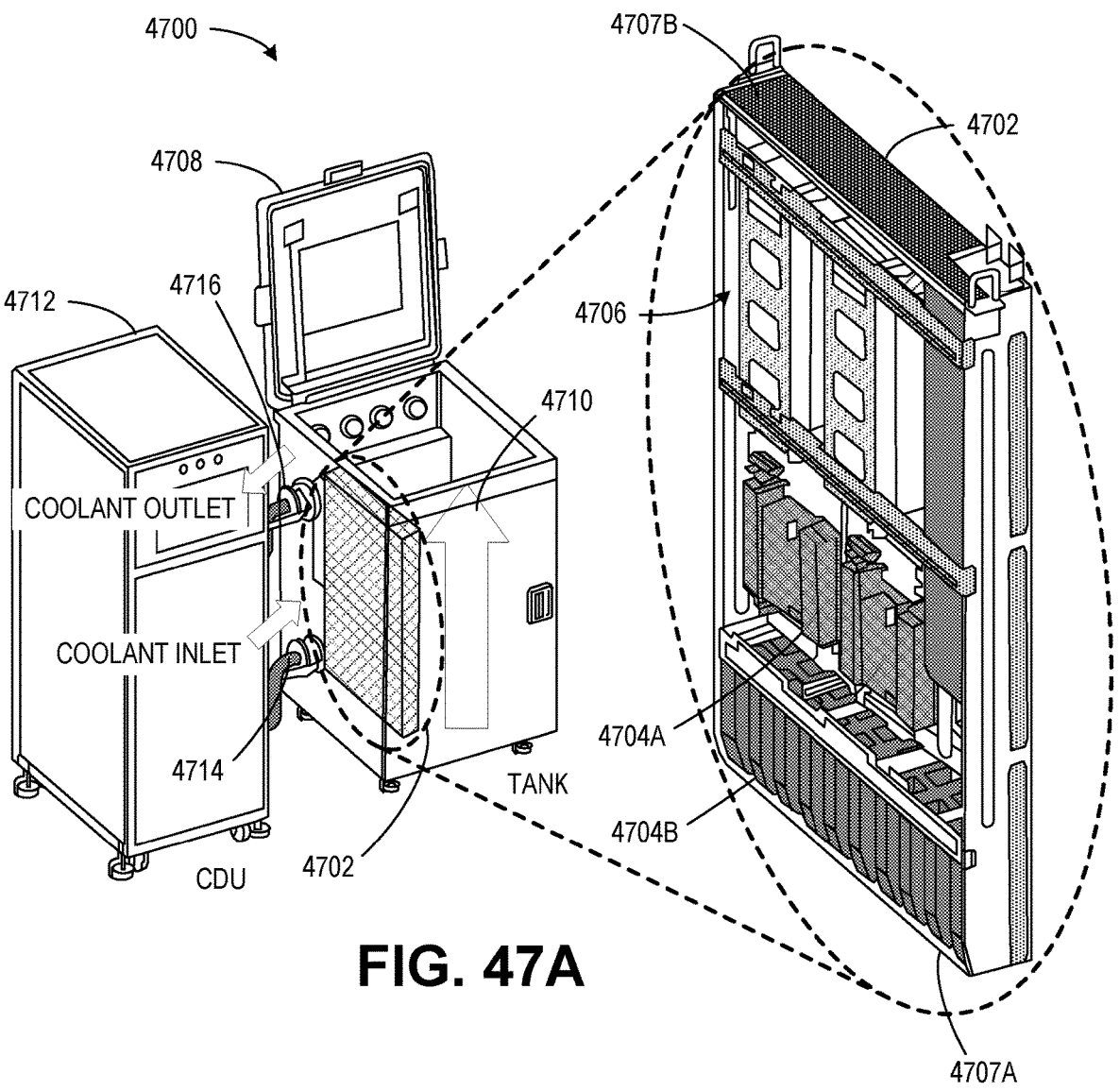
FIG. 47A illustrates an example immersion cooling system including a coolant distribution unit (CDU) and a tank carrying a first chassis in accordance with teachings of this disclosure, the first chassis including the example compute node of FIGS. 42-44 in a first configuration.

FIG. 47A illustrates an example immersion cooling system 4700 including an example chassis 4702 (e.g., a server chassis). In the illustrated example of FIG. 47A, the chassis 4702 includes an example first compute node 4704A, an example second compute node 4704B, and example other computer components 4706 (e.g., peripheral component interconnect express (PCIe) cards, etc.). In the illustrated example of FIG. 47A, the chassis 4702 includes an example first end 4707A and an example second end 4707B. In the illustrated example of FIG. 47A, the immersion cooling system 4700 includes an example tank 4708 having an example first flow direction 4710, which is coupled to an example cooling distribution unit (CDU) 4712. In some examples, the CDU 4712 can be implemented by the CDU 1708 of FIGS. 17 and 18. The tank 4708 includes an inlet 4714 and an outlet 4716.

In the illustrated example of FIG. 47A, the compute nodes 4704A, 4704B have a stacked form factor like the compute node 4200 of FIG. 42. For instance, the first compute node 4704A can include two circuit boards in parallel as disclosed in connection with FIGS. 42-44. Also, the second compute node 4704A can include two circuit boards in parallel as disclosed in connection with FIGS. 42-44. In the illustrated example of FIG. 47A, each of the compute nodes 4704A, 4704B includes two computing units (e.g., similar to the processor circuitry 4206, 4208 of FIG. 42, etc.). As illustrated in FIG. 47A, the other computer components 4706 are disaggregated from the compute nodes 4704A, 4704B. Put another way, the other computer components 4706 (e.g., peripheral component interconnect express (PCIe) cards, etc.) are mounted elsewhere on the chassis 4702 and not the circuit boards of the respective compute nodes 4704A, 4704B. In the example of FIG. 47A, the locations of the compute nodes 4704A, 4704B and the other computer components 4706 in the chassis 4702 are selected to provide for efficient cooling of the high TPD components in the tank 4708. In particular, in the example of FIG. 47A, the high TDP components such as the compute nodes 4704A, 4704B are disposed near the first end 4707A in the chassis 4702 such that when the chassis 4702 is disposed in the tank 4708, the compute nodes 4704A, 4704B are located proximate to the inlet 4714. Also, in this example, the locations of the comparatively low TDP elements (e.g., the other computer components 4706, memory units, etc.) in the chassis 4702 (e.g., near the second end 4707B, etc.) are selected such that those components are proximate to the outlet 4716 when the chassis 4702 is disposed in the tank 4708.

In the illustrated example of FIG. 47A, the CDU 4712 causes coolant to flow through the tank 4708 (e.g., similar to tank 4602 of FIG. 45A, etc.) with the first flow direction 4710 such that lower temperature coolant enters the tank 4708 via the inlet 4714 The temperature of the coolant increases as the coolant flows toward the outlet 4716. That is, as the coolant flows along the chassis 4702 (e.g., along a flow path between the first end 4707A and the second end 4707B, etc.), the coolant becomes hotter. In the illustrated example of FIG. 47A, the disaggregation of the compute nodes 4704A, 4704B from the other computer components 4706 enables the highest TDP components of the chassis 4702 (i.e., the compute nodes 4704A, 4704B) to be located adjacent to the inlet 4714 so that the compute nodes 4704A, 4704B are exposed to the lowest temperature coolant. Because the temperature of the coolant increases as the coolant flows through the tank 4708, the disaggregated configuration of the computer components 4706 and the nodes 4704A, 4704B in the chassis 4702 provides for efficient cooling of the highest TDP components by enabling those components to be exposed to the coolant first, thereby eliminating or substantially reducing exposure of the compute nodes 4704A, 4704B to preheated fluid.

Figure 47B:
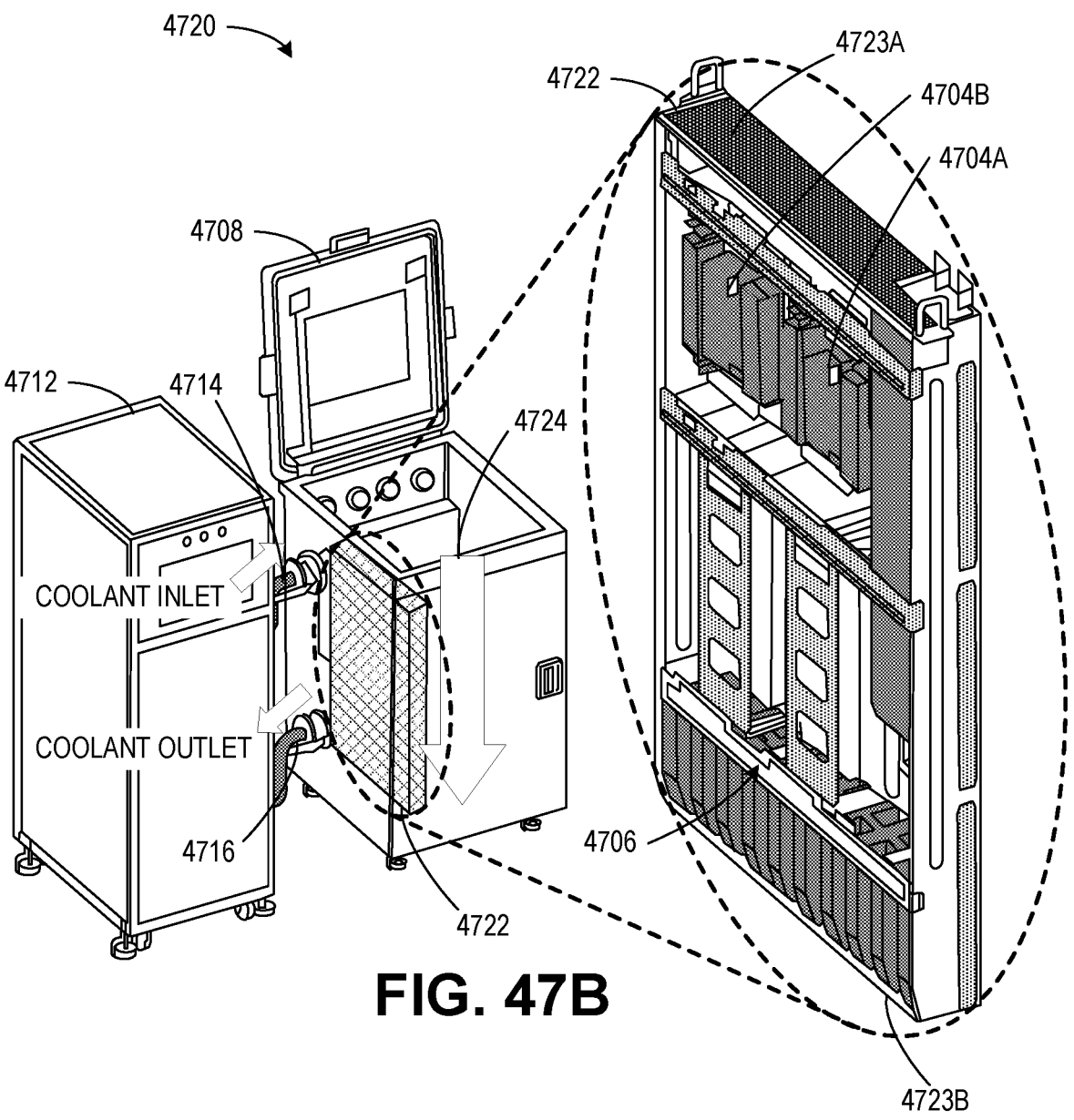
FIG. 47B illustrates the example immersion cooling system of FIG. 47A including the tank carrying a second chassis in accordance with teachings of this disclosure, the second chassis including the compute node of FIGS. 42-44 in a second configuration.

FIG. 47B illustrates another example cooling system 4720 including an example chassis 4722. In the illustrated example of FIG. 47A, the chassis 4722 includes the example first compute node 4704A of FIG. 47A, the example second compute node 4704B of FIG. 47A, and the example other computer components 4706 of FIG. 47A. In the illustrated example of FIG. 47A, the immersion cooling system 4700 includes the example tank 4708 of FIG. 47A, which is coupled to the example CDU 4712 of FIG. 47A. The tank 4708 includes the inlet 4714 of FIG. 47A and the outlet 4716 of FIG. 47A. In the illustrated example of FIG. 47B, the chassis 4722 includes an example first end 4723A and an example second end 4723B.

The example cooling system 4720 of FIG. 47B is similar to the immersion cooling system 4700 of FIG. 47A, except that the cooling system 4720 has an example reverse flow direction 4724 (e.g., top to bottom, where the tank inlet 4714 is located above the tank outlet 4716 such that fluid enters through the inlet 4714 and flows down the tank) instead of the first flow direction 4710 of FIG. 47A (e.g., bottom to top, where the tank inlet 4714 is located below the tank outlet 4716 such that fluid enters through the inlet 4714 and flows up the tank). The chassis 4722 of FIG. 47B is configured such that the compute nodes 4704A, 4704B are mounted at the top of the chassis 4722 (e.g., near the first end 4723A, etc.) and the other computer components 4706 are mounted at the bottom of the chassis 4722 when the chassis 4722 is oriented as shown in FIG. 47B (e.g., near the second end 4723B, etc.). Thus, when the chassis 4722 is disposed in the tank 4708 of FIG. 47B, the compute nodes 4704A, 4704B are proximate to the inlet 4714 and exposed to the lowest temperature coolant first. That is, as the coolant flows along the chassis 4722 (e.g., along a flow path between the first end 4723A and the second end 4723B, etc.), the coolant becomes hotter.

As such, the disaggregation of the compute nodes 4704A, 4704B and the other computer components 4706 in the chassis 4702, 4722 enables the highest TDP components of the chassis 4702, 4722 to be disposed adjacent to the inlet 4714 and lower TDP components of the chassis 4702, 4722 to be disposed adjacent to the outlet 4716 in both the configuration of FIG. 47A (e.g., bottom to top flow) and the configuration of FIG. 47B (e.g., top to bottom flow). Because the stacked form factor of the compute nodes 4704A, 4704B reduces the footprint of the compute nodes 4704A, 4704B when compared to prior form factors, the compute nodes 4704A, 4704B can be placed in any desirable location on the chassis 4702, 4722 based on an overall design of the cooling system (e.g., near the top of the chassis 4722 in FIG. 47B, near the bottom of the chassis 4702 in FIG. 47A, etc.).

Figure 48:
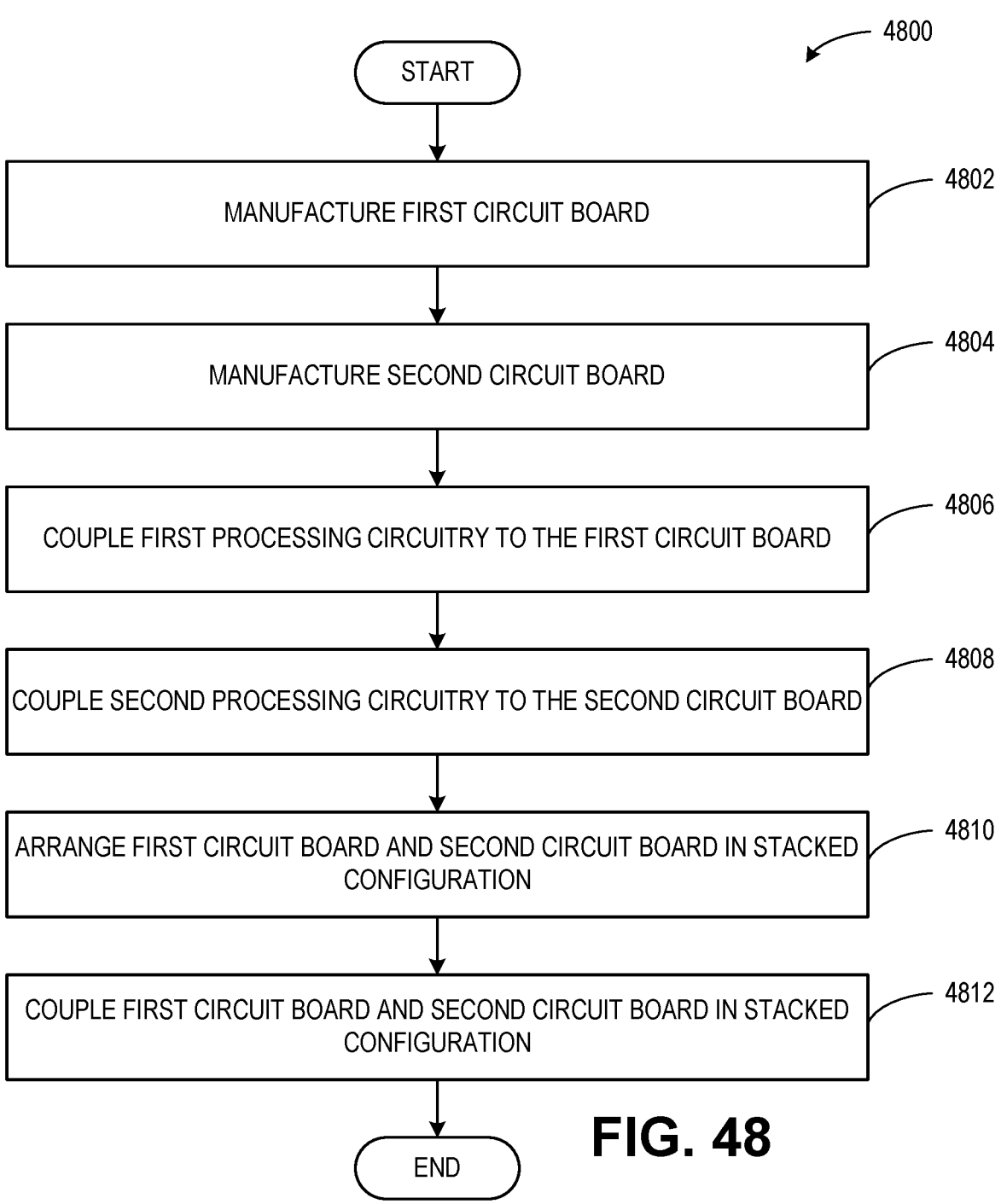
FIG. 48 is a flow diagram illustrating an example process for manufacturing and/or assembling the example compute node of FIGS. 42-44.

FIG. 48 is a flow diagram describing example operations 4800 for manufacturing and/or assembling the compute node 4200 of FIGS. 42-44 and/or the compute nodes 4704A, 4704B. The operations 4800 begin at block 4802, at which the first circuit board 4202 is manufactured. For example, the first circuit board 4202 can be manufactured via prior patterning, engraving, printing, milling, etching, etc. In other examples, the first circuit board 4202 can be manufactured in any other manner. At block 4804, the second circuit board 4204 can be manufactured via prior patterning, engraving, printing, milling, etching, etc. In other examples, the second circuit board 4204 can be manufactured in any other manner.

At block 4806, the first processor circuitry 4206 is coupled to the first circuit board 4202. For example, the first processor circuitry 4206 can be coupled to first circuit board 4202 via a CPU socket and metal retention enclosure. In some examples, a cold plate and/or cooler can be coupled to the first processor circuitry 4206. In other examples, a cold plate and/or cooler can be absent. In some examples, a thermal conductivity paste can be disposed between the cold plate and the first processor circuitry 4206. At block 4808, the second processor circuitry 4208 is coupled to the second circuit board 4204. For example, the second processor circuitry 4208 can be coupled to second circuit board 4204 via a CPU socket and metal retention enclosure. In some examples, a cold plate and/or cooler can be coupled to the second processor circuitry 4208. In other examples, a cold plate and/or cooler can be absent. In some examples, a thermal conductivity paste can be disposed between the cold plate and the second processor circuitry 4208.

At block 4810, the first circuit board 4202 and the second circuit board 4204 are arranged in a stacked configuration. For example, the first circuit board 4202 and the second circuit board 4204 are arranged such that planes defined by the first circuit board 4202 and the second circuit board 4204 are parallel (e.g., as shown in FIG. 42). In some examples, the first circuit board 4202 and the second circuit board 4204 can be arranged so that processor circuitry 4206, 4208 are on opposing sides of the first circuit board 4202 and the second circuit board 4204. At block 4812, the first circuit board 4202 and the second circuit board 4204 are coupled in the stacked configuration. For example, the first fastener 4406A and the fifth fastener 4408A can be coupled, the second fastener 4406B and the sixth fastener 4408B can be coupled, the third fastener 4406C and the seventh fastener 4408C can be coupled, and/or the fourth fastener 4406D and the eighth fastener 4408D can be coupled. In other examples, the circuit boards 4202, 4204 can be joined by any other suitable means. The operations 4800 end.

Figure 49:
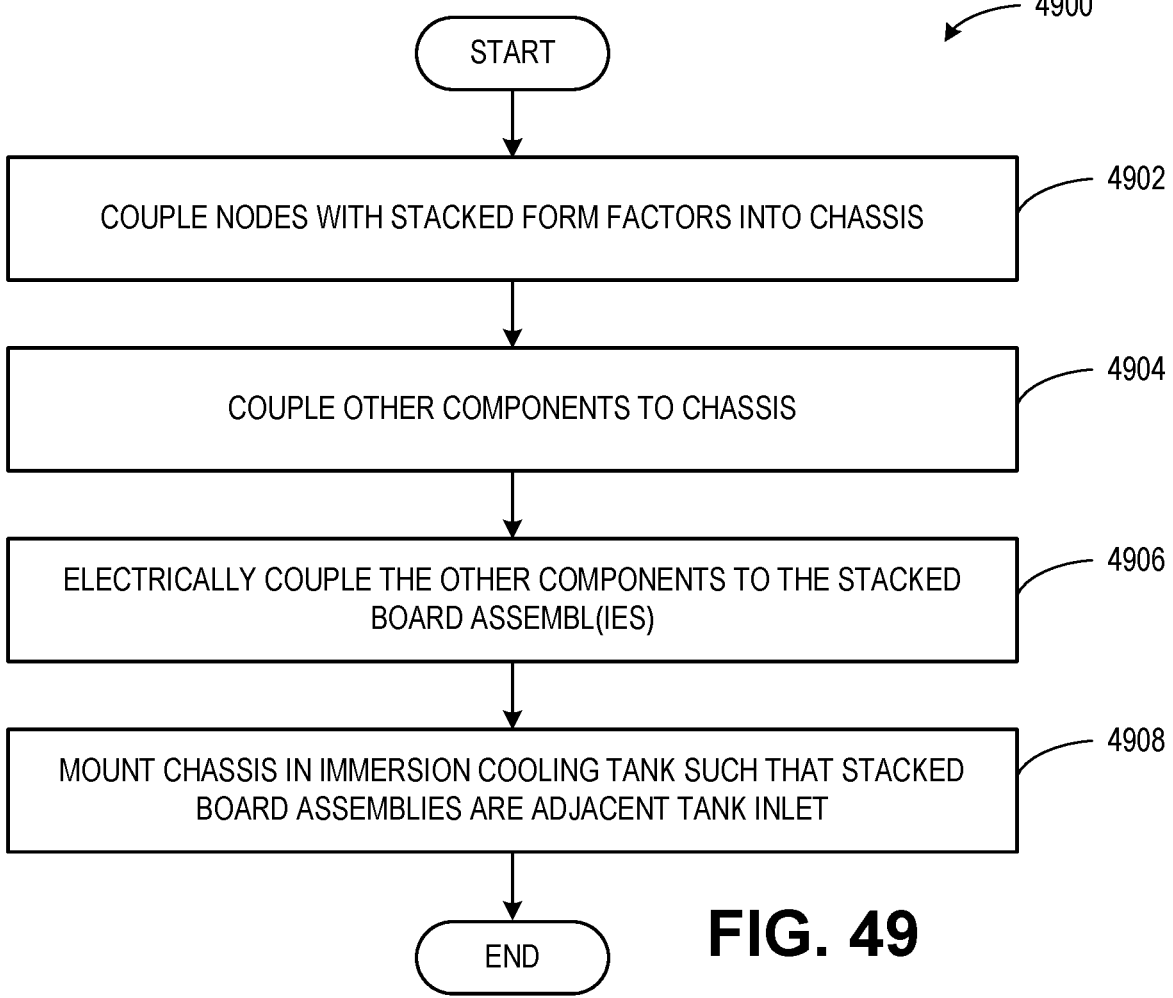
FIG. 49 is a flow diagram illustrating an example process for arranging a chassis including the example compute node of FIGS. 42-44 in the example immersion cooling systems of FIGS. 47A and/or 47B.

FIG. 49 is a flow diagram describing example operations 4900 for assembling the cooling systems of FIGS. 47A and 47B. The operations 4900 begin at block 4902, at which the compute nodes 4200, 4704A, 4704B are coupled to a chassis (e.g., the chassis 4702 of FIG. 47A, the chassis 4722 of FIG. 47B, etc.). For example, the compute nodes 4200, 4704A, 4704B can be coupled to the chassis 4702, 4722 via one or more fasteners, welds, adhesives, etc. and/or via any other suitable means. At block 4904, the other components (e.g., the other components 4706, etc.) to the chassis. For example, the other components (e.g., memory, power supplies, other processing circuitry, etc.) can be coupled to the chassis via one or more fasteners, welds, adhesives, etc. and/or via any other suitable means. At block 4906, the other server components (e.g., the other computer components 4706, etc.) are electrically coupled to the compute nodes 4200, 4704A, 4704B. For example, the compute nodes 4200, 4704A, 4704B can be communicatively coupled to the other server components via cables (e.g., via connection ports similar to the connection ports 4218 of FIG. 42, etc.). In other examples, the nodes 4200, 4704A, 4704B can be coupled to (e.g., mounted to) the other computer components 4706 (e.g., a printed circuit, etc.). At block 4908, the chassis (e.g., the chassis 4702 of FIG. 47A, the chassis 4722 of FIG. 47B, etc.) is disposed in the tank 4708 such that the stacked board assemblies (i.e., the compute nodes 4200, 4704A, 4704B) are adjacent the tank inlet 4714. For example, the chassis can be supported in the tank 4708 via one or more fasteners, slide fits, and/or press fits, etc. In some examples, the chassis can be coupled to the tank via one or more quick disconnect connections to enable the swapping of the chassis during operation of the tank 4708. The operations 4900 end.

Although the example operations 4800, 4900 are described with reference to the flowcharts illustrated in FIGS. 48 and 49, many other methods of assembling the compute node 4200 and/or the immersion systems 4700, 4720 may alternatively be used. For example, the order of execution of the blocks may be changed, and/or some of the blocks described may be changed, eliminated, or combined.

From the foregoing, it will be appreciated that example systems, methods, apparatus, and articles of manufacture have been disclosed that provide a single (standalone) CDU that provides 1+1 pump redundancy and 1+1 heat exchanger redundancy that supports online maintenance when one of the pumps and/or one of the heat exchangers are to be repaired, replaced, cleaned, and/or otherwise maintained. The online maintenance and ongoing operation of the CDU is made possible by the other pump and heat exchanger satisfying the system requirement cooling capacity. Further, the CDU can satisfy the functional and cooling capacity requirements for the system while performing coolant filtering. However, only a single filter is used for both pumps thereby reducing the overall footprint of the CDU. Further, when both pumps are operating in the normal mode, power efficiencies are achieved relative to implementing two separate CDUs having separate pumps. Disclosed systems, methods, apparatus, and articles of manufacture are accordingly directed to one or more improvement(s) in the operation of a machine such as a computer or other electronic and/or mechanical device.

From the foregoing, it will be appreciated that example systems, methods, apparatus, and articles of manufacture have been disclosed that provide cooling system with improved heat transfer capabilities relative to many known systems. More particularly, examples disclosed herein improve the uniformity of the flow field of the coolant through a tank, thereby increasing the efficiency of the heat dissipation cycle and reducing false positive generation of low coolant level alarms. Furthermore, examples disclosed herein save on cost and space because they can be implemented using a single CDU coupled to the tank rather than needing two or more CDUs. These advantages are achieved through the implementation of a perforated plate on the cold side (e.g., bottom) of the tank with openings of different sizes that are placed with smaller holes closer to an entry point of the coolant and lager holes farther away from the entry point. Further, flow channels defined by either straight or trapezoidal walls are provided to direct the coolant towards the different sized holes for more uniform flow of the coolant into a main cavity of the tank after passing through the holes. Further, a perforated plate in an overflow chamber on the hot side (e.g., top) of the tank includes a plurality of openings to distribute suction points along a length of the chamber that extends a majority (or entirety) of a length of the tank. The plurality of distributed holes enable more uniform flow of the coolant into the overflow chamber and out of the tank via a fluidly coupled outlet.

From the foregoing, it will be appreciated that example systems, methods, apparatus, and articles of manufacture have been disclosed that provide single-phase cooling systems with improved heat transfer capabilities relative to many known systems. More particularly, examples disclosed herein include turbulators (e.g., with fan blades and/or turbine blade shaped blades) to cause disturbance and/or turbulence in the coolant as the coolant is forced through an immersion tank across servers and/or other electronic components to enhance heat transfer. In some examples, the turbulators are positioned relative to the inlets and outlets for the coolant so as to force the coolant in a direction other than what would occur due to natural convection and the force of gravity to further enhance heat transfer efficiency. Further, in some examples, the turbulators in conjunction with one or more perforated plates can increase uniformity in the flow field and also help isolate hot and cold regions of the coolant to further improve the efficiency of the system. As a result, disclosed cooling systems can meet the heat dissipation needs of components with high unit heat flux (e.g., high-performance computing components) while avoiding the costs associated with two-phase cooling systems. Additionally, the isolation of hot and cold zones can enable improved thermal management and/or heat recovery mechanisms. Disclosed systems, methods, apparatus, and articles of manufacture are accordingly directed to one or more improvement(s) in the operation of a machine such as a computer or other electronic and/or mechanical device.

From the foregoing, it will be appreciated that example systems, methods, apparatus, and articles of manufacture have been disclosed that provide for server components having a reduced footprint form factor optimized for immersion cooling systems. Examples disclosed herein provide for modular servers that are disaggregated, flexible, reusable, and scalable with respect to the components thereof. Examples disclosed herein include form factors that facilitate the flexible arrangement of server components on a server chassis to allow the components to be selectively disposed adjacent coolant inlets based on thermal design power, thereby improving cooling efficiency and reducing preheating effects.

Example methods, apparatus, systems, and articles of manufacture for immersion cooling systems are disclosed herein. Further examples and combinations thereof include the following:

Example 1 includes an apparatus comprising an inlet to receive coolant from an immersion cooling tank, an outlet to be coupled to the immersion cooling tank, a first flow path extending between the inlet and the outlet, and a second flow path extending between the inlet and the outlet, the first flow path and the second flow path disposed in parallel.

Example 2 includes the apparatus of example 1, further including a first pump disposed in the first flow path, and a second pump disposed in the second flow path.

Example 3 includes the apparatus of example 2, wherein (a) the first pump is to pump the coolant at a first flow rate when the first and second pumps are concurrently pumping the coolant, and (b) the first pump is to pump the coolant at a second flow rate when the second pump is not in use, the second flow rate greater than the first flow rate.

Example 4 includes the apparatus of example 3, further including a first valve disposed in the second flow path upstream of the second pump, and a second valve disposed in the second flow path downstream of the second pump, the first and second valves to be closed when the first pump is pumping the coolant through the first flow path at the second flow rate.

Example 5 includes the apparatus of example 2, wherein the first and second pumps are to concurrently pump the coolant through the first flow path and the second flow path, respectively.

Example 6 includes the apparatus of example 2, further including a first heat exchanger fluidly coupled to the first pump and disposed in the first flow path, a second heat exchanger fluidly coupled to the second pump and disposed in the second flow path, a first valve disposed in the first flow path upstream of the first heat exchanger, and a second valve disposed in the first flow path downstream of the first heat exchanger, the first pump to be selectively turned off while the second pump continues to pump coolant through the second flow path, the first and second valves to be closed when the first pump is turned off to facilitate maintenance of the first heat exchanger while the coolant is pumped through the second heat exchanger.

Example 7 includes the apparatus of example 1, further including a filter disposed in a third flow path fluidly coupled to the first flow path and the second flow path, a first valve disposed between the first flow path and the third flow path, and a second valve disposed between the second flow path with the third flow path, at least one of the first valve and the second valves to be controlled to selectively direct the coolant to the filter.

Example 8 includes the apparatus of example 1, further including the immersion cooling tank, the immersion cooling tank including a perforated plate positioned between the inlet and the outlet, the perforated plate having a first hole and a second hole, the first hole smaller than the second hole.

Example 9 includes the apparatus of example 8, further including a turbulator disposed within the immersion cooling tank to increase a turbulence of the coolant, the turbulator adjacent to the perforated plate.

Example 10 includes the apparatus of example 1, further including the immersion cooling tank, and a compute node disposed within the immersion cooling tank, the compute node including a first circuit board having a first integrated circuit, and a second circuit board coupled to the first circuit board, the second circuit board having a second integrated circuit, the first circuit board substantially parallel to the second circuit board.

Example 11 includes a non-transitory machine readable storage medium comprising instructions to cause programmable circuitry to at least operate, at a first time, a first pump and a second pump concurrently, the first pump and the second pump to pump coolant through a first flow path and a second flow path, respectively, the first flow path including a first heat exchanger, the second flow path including a second heat exchanger, the first pump and the second pump disposed within a coolant distribution unit, and operate, at a second time after the first time, the first pump and the second pump concurrently, the first pump and the second pump to pump coolant through a third flow path and the second flow path, respectively, the third flow path including a filter, the filter disposed within the coolant distribution unit.

Example 12 includes the non-transitory machine readable storage medium of example 11, wherein the instructions are to cause the programmable circuitry to operate, at the first time, the second pump to pump the coolant through the second flow path at a first flow rate, and operate, at the second time, the second pump to pump the coolant through the second flow path at a second flow rate corresponding to the first flow rate.

Example 13 includes the non-transitory machine readable storage medium of example 11, wherein the instructions are to cause the programmable circuitry to open, at the second time, a first valve upstream of the filter and downstream of the first pump, and close, at the second time, a second valve downstream of the first heat exchanger.

Example 14 includes the non-transitory machine readable storage medium of example 11, wherein the instructions are to cause the programmable circuitry to operate a valve to control flow of coolant through a fourth flow path extending between the second pump and the filter.

Example 15 includes the non-transitory machine readable storage medium of example 11, wherein the instructions are to cause the programmable circuitry to operate a valve to control flow of a coolant between a coolant supply of an immersion coolant tank and at least one of the first flow path, the second flow path, and the third flow path.

Example 16 includes a method comprising operating, at a first time, a first pump and a second pump in parallel, the first pump and the second pump to concurrently pump coolant from an immersion tank through a coolant distribution unit to cool the coolant, the first pump to pump the coolant at a first flow rate, the first pump and the second pump disposed in the coolant distribution unit, and operating, at a second time after the first time, the first pump while the second pump is not in use, the first pump to pump the coolant through the coolant distribution unit at a second flow rate, the second flow rate greater than the first flow rate.

Example 17 includes the method of example 16, further including alerting a user to service the second pump at the second time.

Example 18 includes the method of example 16, further including operating, at a third time after the second time, the first pump and the second pump in parallel, the third time after the servicing of the second pump.

Example 19 includes the method of example 18, further including closing, at the second time, a first valve upstream of the second pump, and closing, at the second time, a second valve downstream of the second pump.

Example 20 includes the method of example 16, wherein the coolant distribution unit includes a first heat exchanger disposed in a first flow path with the first pump, and a second heat exchanger disposed in a second flow path with the second pump, the first heat exchanger and the second heat exchanger disposed with the coolant distribution unit.

Example 21 includes an apparatus comprising a tank to hold a coolant, electronic components to be immersed in and cooled by the coolant, an overflow chamber to direct the coolant towards an outlet of the tank after the coolant has drawn heat from the electronic components, and a plate within the overflow chamber, the plate including a plurality of openings, the coolant to pass through at least one of the plurality of openings before reaching the outlet.

Example 22 includes the apparatus of example 21, wherein the plurality of openings include a first opening and a second opening having a different size than the first opening.

Example 23 includes the apparatus of example 22, further including a third opening disposed between the first opening and the second opening, the first opening disposed adjacent to the outlet, the second opening disposed distal to the outlet, the third opening larger than the second opening, and the second opening larger than the first opening.

Example 24 includes the apparatus of example 21, wherein (a) the plurality of openings is a first plurality of openings, (b) the plate is a first plate, and (c) further including a second plate positioned between an inlet of the tank and a main cavity of the tank, the second plate including a second plurality of openings, the coolant to pass through at least one of the second plurality of openings before reaching the main cavity.

Example 25 includes the apparatus of example 24, further including walls to define channels along which multiple ones of the second plurality of openings are distributed, the coolant to flow along the channels before passing through the second plurality of openings.

Example 26 includes the apparatus of example 25, wherein the multiple ones of the second plurality of openings increase in size along a length of a first channel of the channels.

Example 27 includes the apparatus of example 25, wherein the walls are tapered such that a width of the channels increases along corresponding lengths of the channels.

Example 28 includes the apparatus of example 24, further including an entry pipe extending between the inlet of the tank and a center of the tank.

Example 29 includes the apparatus of example 28, wherein a first opening of the second plurality of openings is disposed adjacent to the center of the tank and a second opening of the second plurality of openings is disposed adjacent to an edge of the tank, the first opening smaller than the second opening.

Example 30 includes a system including a coolant distribution unit, an immersion cooling tank including an inlet coupled to the coolant distribution unit, and an outlet coupled to the coolant distribution unit, the inlet and the outlet defining a flow path through the immersion cooling tank, a compute node disposed in the flow path, and a plate disposed in the flow path, the plate including a first opening, and a second opening, the flow path extending through the first opening and the second opening, the first opening and the second opening have different sizes.

Example 31 includes the system of example 30, wherein the compute node includes a first circuit board having a first integrated circuit, and a second circuit board coupled to the first circuit board, the second circuit board having a second integrated circuit, the first circuit board substantially parallel to the second circuit board.

Example 32 includes the system of example 30, further including a turbulator disposed within the immersion cooling tank to increase a turbulence of the coolant, the turbulator adjacent to the plate.

Example 33 includes the system of example 30, wherein the coolant distribution unit includes a first flow path including a first pump and a first heat exchanger, and a second flow path including a second pump and a first second heat exchanger, the first flow path and the second flow path disposed in parallel between the inlet and the outlet.

Example 34 includes an apparatus including an immersion cooling tank including an inlet to be coupled to a coolant distribution unit, and an outlet to be coupled to the coolant distribution unit, the inlet and the outlet defining a flow path through the immersion cooling tank, a plate disposed in the flow path, the plate including a first opening, and a second opening, the flow path extending through the first opening and the second opening, the first opening and the second opening have different sizes.

Example 35 includes the apparatus of example 34, wherein the plate is a first plate, the apparatus further including an overflow chamber extending along a majority of a length of the immersion cooling tank, and a second plate disposed in the overflow chamber, the second plate including a third opening and a fourth opening, the third opening and the fourth opening have different sizes.

Example 36 includes the apparatus of example 35, further including a filter disposed in the overflow chamber, the flow path extending through the filter.

Example 37 includes the apparatus of example 35, wherein the third opening is proximate to the outlet and the fourth opening is distal to the outlet, the third opening smaller than the fourth opening.

Example 38 includes the apparatus of example 35, further including an entry pipe including a first end coupled to the inlet, and a second end disposed adjacent to a middle of the immersion cooling tank.

Example 39 includes the apparatus of example 38, wherein the first opening is proximate to the second end and the second opening is distal to the second end, the first opening smaller than the second opening.

Example 40 includes the apparatus of example 35, further including walls extending from the plate, the walls defining a first channel and a second channel, the flow path extending through the first channel and second channel.

Example 41 includes an apparatus comprising an immersion cooling tank to contain a coolant, the immersion tank including an inlet, an outlet, the inlet and the outlet defining a flow path for the coolant therebetween, and a turbulator disposed within the immersion cooling tank to increase a turbulence of the coolant, the turbulator including a rotating element.

Example 42 includes the apparatus of example 41, further including a non-contact drive to drive a rotation of the turbulator.

Example 43 includes the apparatus of example 42, wherein the non-contact drive is external to the immersion tank.

Example 44 includes the apparatus of example 41, further including a perforated plate positioned between the inlet and the outlet.

Example 45 includes the apparatus of example 44, wherein the perforated plate includes a first opening and a second opening, the first opening smaller than the second opening.

Example 46 includes the apparatus of example 45, wherein the first opening is proximate to the inlet and the second opening is distal to the inlet.

Example 47 includes the apparatus of example 44, wherein the turbulator is positioned closer to the inlet than to the outlet.

Example 48 includes the apparatus of example 44, wherein the turbulator is positioned adjacent the perforated plate.

Example 49 includes the apparatus of example 41, wherein the turbulator is a first turbulator, the apparatus further including a second turbulator spaced transversely from the first turbulator relative to the flow path.

Example 50 includes the apparatus of example 49, wherein the inlet is a first inlet and the immersion tank further includes a second inlet, the second turbulator adjacent to the second inlet, the first turbulator adjacent to the first inlet.

Example 51 includes an apparatus comprising an immersion tank to contain an immersion cooling fluid, the immersion tank including an inlet, an outlet, the inlet and the outlet defining a flow path for the immersion cooling fluid therebetween, and means for increasing a turbulence of the immersion cooling fluid, the means for increasing the turbulence including a rotating element.

Example 52 includes the apparatus of example 51, wherein the inlet is fluidly coupled to a coolant distribution unit, the outlet is fluidly coupled to the coolant distribution unit, the coolant distribution unit including a first flow path including a first pump and a first heat exchanger, and a second flow path including a second pump and a second heat exchanger, the first flow path and the second flow path disposed in parallel.

Example 53 includes the apparatus of example 51, further including a compute node disposed within the immersion tank, the compute node including a first circuit board having a first integrated circuit, and a second circuit board coupled to the first circuit board, the second circuit board having a second integrated circuit, the first circuit board substantially parallel to the second circuit board.

Example 54 includes the apparatus of example 51, wherein the inlet is disposed on a first side of the immersion tank, the outlet is disposed on a second side of the immersion tank, and the means for increasing the turbulence is disposed adjacent to the outlet.

Example 55 includes the apparatus of example 51, further including a means for driving the means for increasing the turbulence, the means for driving external to the immersion tank.

Example 56 includes the apparatus of example 51, further including a perforated plate positioned between the inlet and the outlet.

Example 57 includes the apparatus of example 56, wherein the immersion tank includes an overflow chamber, the perforated plate disposed in the overflow chamber.

Example 58 includes an apparatus comprising a tank to be fluidly coupled to a coolant distribution unit, the tank including a first inlet disposed on a first side of the tank, a second inlet disposed on a second side of the tank, a first outlet disposed on the first side of the tank, and a second outlet disposed on the second side, and an array of fans disposed on a bottom of the tank, the array of fans disposed between (a) the first inlet and the second inlet and (b) the first outlet and the second outlet.

Example 59 includes the apparatus of example 58, wherein the array of fans includes at least four fans.

Example 60 includes the apparatus of example 58, further including a perforated plate disposed between (a) the first inlet and the second inlet and (b) the array of fans.

Example 61 includes an apparatus including a first circuit board defining a first plane, a first electronic component carried by the first circuit board, a second circuit board coupled to the first circuit board, the second circuit board defining a second plane, the first plane substantially parallel to the second plane, and a second electronic component carried by the second circuit board.

Example 62 includes the apparatus of example 61, wherein the first circuit board is an input/output board and the second circuit board is a central processing circuitry board.

Example 63 includes the apparatus of example 61, wherein (a) the first electronic component is a first CPU defining a first centerline axis, and (b) the second electronic component is a second CPU defining a second centerline axis, the first centerline axis substantially collinear with the second centerline axis.

Example 64 includes the apparatus of example 63, wherein (a) the first CPU is coupled to a first side of the first circuit board, (b) the second CPU is coupled to a second side of the second circuit board, and (c) the first side faces away from the second side.

Example 65 includes the apparatus of example 64, wherein (a) the first circuit board includes a third side, (b) the second circuit board includes a fourth side, and (c) the third side face towards the fourth side, (d) and is spaced apart from the fourth side via a gap.

Example 66 includes the apparatus of example 65, further including a baseboard management circuit coupled to the second side.

Example 67 includes the apparatus of example 61, wherein the first circuit board is removably coupled to the second circuit board via one or more fasteners.

Example 68 includes the apparatus of example 67, wherein (a) the first circuit board defines a first corner, a second corner, a third corner and a fourth corner, (b) the second circuit board defines a fifth corner, a sixth corner, a seventh corner and an eighth corner, (c) the first corner including a first fastener to be received by a first hole of the fifth corner, (d) the second corner including a second fastener to be received by a second hole of the sixth corner, (e) the third corner including a third fastener to be received by a third hole of the seventh corner, and (f) the fourth corner including a fourth fastener to be received by a fourth hole of the eighth corner.

Example 69 includes the apparatus of example 61, wherein the first circuit board and the second circuit board have a substantially same size.

Example 70 includes the apparatus of example 61, wherein (a) the first circuit board includes a first back plate, (b) the second circuit board includes a second back plate, and (c) the first back plate abuts the second back plate.

Example 71 includes an apparatus comprising a chassis, and a compute node carried by the chassis, the compute node including a first circuit board, a second circuit board coupled to and substantially parallel to the first circuit board, a first integrated circuit coupled to the first circuit board, and a second integrated circuit to the second circuit board.

Example 72 includes the apparatus of example 71, wherein (a) the compute node has a first thermal design power, (b) the chassis has a first end and a second end, (c) the chassis defines a fluid flow path from the first end to the second end, (d) the compute node is disposed adjacent to the first end, and (e) the apparatus further including first electronic components having a second thermal design power less than the first thermal design power, the first electronic component disposed adjacent to the second end.

Example 73 includes the apparatus of example 72, wherein the coupling of the first circuit board and the second circuit board define a gap therebetween, the fluid flow path extending through the gap.

Example 74 includes the apparatus of example 72, wherein the compute node is a first compute node and the apparatus further includes a second compute node disposed on the chassis adjacent to the first end and aligned with the first compute node relative to the fluid flow path.

Example 75 includes the apparatus of example 72, wherein the chassis is to be disposed in an immersion cooling tank including an inlet and an outlet, the first end to be disposed adjacent to the inlet.

Example 76 includes the apparatus of example 75, wherein the inlet is disposed at a top of the immersion cooling tank.

Example 77 includes the apparatus of example 72, further including second electronic components having a third thermal design power between the first thermal design power and the second thermal design power, the second electronic components disposed on the chassis between the compute node and the first electronic components.

Example 78 includes the apparatus of example 71, wherein the first circuit board and the second circuit board have a substantially same size.

Example 79 includes the apparatus of example 71, wherein (a) the first integrated circuit is a first CPU defining a first centerline axis, and (b) the second integrated circuit is a second CPU defining a second centerline axis, the first centerline axis substantially collinear with the second centerline axis.

Example 80 includes the apparatus of example 79, wherein (a) the first CPU is coupled to a first side of the first circuit board, (b) the second CPU is coupled to a second side of the second circuit board, and (c) the first side is faces away from the second side.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
a tank to hold a coolant;
an overflow chamber to direct the coolant toward an outlet; and
a plate within the overflow chamber, the plate including a plurality of openings, the coolant to pass through at least one of the plurality of openings before reaching the outlet, the plurality of openings including a first opening, a second opening, and a third opening, the first opening adjacent to the outlet, the second opening distal to the outlet, the third opening between the first opening and the second opening, the second opening larger than the third opening, and the third opening larger than the first opening.

2. The apparatus of claim 1, wherein the plurality of openings is a first plurality of openings, and the plate is a first plate, the apparatus including a second plate between an inlet of the tank and a main cavity of the tank, the second plate including a second plurality of openings, the coolant to pass through at least one of the second plurality of openings before reaching the main cavity.

3. The apparatus of claim 2, including walls to define channels along which multiple ones of the second plurality of openings are distributed, the coolant to flow along the channels before passing through the second plurality of openings.

4. The apparatus of claim 3, wherein the multiple ones of the second plurality of openings increase in size along a length of a first channel of the channels.

5. The apparatus of claim 3, wherein the walls are tapered such that a width of the channels increases along corresponding lengths of the channels.

6. The apparatus of claim 2, including an entry pipe extending between the inlet of the tank and a center of the tank.

7. The apparatus of claim 6, wherein the second plurality of openings includes a fourth opening and a fifth opening, the fourth opening adjacent to the center of the tank and the fifth opening adjacent to an edge of the tank, the fourth opening smaller than the fifth opening.

8. A system including:
a coolant distribution unit including:
a first flow path including a first pump and a first heat exchanger; and
a second flow path including a second pump and a second heat exchanger;
an immersion cooling tank including:
an inlet coupled to the coolant distribution unit; and
an outlet coupled to the coolant distribution unit, the inlet and the outlet defining a flow path through the immersion cooling tank, the first flow path and the second flow path in parallel between the inlet and the outlet;
a compute node in the flow path; and
a plate in the flow path, the plate including:
a first opening; and
a second opening, the flow path extending through the first opening and the second opening, the first opening and the second opening having different sizes.

9. The system of claim 8, wherein the compute node includes:
a first circuit board having a first integrated circuit; and
a second circuit board coupled to the first circuit board, the second circuit board having a second integrated circuit, the first circuit board substantially parallel to the second circuit board.

10. The system of claim 8, including a turbulator within the immersion cooling tank to increase a turbulence of a coolant in the immersion cooling tank, the turbulator adjacent to the plate.

11. An apparatus including:
an immersion cooling tank including:
an inlet to be coupled to a coolant distribution unit; and
an outlet to be coupled to the coolant distribution unit, the inlet and the outlet defining a flow path through the immersion cooling tank;
a first plate in the flow path, the first plate including:
a first opening; and
a second opening, the flow path extending through the first opening and the second opening, the first opening and the second opening having different sizes;
an overflow chamber extending along a majority of a length of the immersion cooling tank; and
a second plate in the overflow chamber, the second plate including a third opening and a fourth opening, the third opening proximate to the outlet, the fourth opening distal to the outlet, the third opening smaller than the fourth opening.

12. The apparatus of claim 11, including a filter in the overflow chamber, the flow path extending through the filter.

13. The apparatus of claim 11, including an entry pipe including:
a first end coupled to the inlet; and
a second end disposed adjacent to a middle of the immersion cooling tank.

14. The apparatus of claim 13, wherein the first opening is proximate to the second end and the second opening is distal to the second end, the first opening smaller than the second opening.

15. The apparatus of claim 11, including walls extending from the first plate, the walls defining a first channel and a second channel, the flow path extending through the first channel and the second channel.

* * * * *